(12) United States Patent
Ruttkowski et al.

(10) Patent No.: US 7,649,779 B2
(45) Date of Patent: Jan. 19, 2010

(54) INTEGRATED CIRCUITS; METHODS FOR MANUFACTURING AN INTEGRATED CIRCUIT; MEMORY MODULES; COMPUTING SYSTEMS

(75) Inventors: Eike Ruttkowski, Munich (DE); Detlev Richter, Munich (DE); Michael Specht, Munich (DE); Joseph Willer, Riemerling (DE); Dirk Manger, Dresden (DE); Kenny Oisin, Dresden (DE); Steffen Meyer, Dresden (DE); Klaus Knobloch, Dresden (DE); Holger Moeller, Dresden (DE); Doris Keitel Schulz, Hoehenkirchen (DE); Jan Gutsche, Munich (DE); Gert Koebernik, Unterhaching (DE); Christoph Friederich, München (DE)

(73) Assignees: Qimonda AG, Munich (DE); Qimonda Flash GmbH, Dresden (DE)

( * ) Notice: Subject to any disclaimer, the term of this patent is extended or adjusted under 35 U.S.C. 154(b) by 0 days.

(21) Appl. No.: 11/749,028

(22) Filed: May 15, 2007

(65) Prior Publication Data

US 2008/0285344 A1 Nov. 20, 2008

(51) Int. Cl.
*G11C 16/00* (2006.01)
(52) U.S. Cl. .................. 365/185.18; 365/63; 365/214
(58) Field of Classification Search .............. 365/214
See application file for complete search history.

(56) References Cited

U.S. PATENT DOCUMENTS

| | | | |
|---|---|---|---|
| 5,781,469 A * | 7/1998 | Pathak et al. | 365/156 |
| 5,898,615 A * | 4/1999 | Chida | 365/185.17 |
| 6,927,443 B2 | 8/2005 | Arigane et al. | |
| 7,250,651 B2 | 7/2007 | Küsters et al. | |
| 2006/0023505 A1 | 2/2006 | Iizuka | |
| 2006/0038220 A1 | 2/2006 | Kusters et al. | |

FOREIGN PATENT DOCUMENTS

DE   10 2004 043 517 A1   2/2006

* cited by examiner

*Primary Examiner*—Tan T. Nguyen
(74) *Attorney, Agent, or Firm*—Slater & Matsil, L.L.P.

(57) ABSTRACT

Embodiments of the present invention relate generally to integrated circuits, methods for manufacturing an integrated circuit, memory modules, and computing systems.

71 Claims, 59 Drawing Sheets

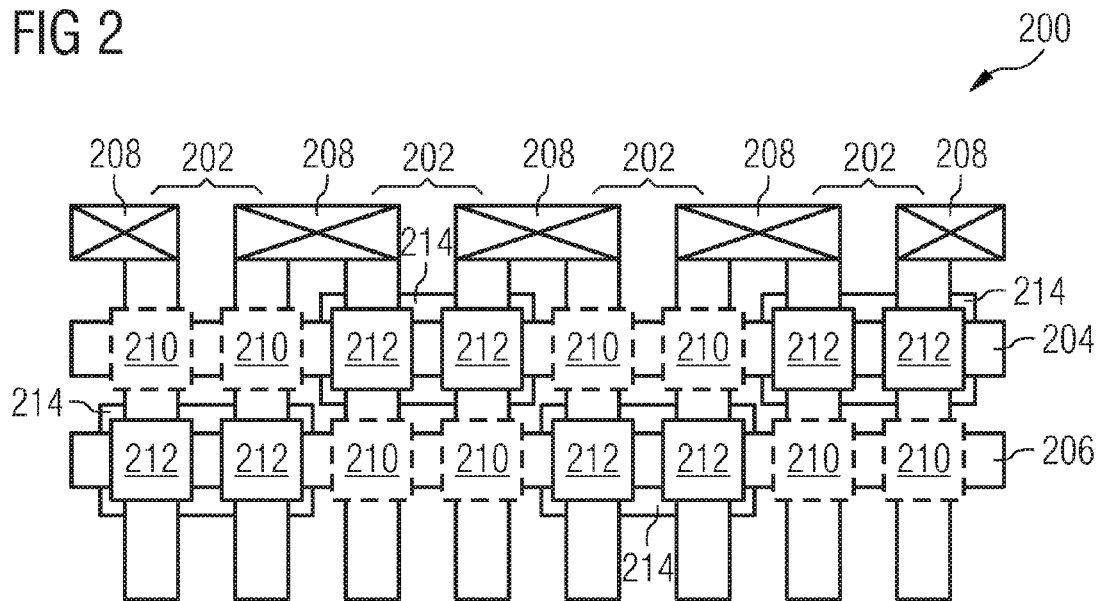
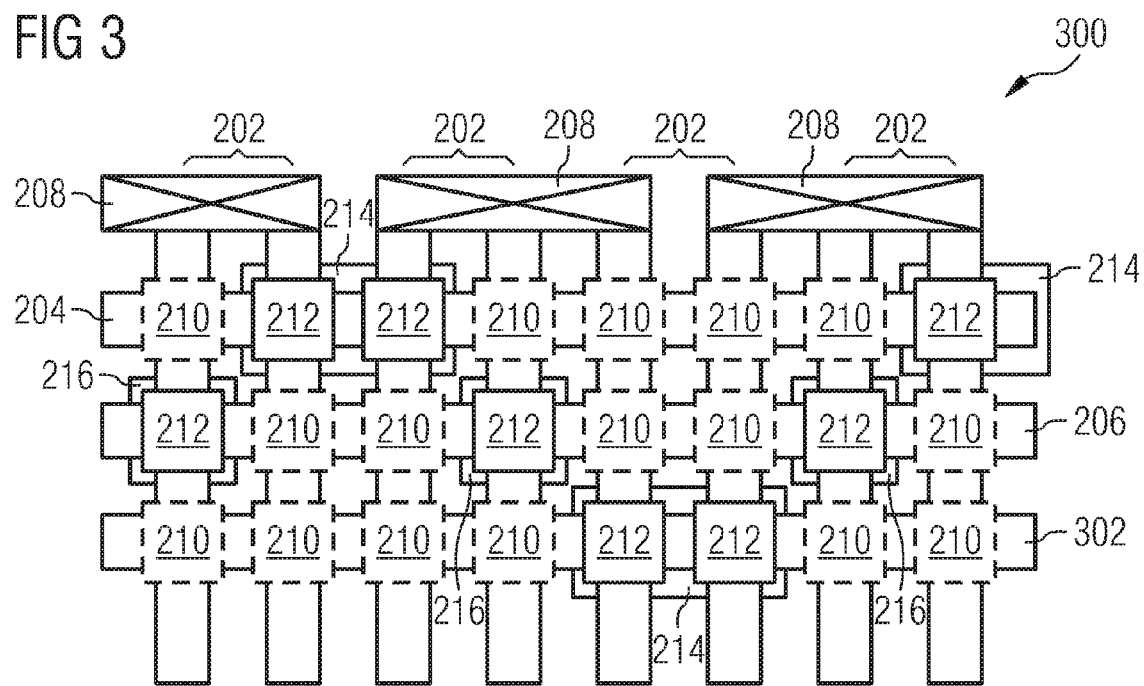

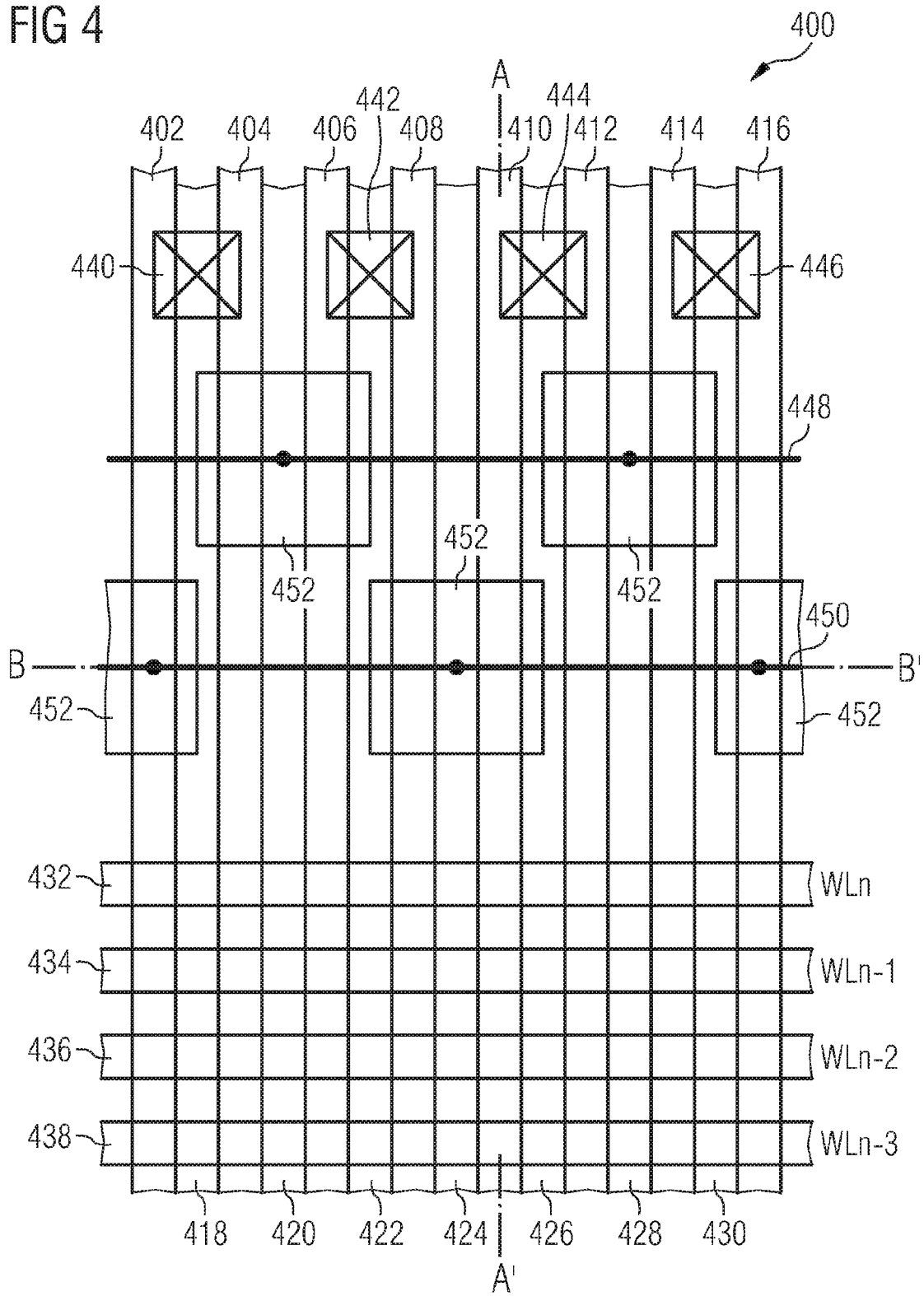

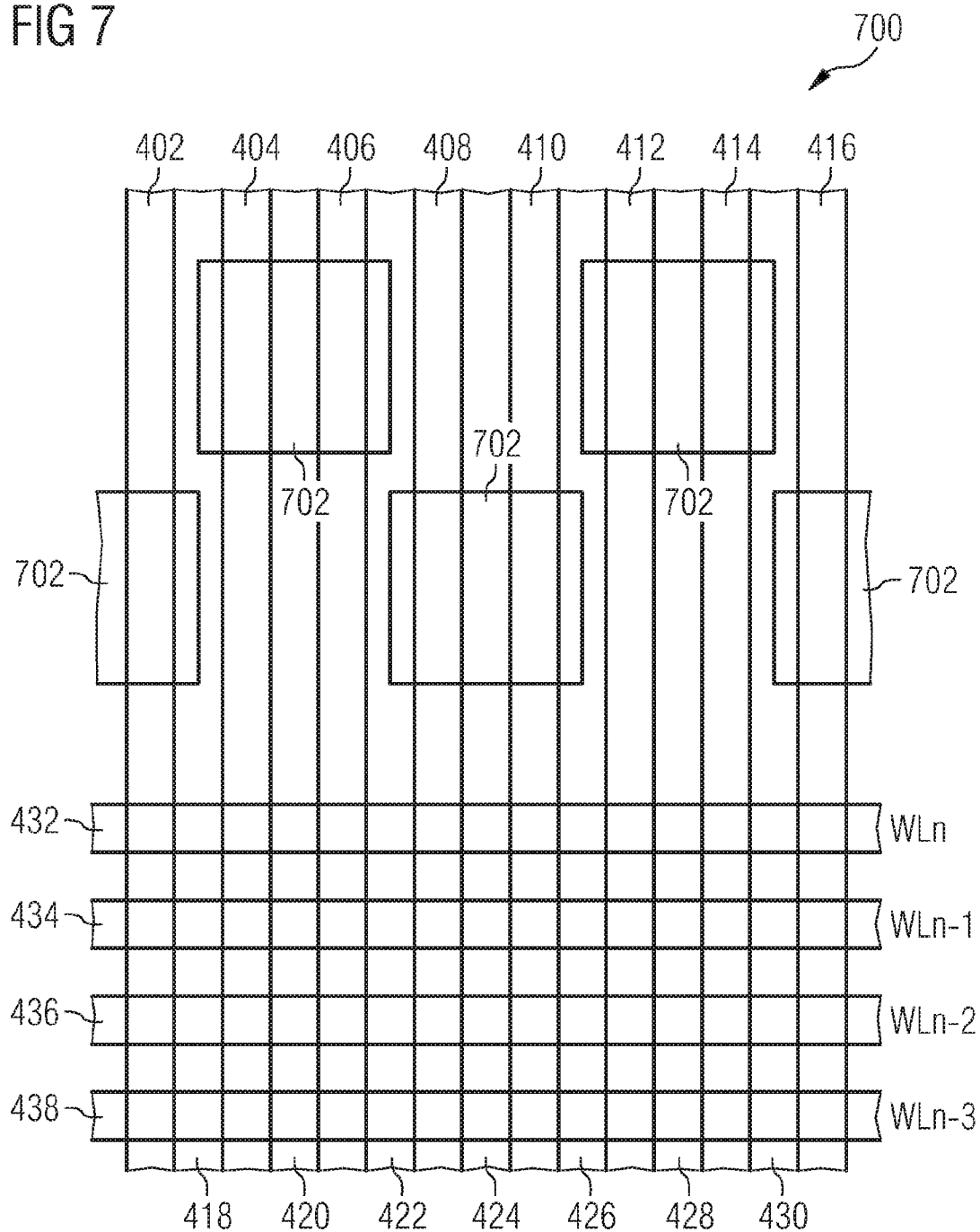

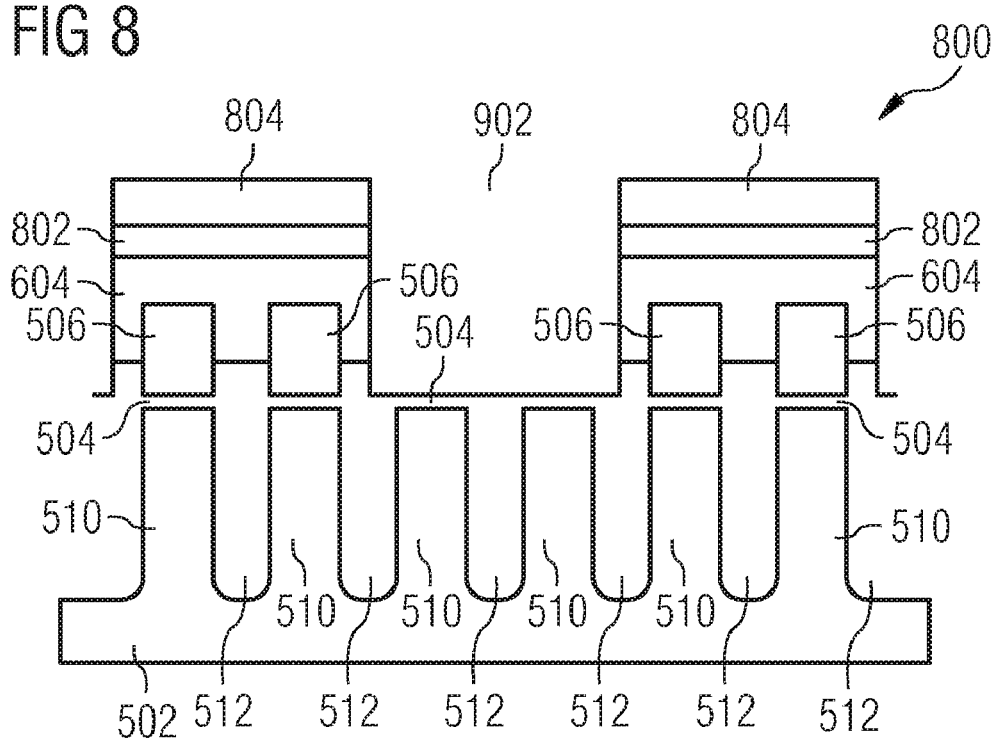
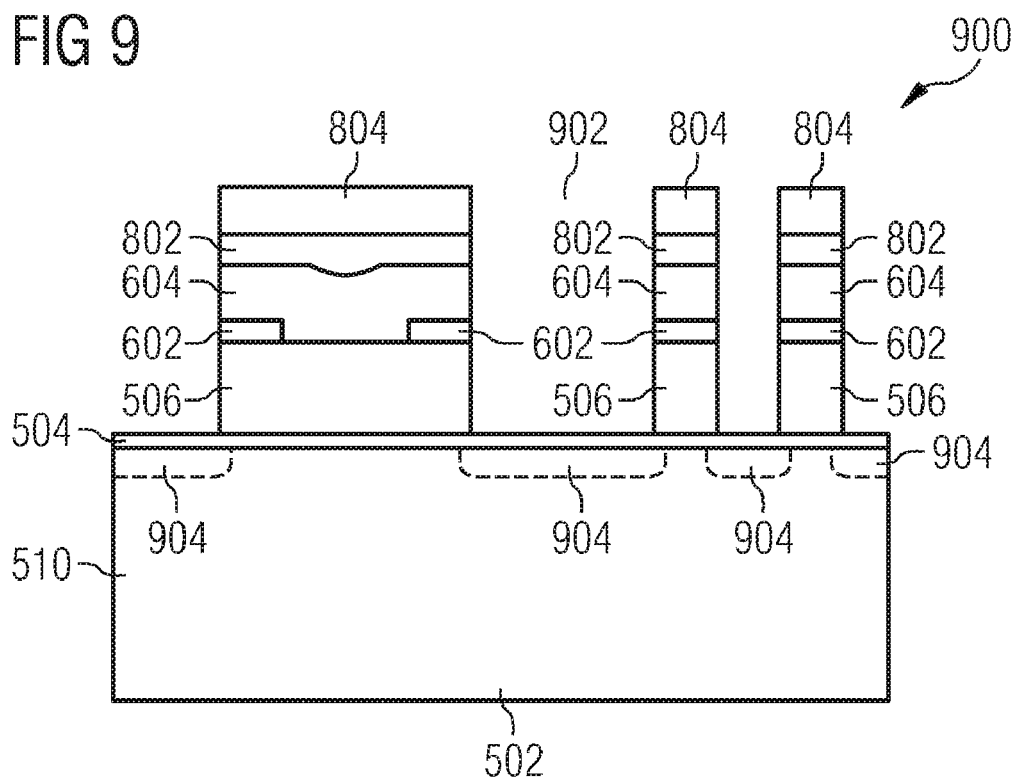

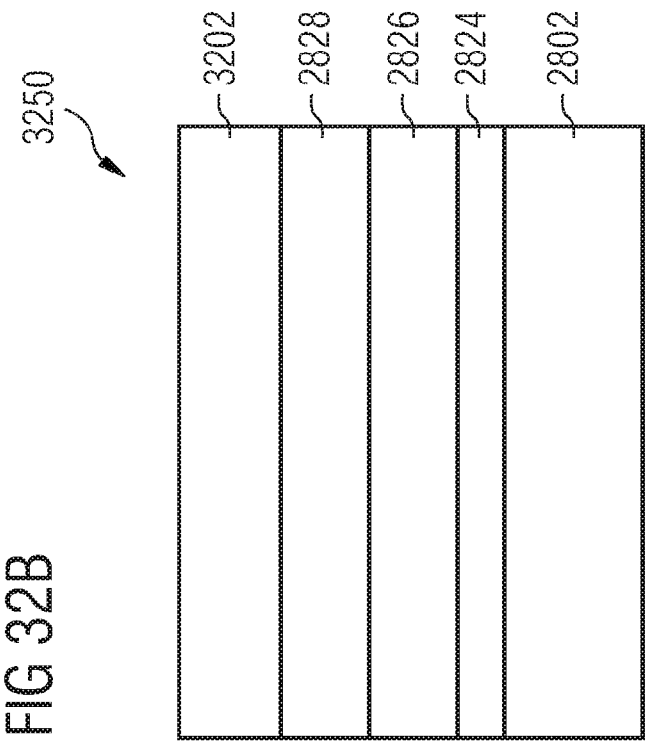
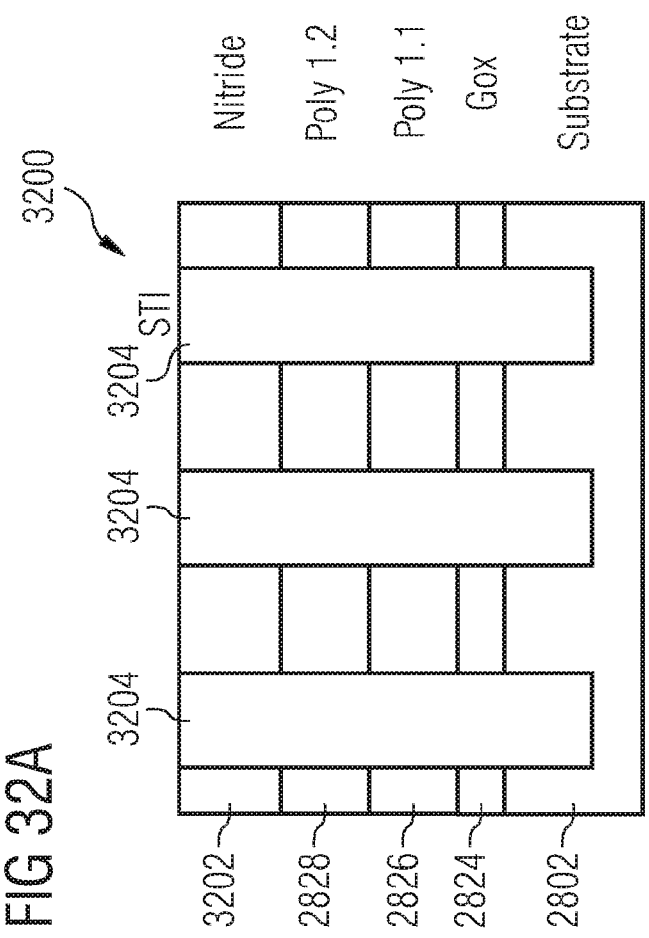

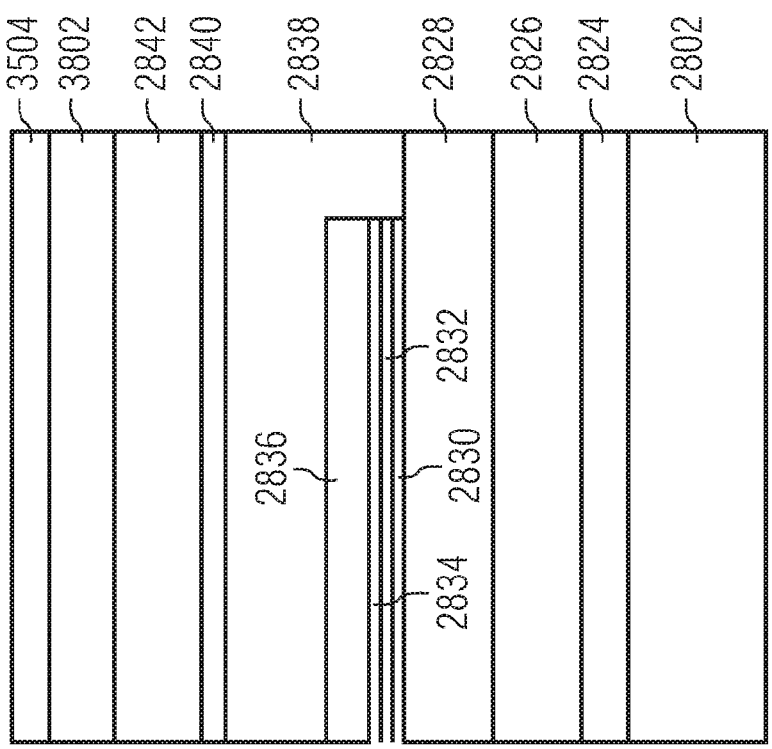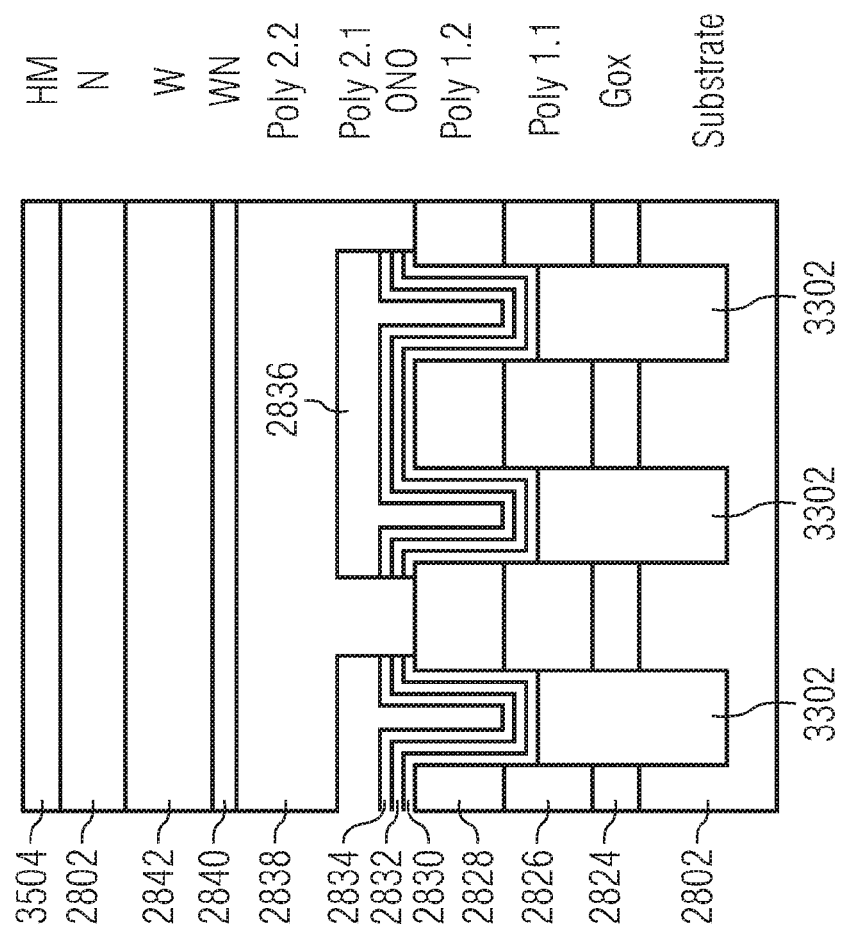
FIG 35B
FIG 35A

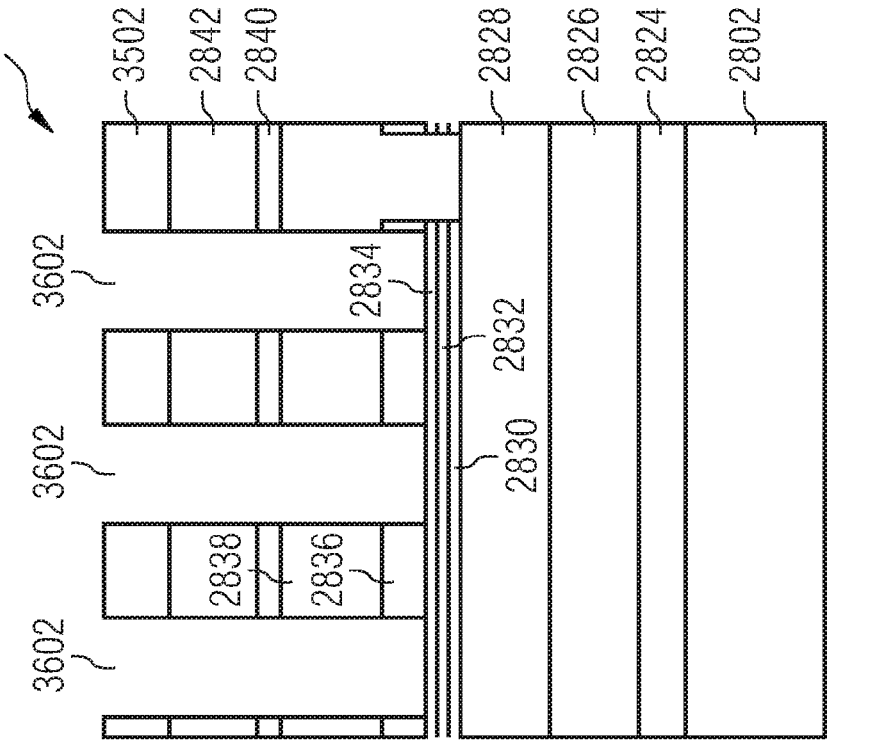
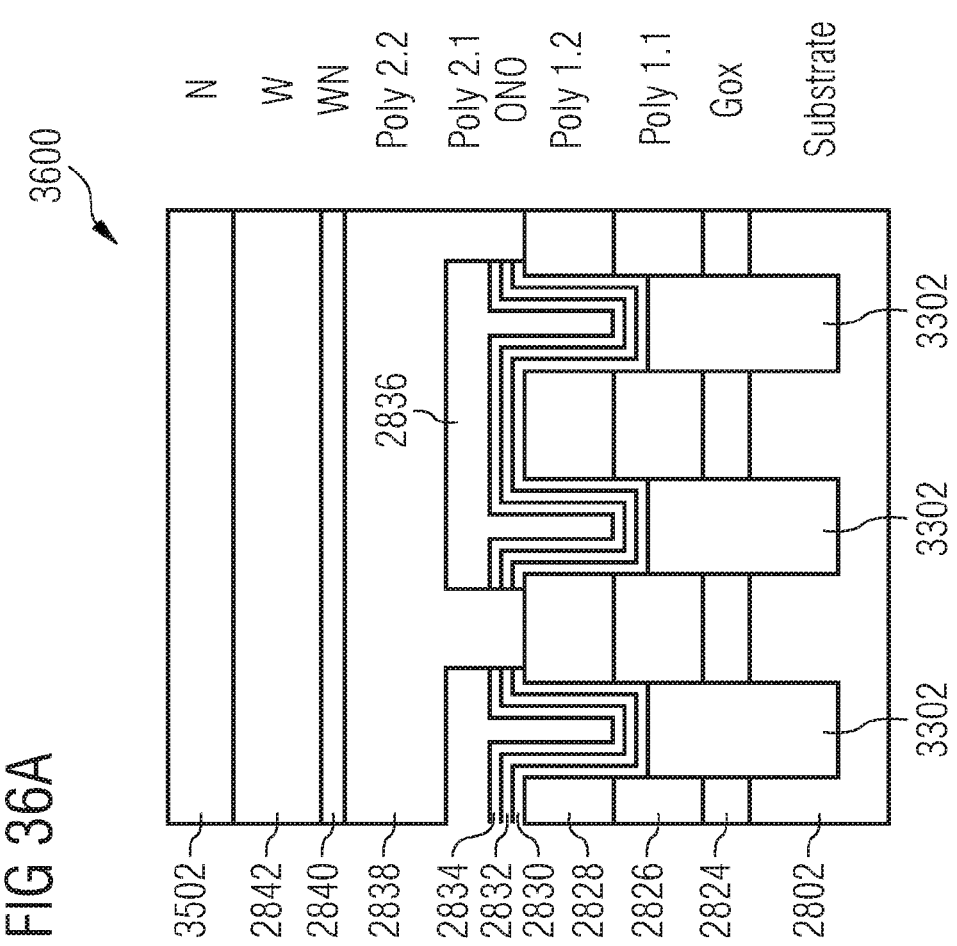
FIG 36A
FIG 36B

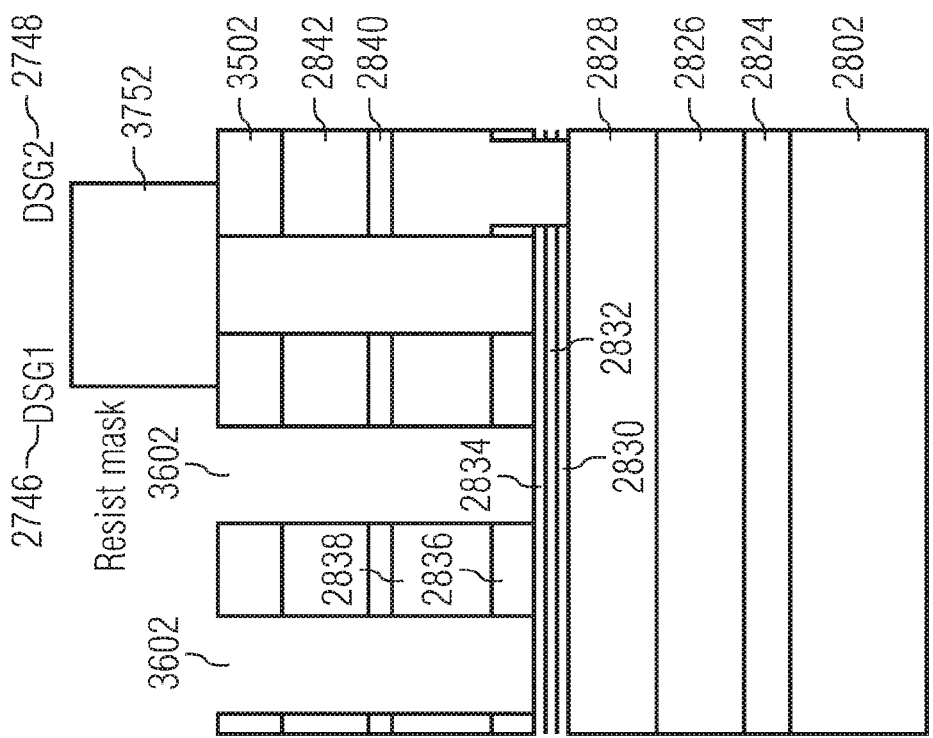
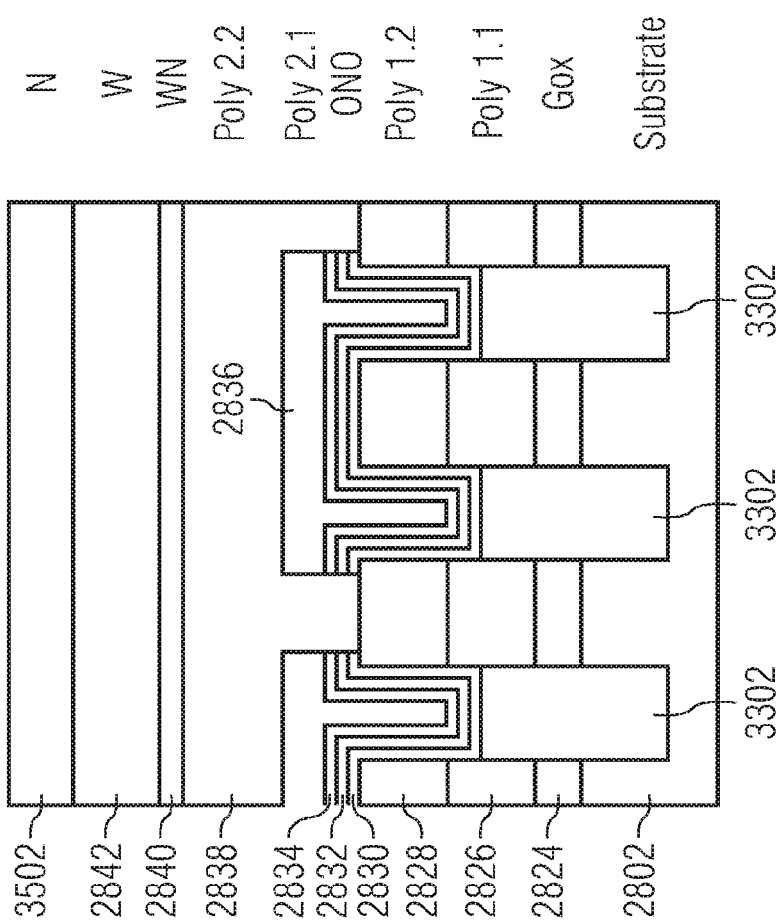
FIG 37A
FIG 37B

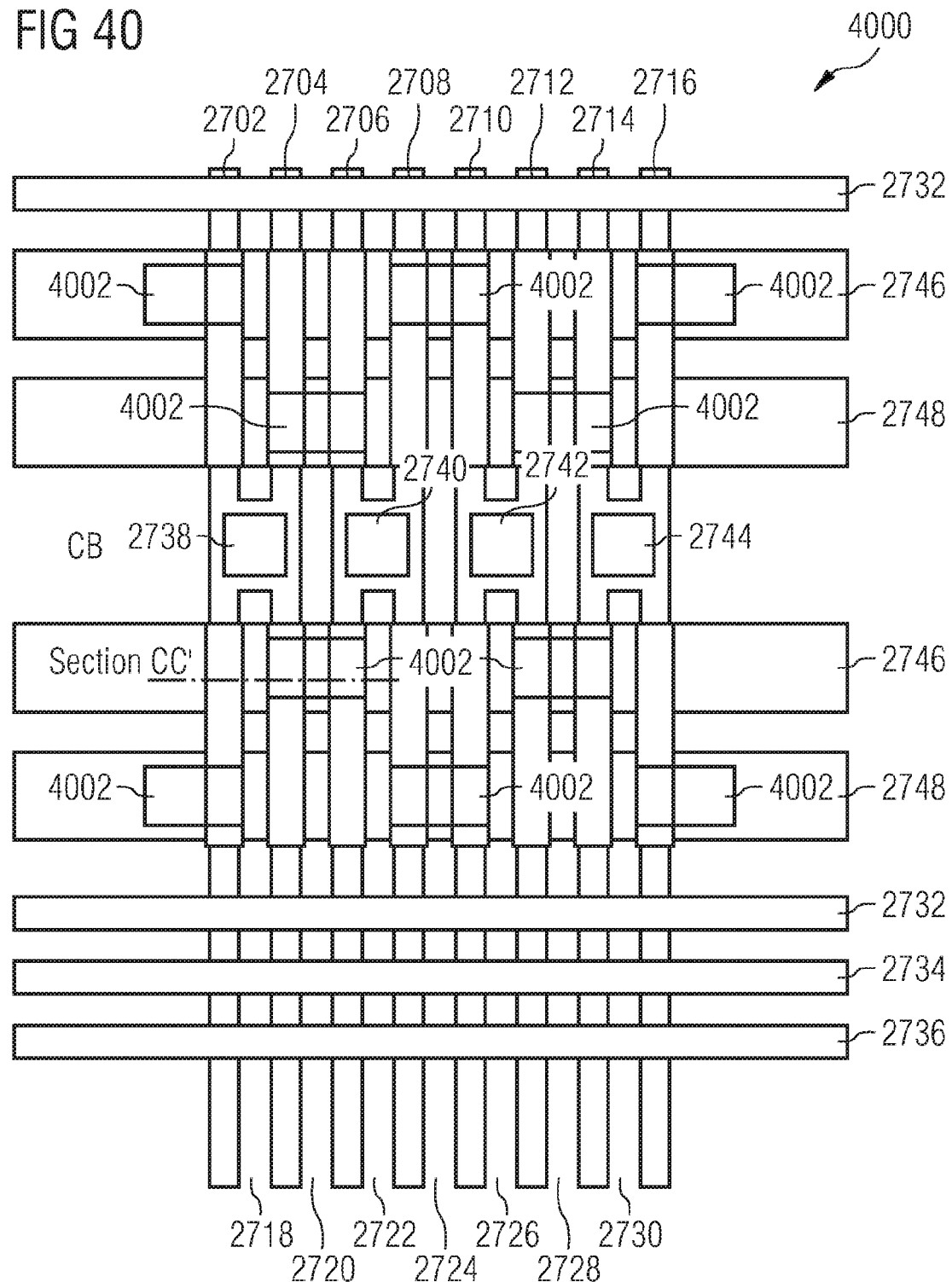

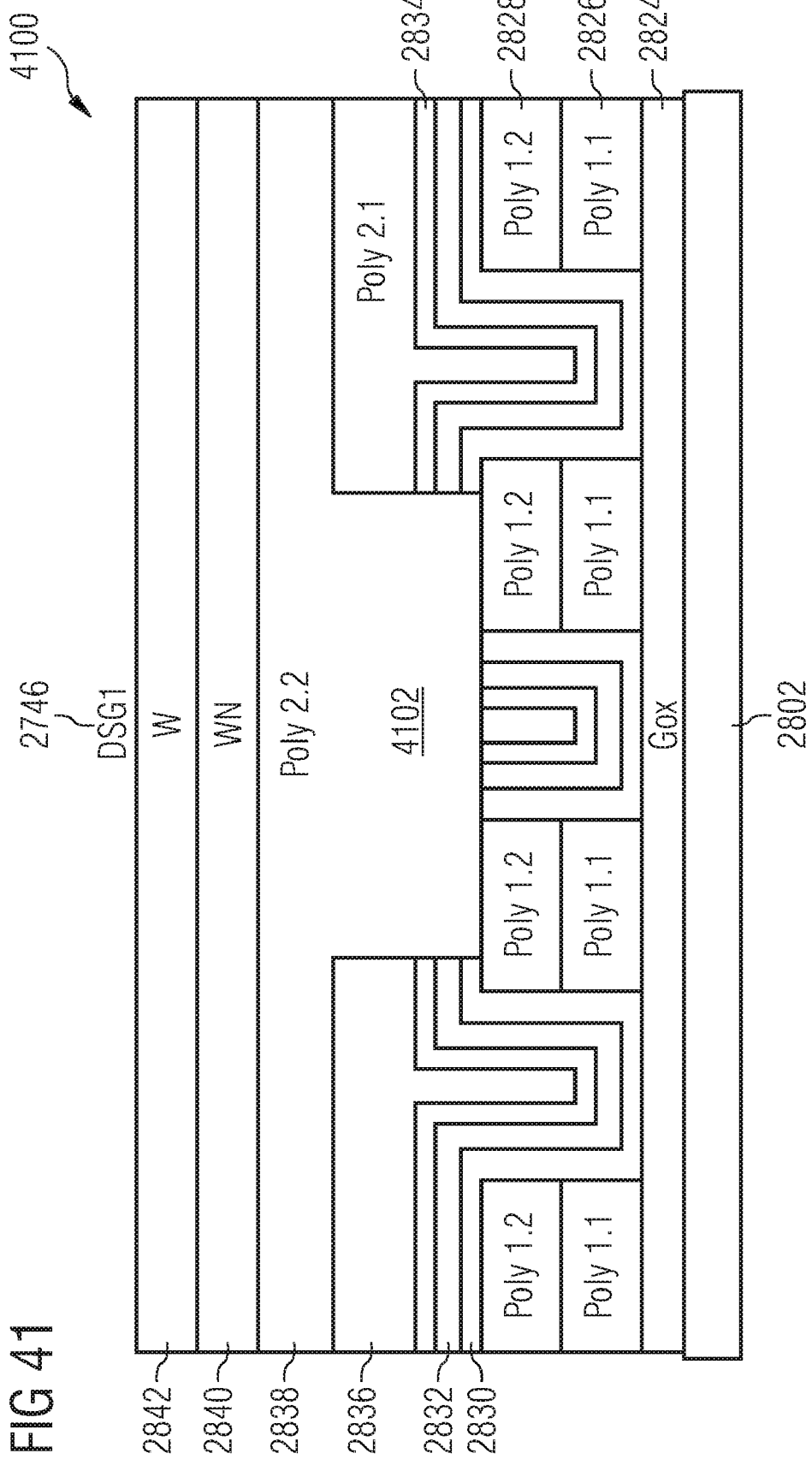

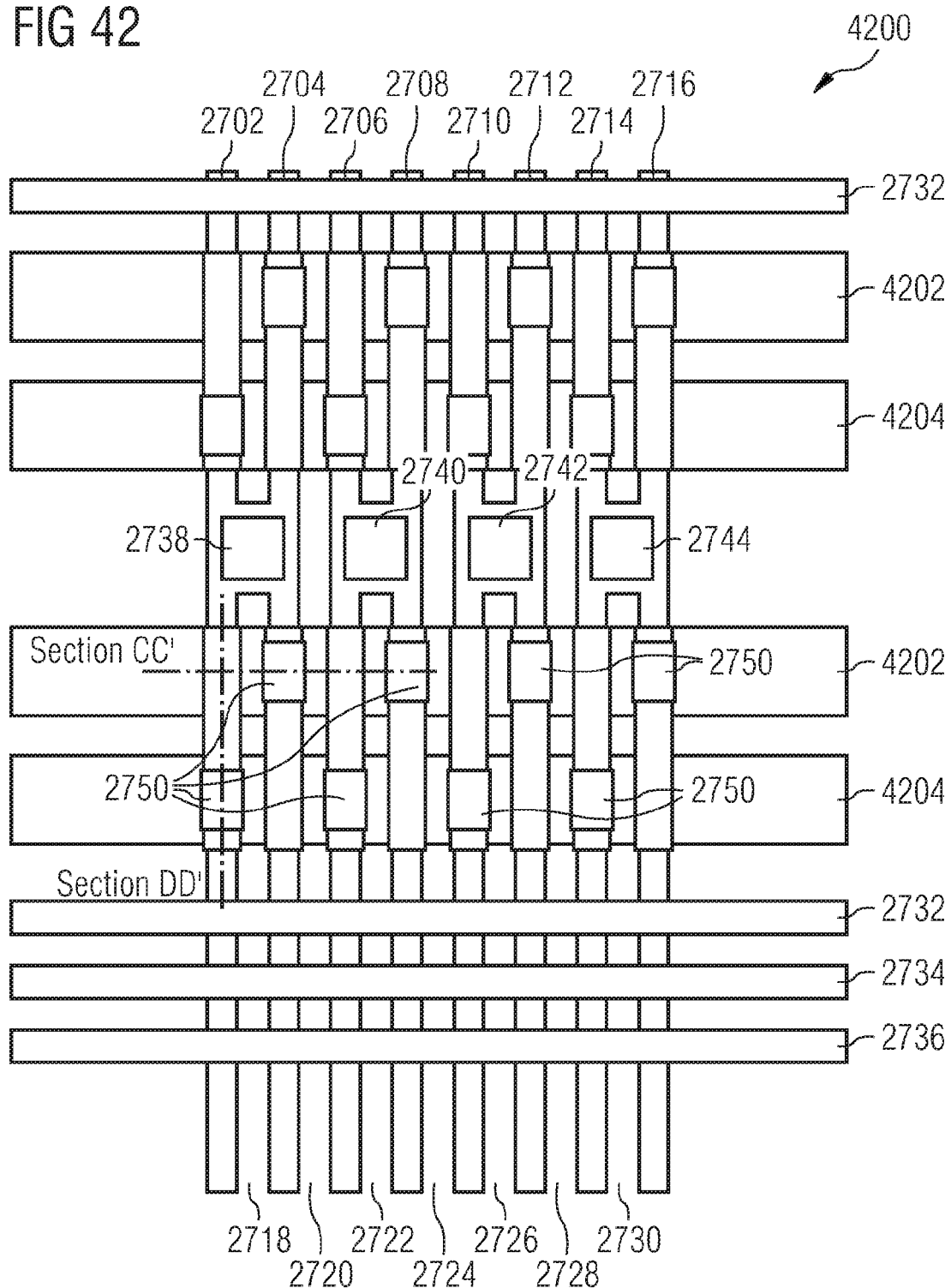

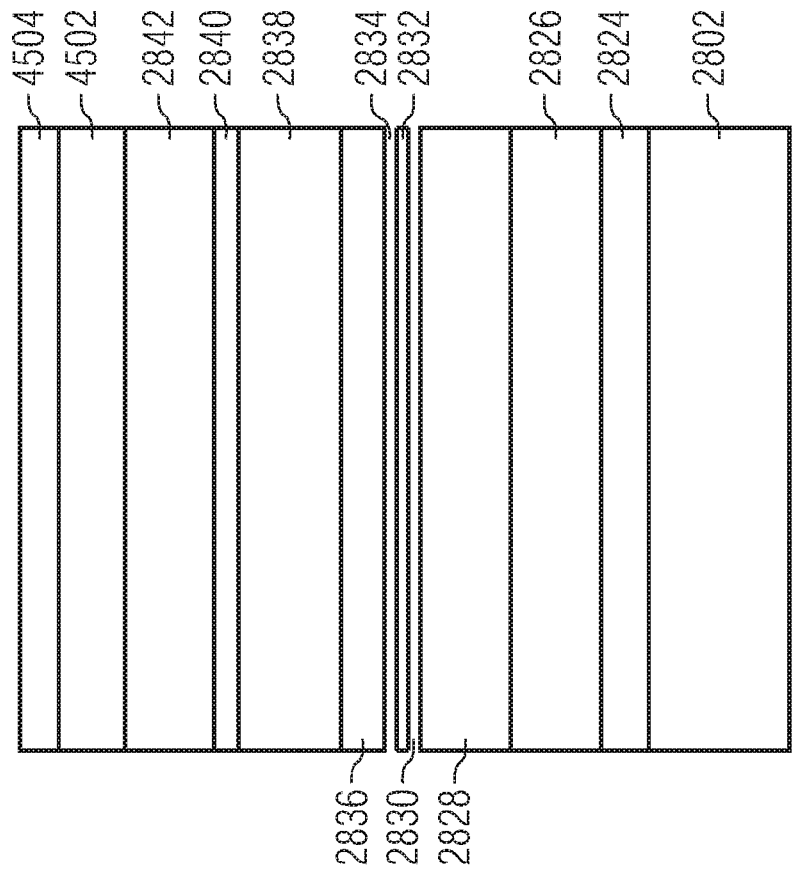
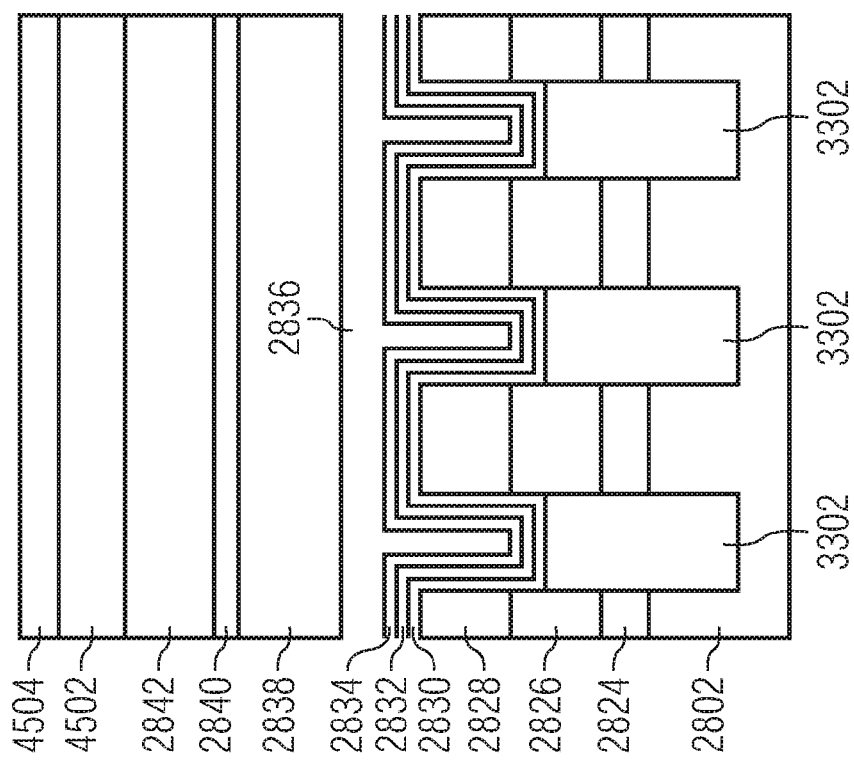

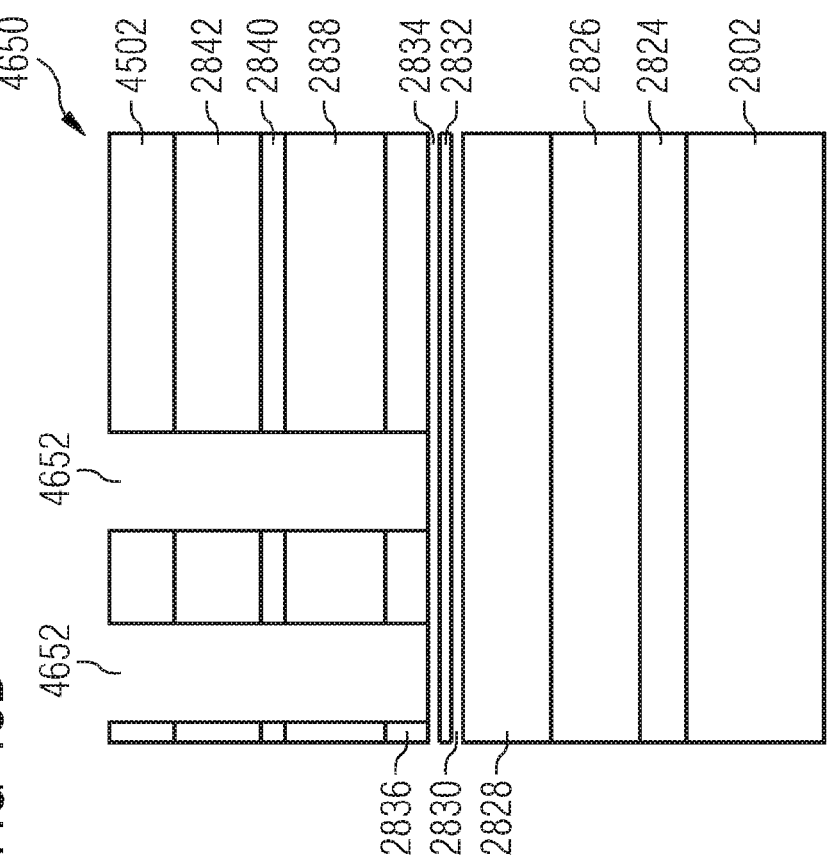
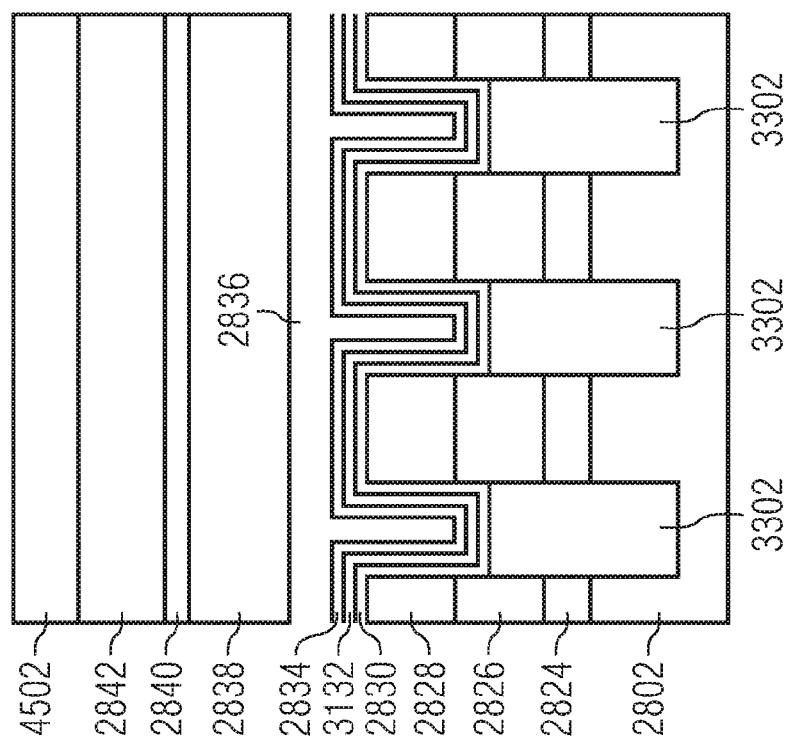

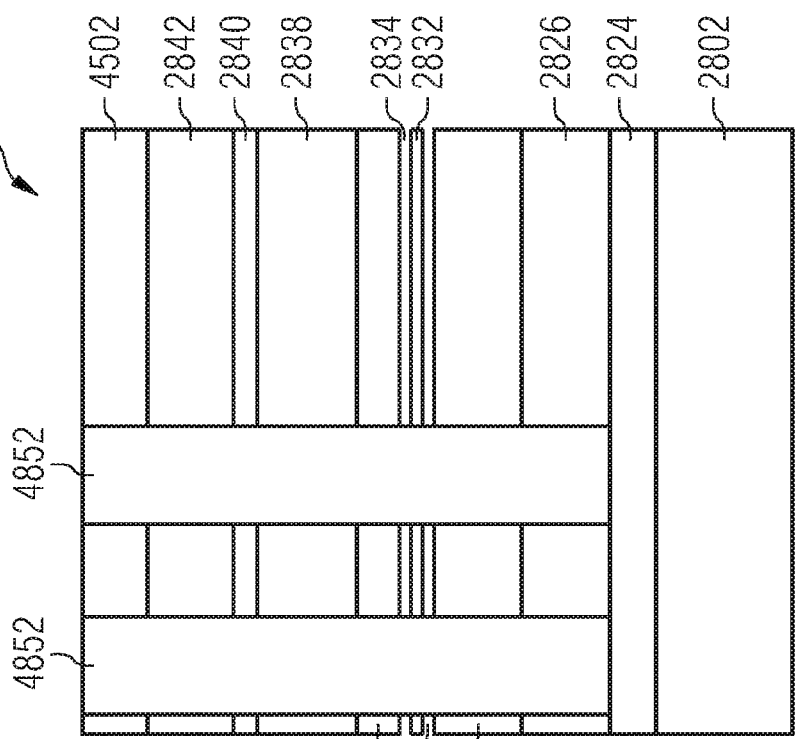
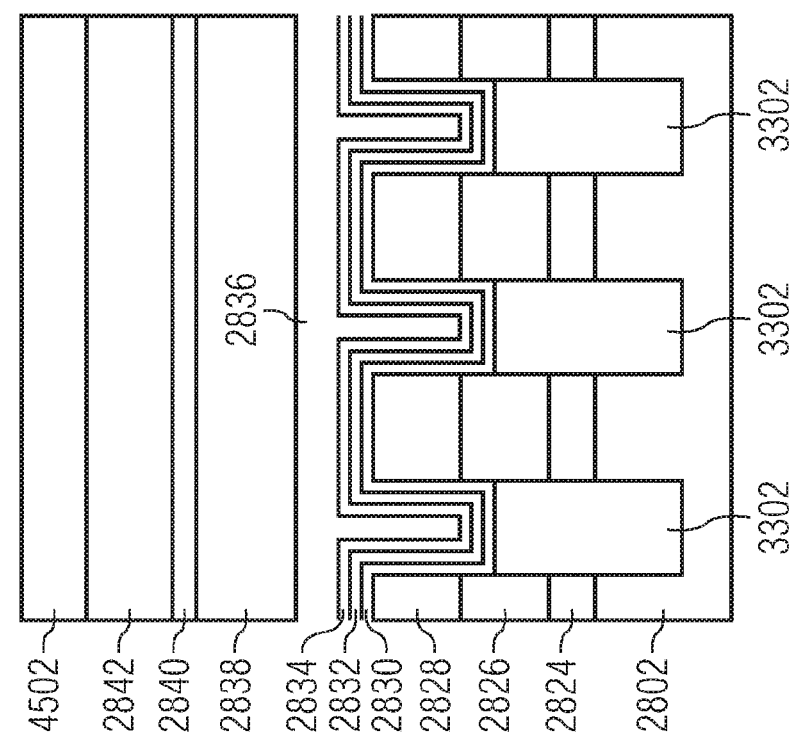

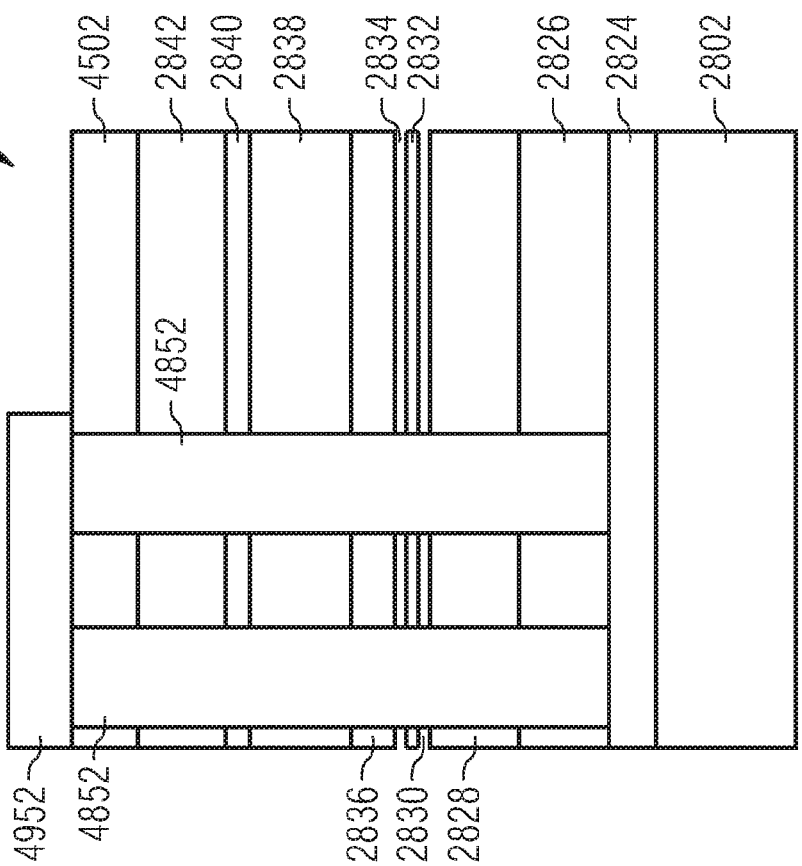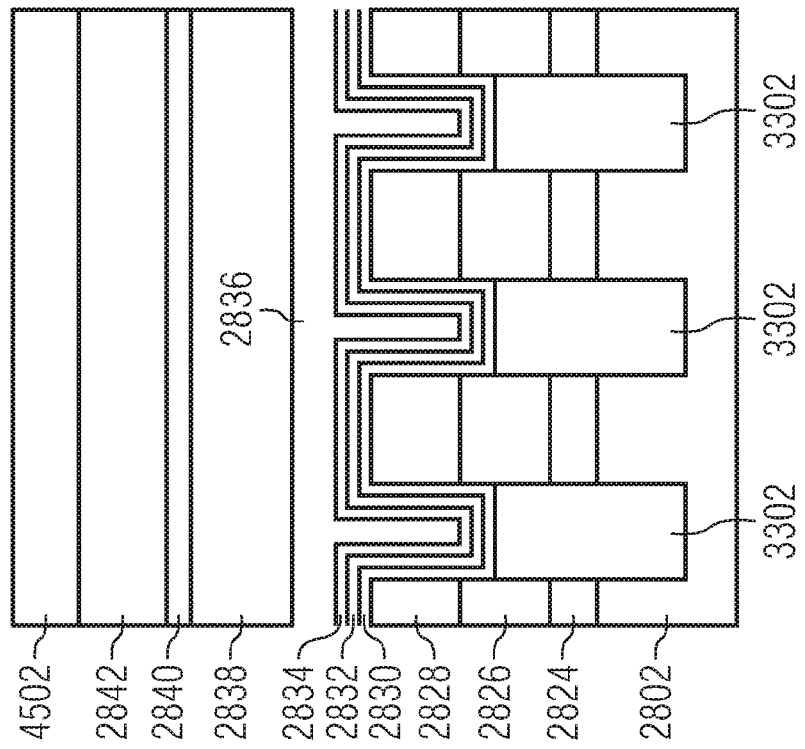

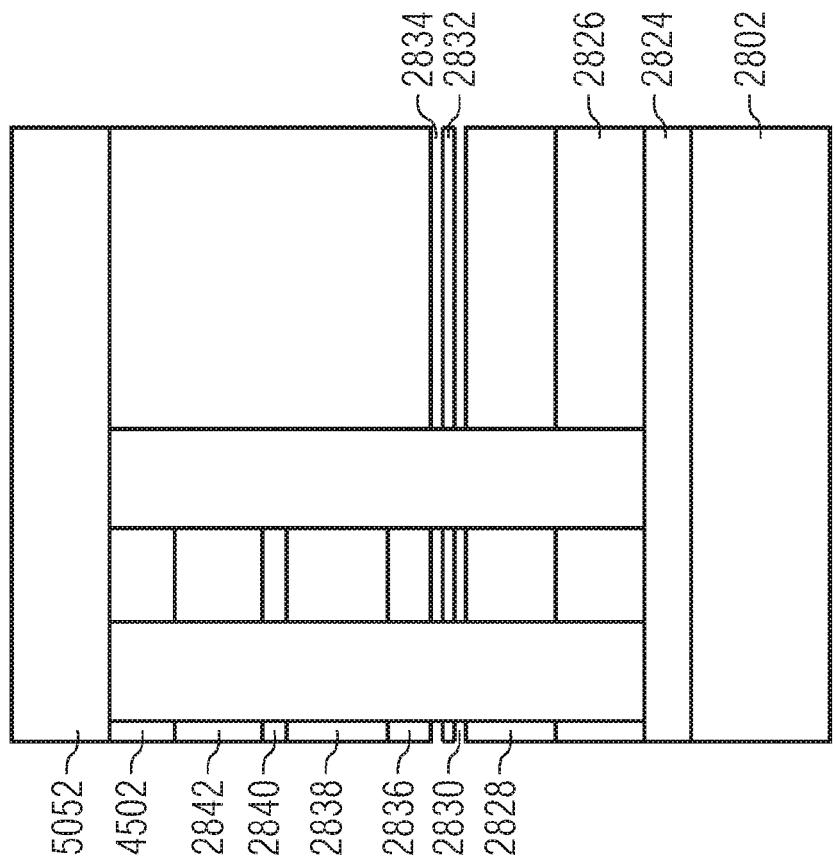
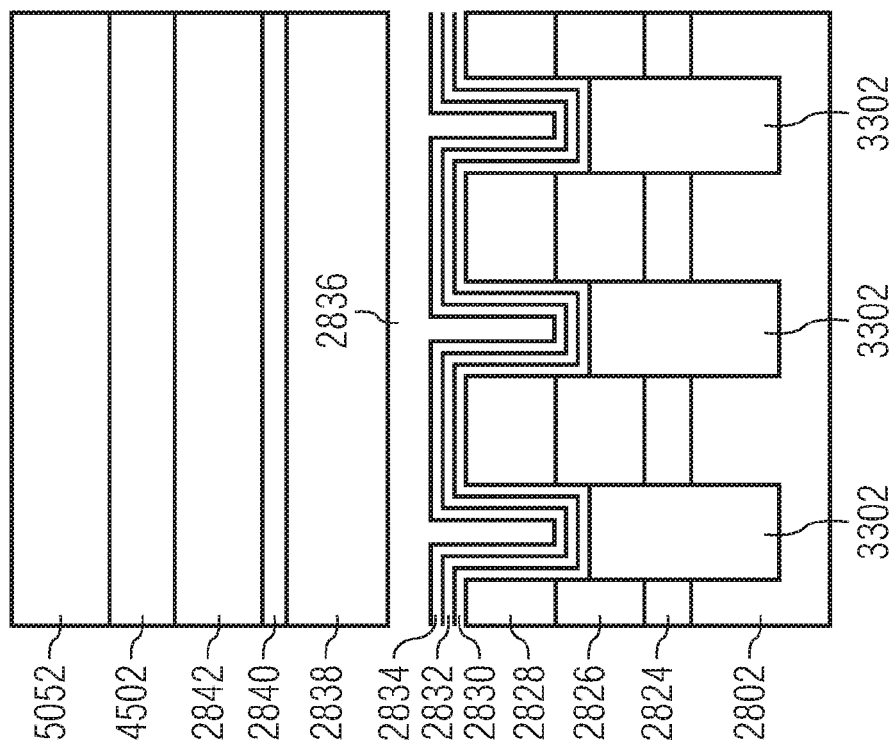

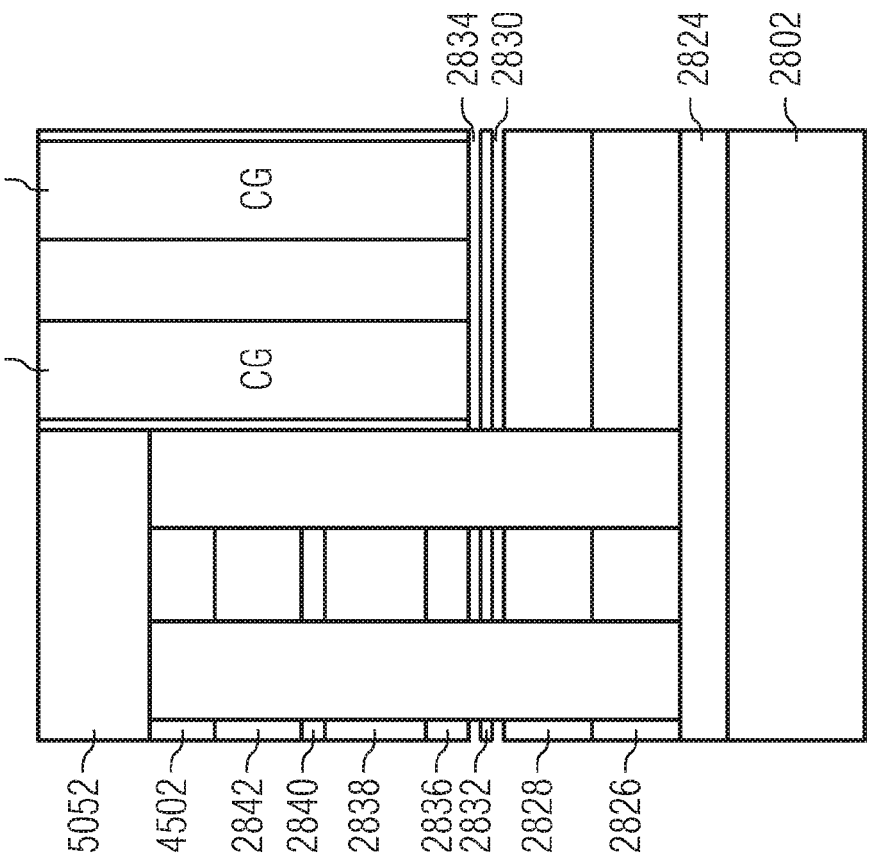
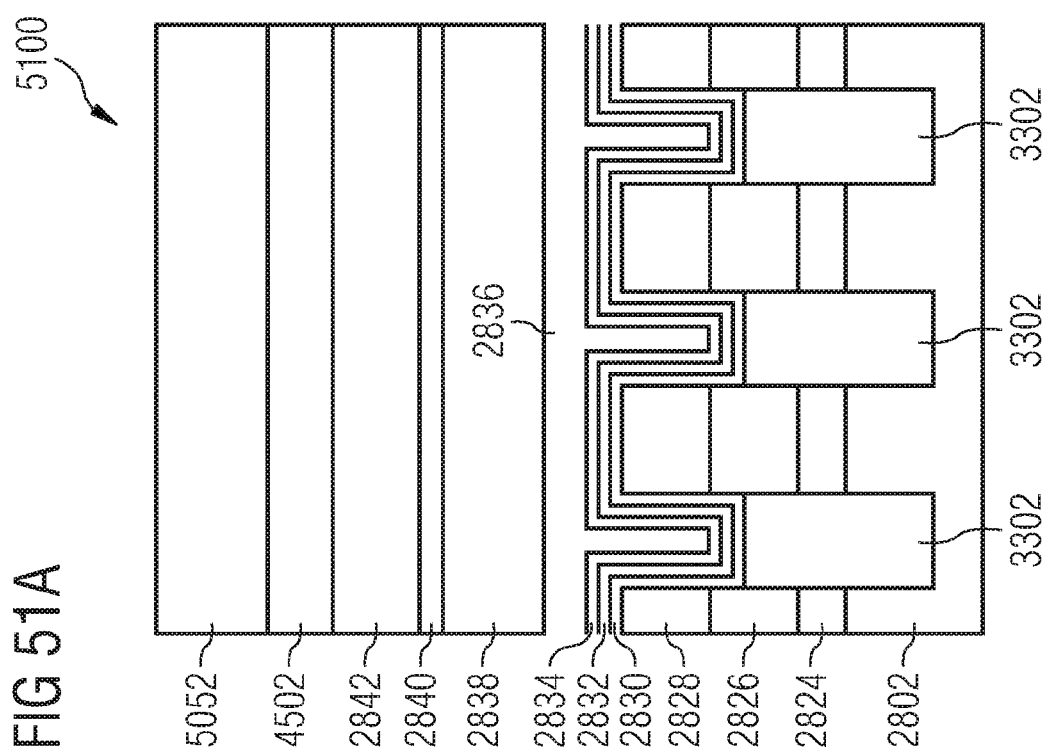

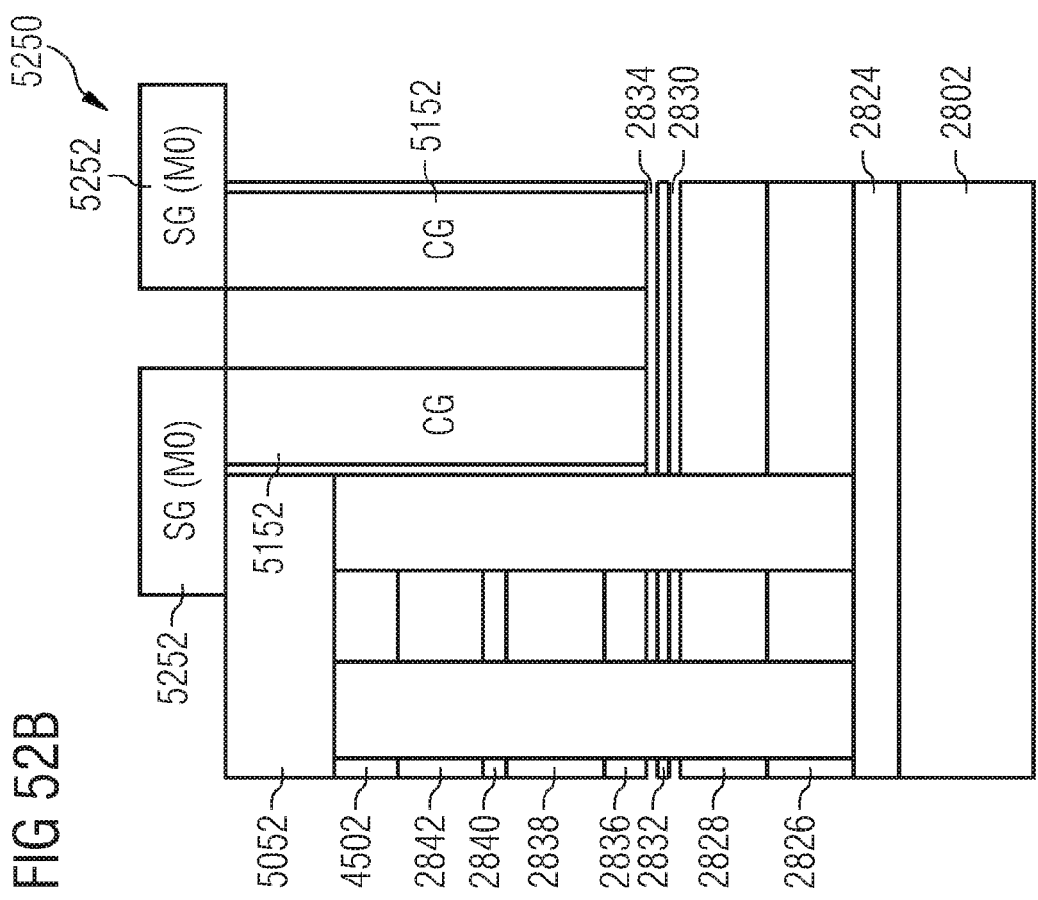
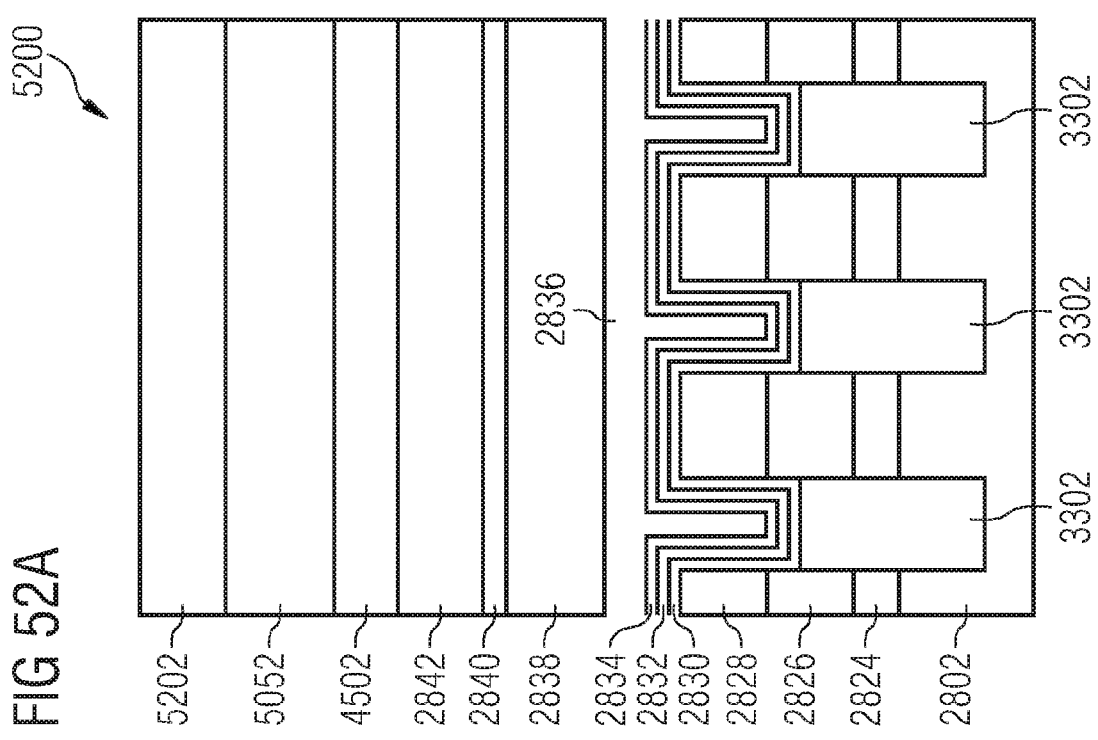

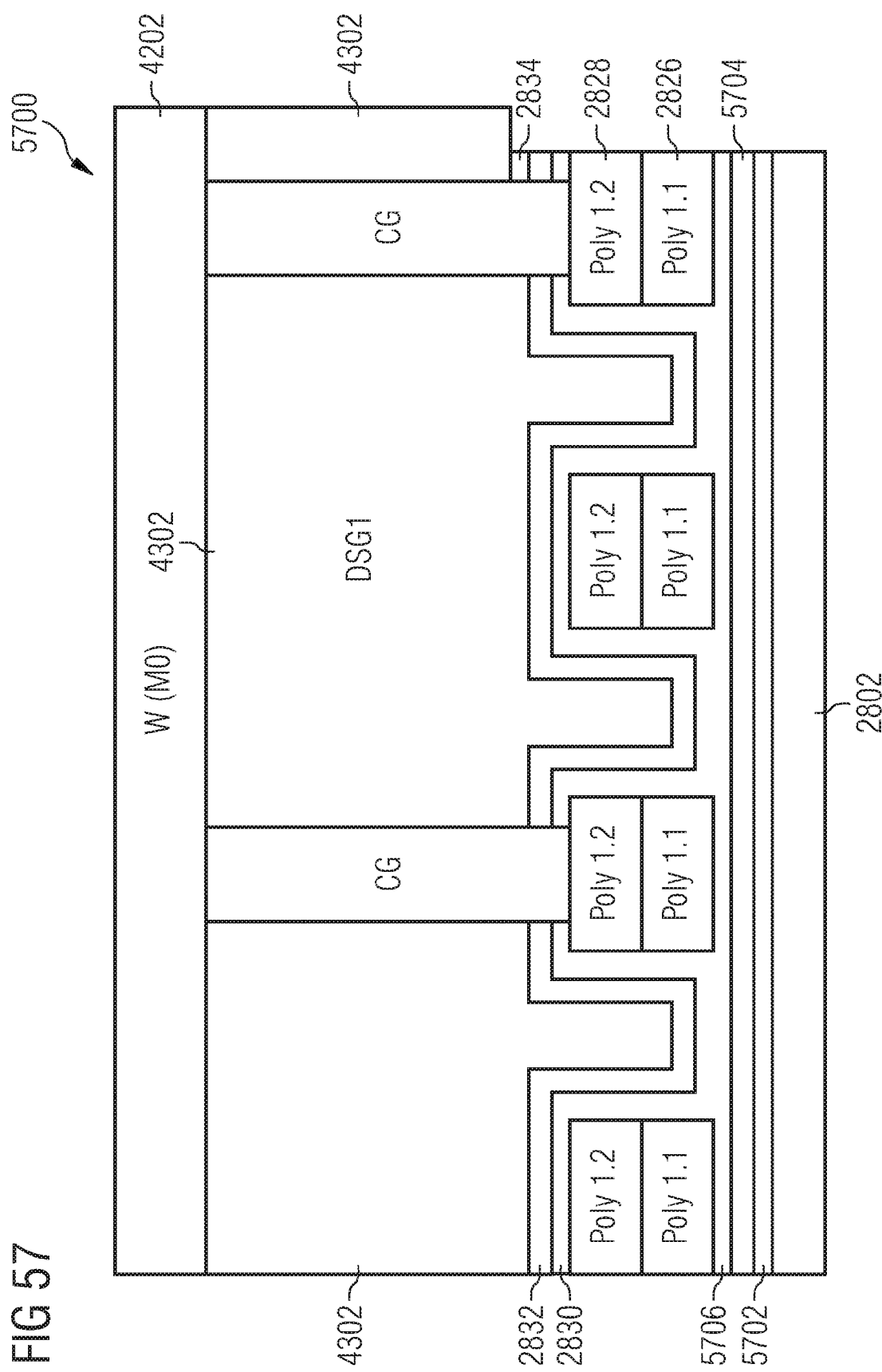

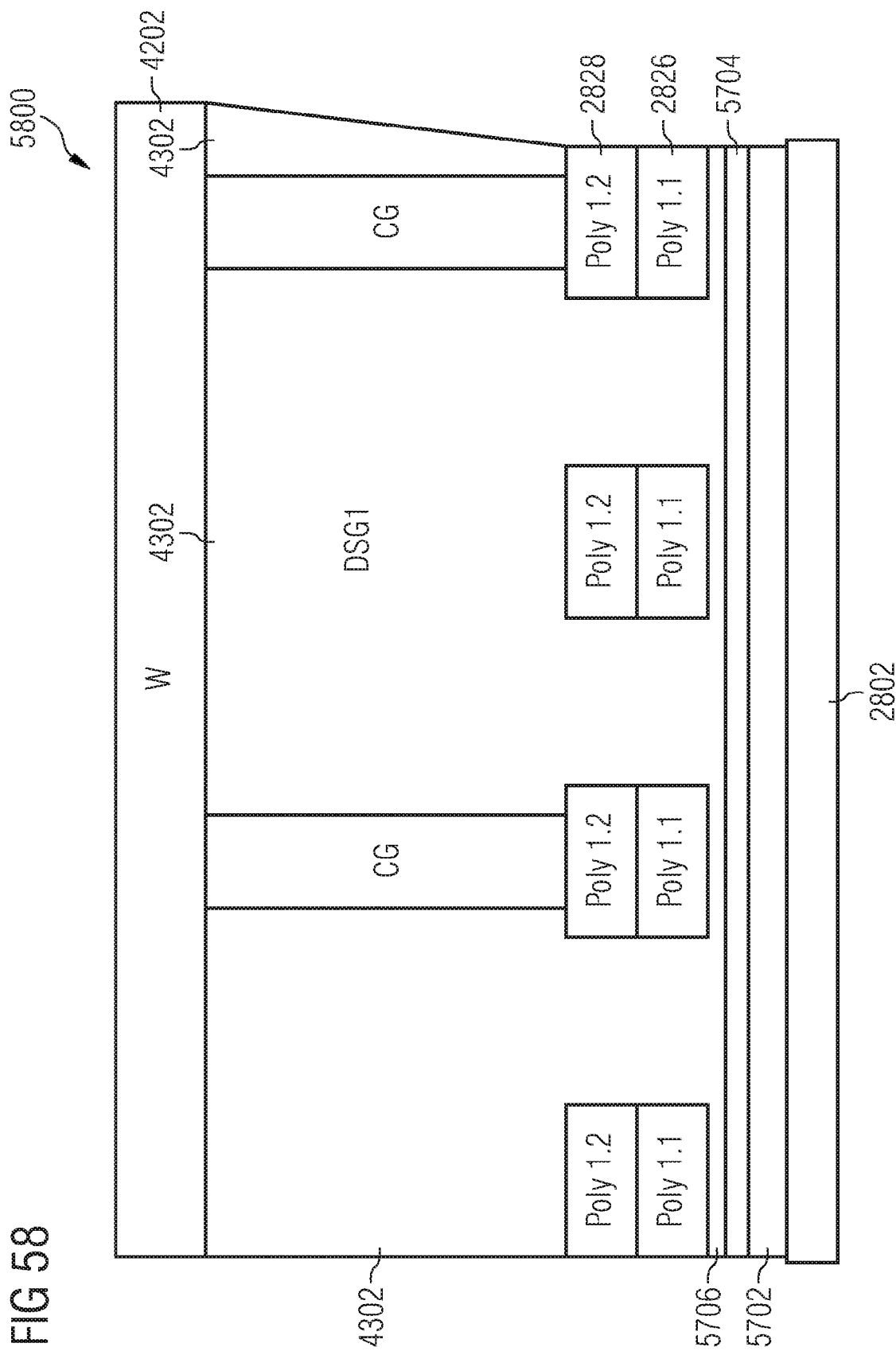

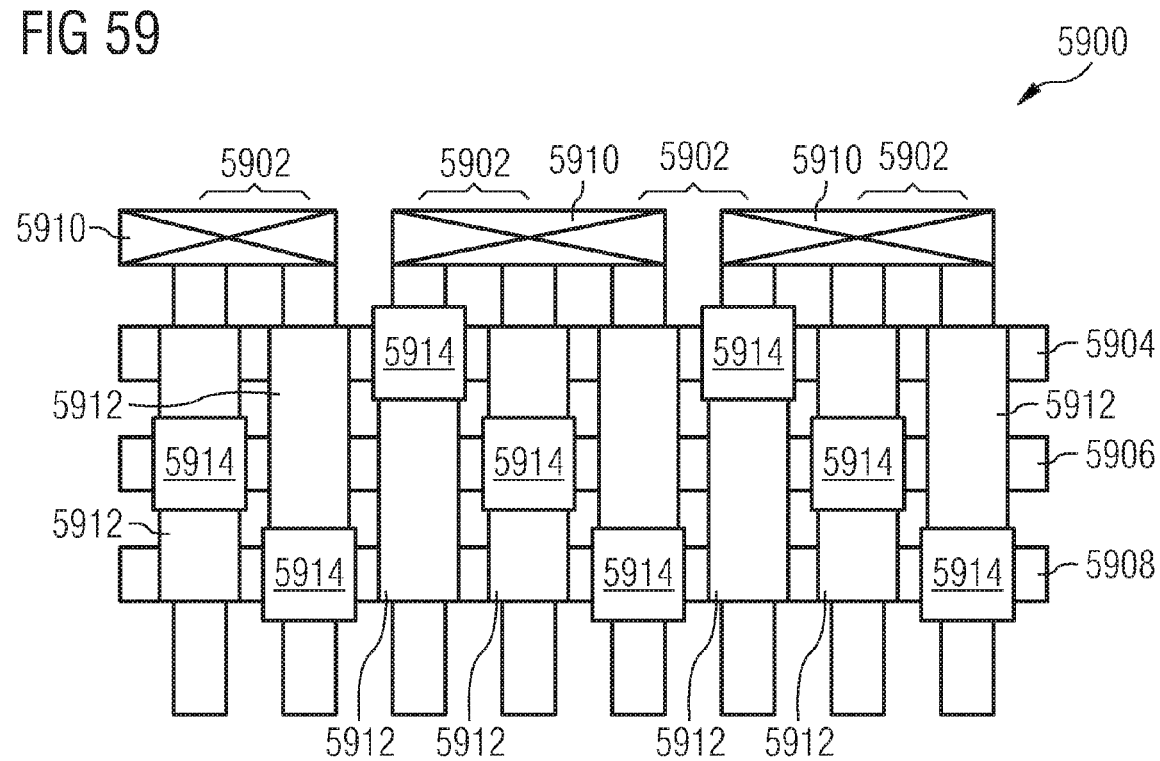

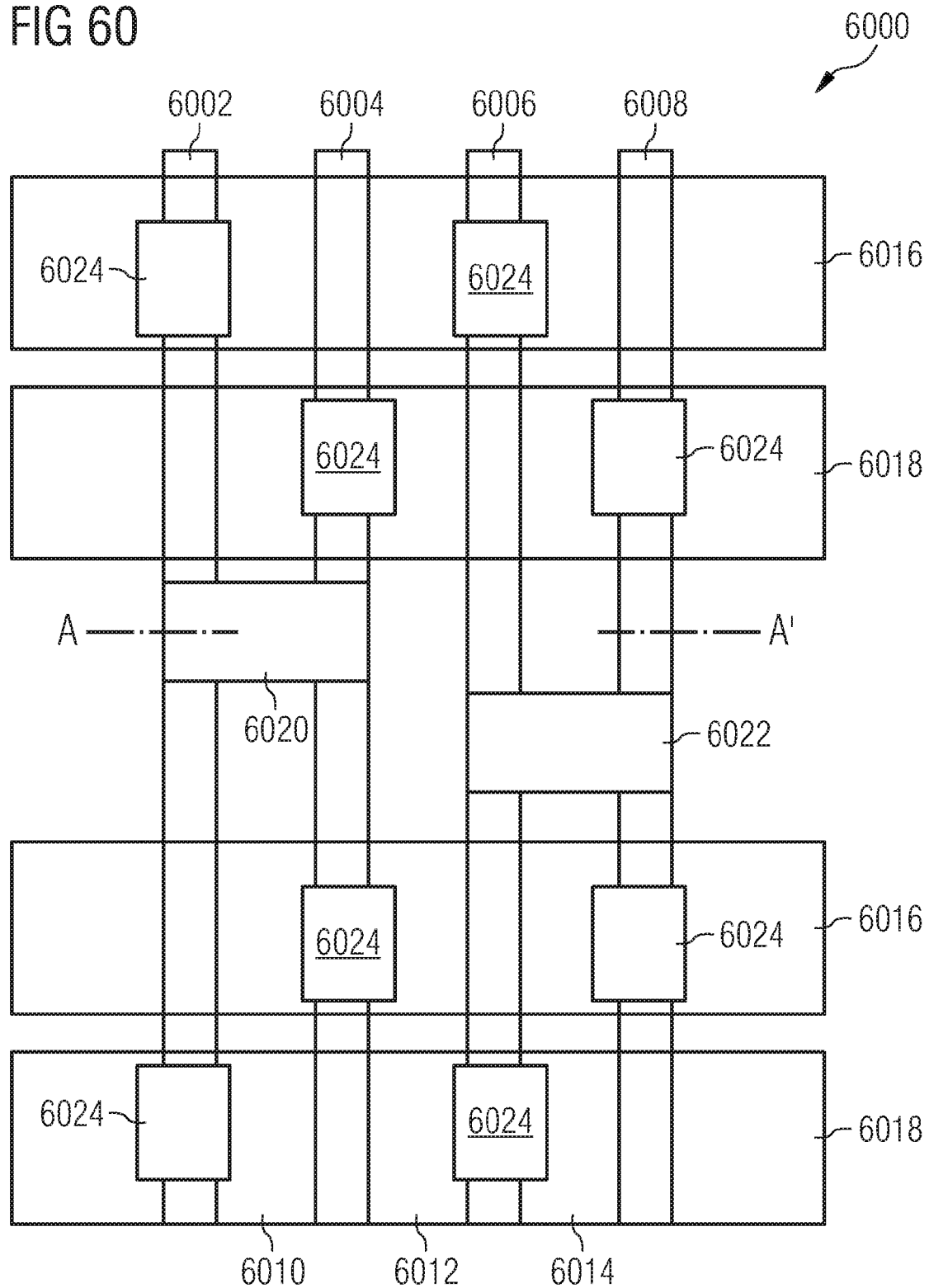

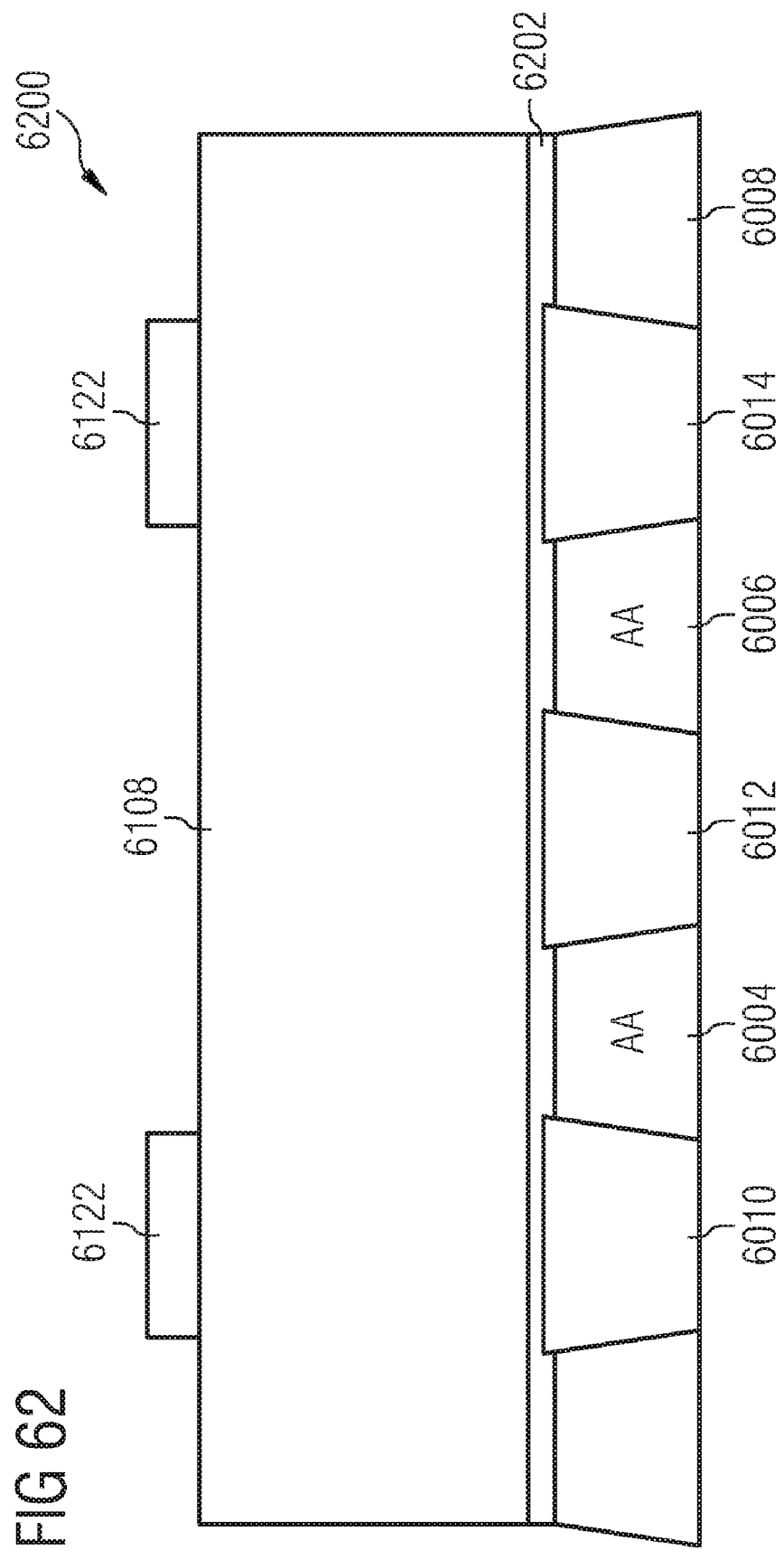

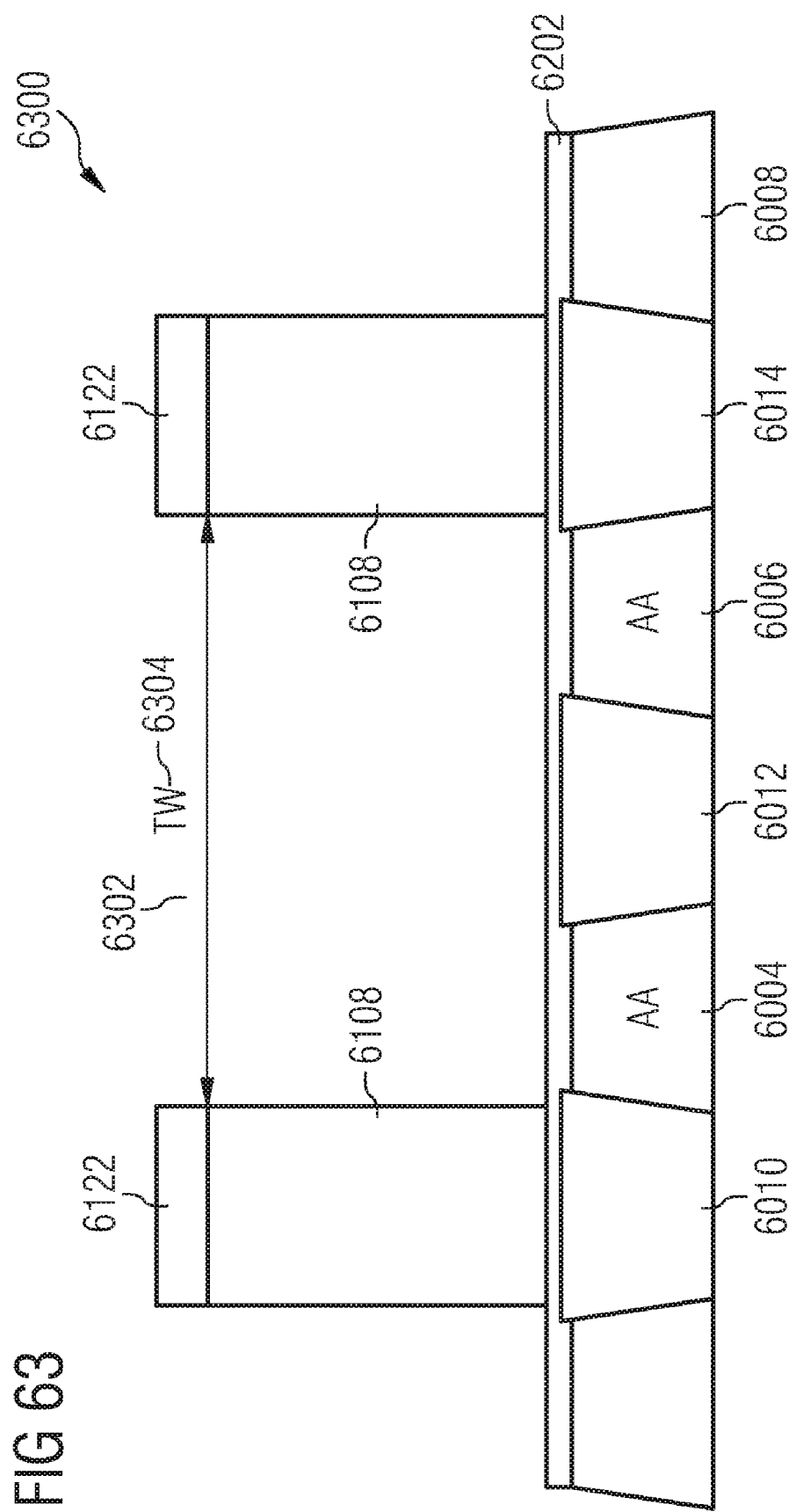

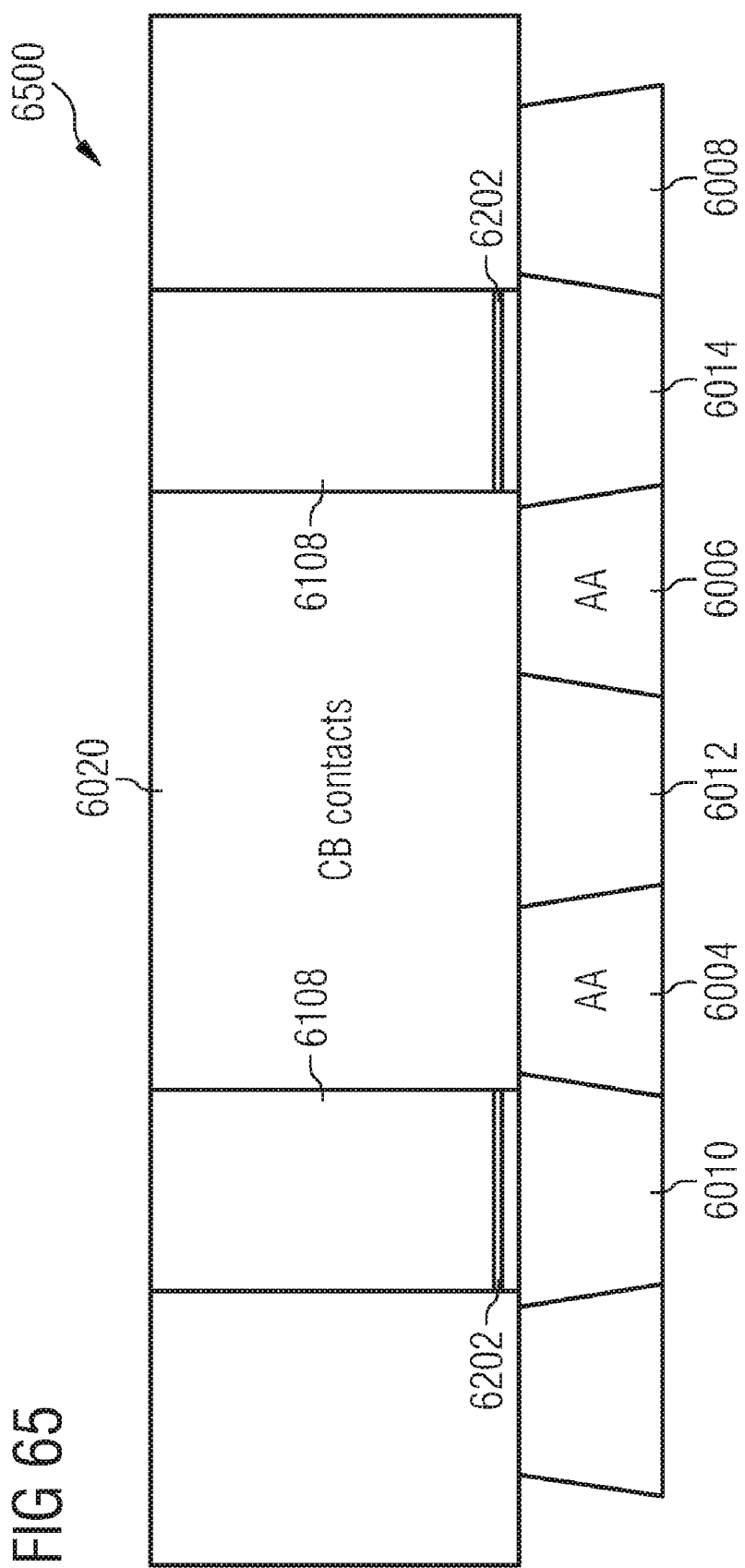

INTEGRATED CIRCUITS; METHODS FOR MANUFACTURING AN INTEGRATED CIRCUIT; MEMORY MODULES; COMPUTING SYSTEMS

TECHNICAL FIELD

Embodiments of the present invention relate generally to integrated circuits, methods for manufacturing an integrated circuit, memory modules, and computing systems.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a top view of a portion of a switch structure in accordance with an embodiment of the invention;

FIG. 3 shows a top view of a portion of a switch structure in accordance with another embodiment of the invention;

FIG. 4 shows a top view of a portion of a NAND Flash memory device in accordance with an embodiment of the invention;

FIG. 7 shows a top view of a portion of a NAND Flash memory device of FIG. 4 at a third stage of its manufacture in accordance with an embodiment of the invention;

FIG. 8 shows a cross sectional view of a portion of a NAND Flash memory device along the cross section line B-B' of FIG. 4 at a fourth stage of its manufacture in accordance with an embodiment of the invention;

FIG. 9 shows a cross sectional view of a portion of a NAND Flash memory device along the cross section line A-A' of FIG. 4 at a fourth stage of its manufacture in accordance with an embodiment of the invention;

FIGS. 32A and 32B show cross sectional views of a portion of a NAND Flash memory device along the cross section line A-A' (FIG. 32A) and along the cross section line D-D' (FIG. 32B) of FIG. 27 at a second stage of its manufacture in accordance with an embodiment of the invention;

FIGS. 35A and 35B show cross sectional views of a portion of a NAND Flash memory device along the cross section line A-A' (FIG. 35A) and along the cross section line D-D' (FIG. 35B) of FIG. 27 at a fifth stage of its manufacture in accordance with an embodiment of the invention;

FIGS. 36A and 36B show cross sectional views of a portion of a NAND Flash memory device along the cross section line A-A' (FIG. 36A) and along the cross section line D-D' (FIG. 36B) of FIG. 27 at a sixth stage of its manufacture in accordance with an embodiment of the invention;

FIGS. 37A and 37B show cross sectional views of a portion of a NAND Flash memory device along the cross section line A-A' (FIG. 37A) and along the cross section line D-D' (FIG. 37B) of FIG. 27 at a seventh stage of its manufacture in accordance with an embodiment of the invention;

FIG. 40 shows a top view of a portion of a NAND Flash memory device in accordance with another embodiment of the invention;

FIG. 41 shows a cross sectional view of a portion of a NAND Flash memory device along the cross section line C-C' of FIG. 40 in accordance with an embodiment of the invention;

FIG. 42 shows a top view of a portion of a NAND Flash memory device in accordance with yet another embodiment of the invention;

FIGS. 45A and 45B show cross sectional views of a portion of a NAND Flash memory device along the cross section line C-C' (FIG. 45A) and along the cross section line D-D' (FIG. 45B) of FIG. 42 at a second stage of its manufacture in accordance with an embodiment of the invention;

FIGS. 46A and 46B show cross sectional views of a portion of a NAND Flash memory device along the cross section line C-C' (FIG. 46A) and along the cross section line D-D' (FIG. 46B) of FIG. 42 at a third stage of its manufacture in accordance with an embodiment of the invention;

FIGS. 47A and 47B show cross sectional views of a portion of a NAND Flash memory device along the cross section line C-C' (FIG. 47A) and along the cross section line D-D' (FIG. 47B) of FIG. 42 at a fourth stage of its manufacture in accordance with an embodiment of the invention;

FIGS. 48A and 48B show cross sectional views of a portion of a NAND Flash memory device along the cross section line C-C' (FIG. 48A) and along the cross section line D-D' (FIG. 48B) of FIG. 42 at a fifth stage of its manufacture in accordance with an embodiment of the invention;

FIGS. 49A and 49B show cross sectional views of a portion of a NAND Flash memory device along the cross section line C-C' (FIG. 49A) and along the cross section line D-D' (FIG. 49B) of FIG. 42 at a sixth stage of its manufacture in accordance with an embodiment of the invention;

FIGS. 50A and 50B show cross sectional views of a portion of a NAND Flash memory device along the cross section line C-C' (FIG. 50A) and along the cross section line D-D' (FIG. 50B) of FIG. 42 at a seventh stage of its manufacture in accordance with an embodiment of the invention;

FIGS. 51A and 51B show cross sectional views of a portion of a NAND Flash memory device along the cross section line C-C' (FIG. 51A) and along the cross section line D-D' (FIG. 51B) of FIG. 42 at an eighth stage of its manufacture in accordance with an embodiment of the invention;

FIGS. 52A and 52B show cross sectional views of a portion of a NAND Flash memory device along the cross section line C-C' (FIG. 52A) and along the cross section line D-D' (FIG. 52B) of FIG. 42 at a ninth stage of its manufacture in accordance with an embodiment of the invention;

FIG. 57 shows a cross sectional view of a portion of a NAND Flash memory device along the cross section line C-C' of FIG. 42 in accordance with another embodiment of the invention;

FIG. 58 shows a cross sectional view of a portion of a NAND Flash memory device along the cross section line C-C' of FIG. 42 in accordance with another embodiment of the invention;

FIG. 59 shows a top view of a portion of a switch structure in accordance with another embodiment of the invention;

FIG. 60 shows a top view of a portion of a NAND Flash memory device in accordance with an embodiment of the invention;

FIG. 62 shows a cross sectional view of the bit line contact portion of a NAND Flash memory device along the cross section line A-A' of FIG. 60 at a first stage of its manufacture in accordance with an embodiment of the invention;

FIG. 63 shows a cross sectional view of the bit line contact portion of a NAND Flash memory device along the cross section line A-A' of FIG. 60 at a second stage of its manufacture in accordance with an embodiment of the invention;

FIG. 65 shows a cross sectional view of the bit line contact portion of a NAND Flash memory device along the cross section line A-A' of FIG. 60 at a fourth stage of its manufacture in accordance with an embodiment of the invention.

DETAILED DESCRIPTION OF ILLUSTRATIVE EMBODIMENTS

As used herein the terms connected and coupled are intended to include both direct and indirect connection and coupling, respectively.

Figure 1:
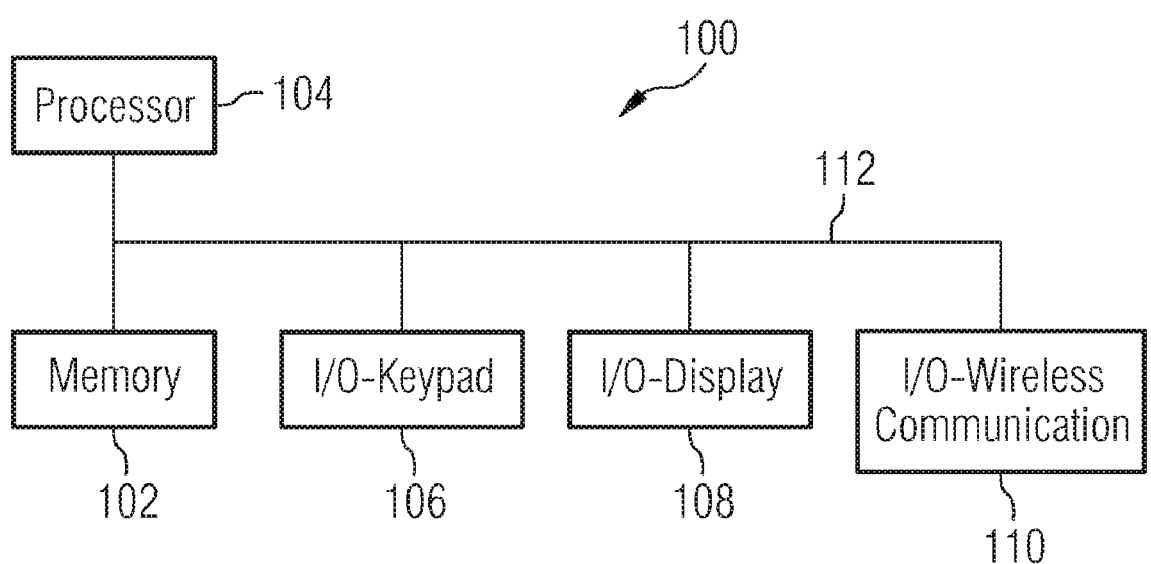
FIG. 1 shows a computing system that uses a memory device in accordance with embodiments of the invention.

FIG. 1 shows an example computing system 100 that uses a memory device constructed of memory cells in accordance with embodiments of the invention which will be described in more detail below. The computing system 100 includes a memory device 102, which may utilize memory cells having memory cells in accordance with embodiments of the invention. The computing system 100 also includes a processor 104, and one or more input/output devices, such as a keypad 106, display 108, and wireless communication device 110. The memory device 102, processor 104, keypad 106, display 108 and wireless communication device 110 may be interconnected by a bus 112. The computing system 100 may be a general purpose computer such as, e.g., a personal computer or a workstation. In an embodiment of the invention, the computing system 100 may be a digital still camera, a video recorder (such as, e.g., a video tape recorder or a DVD recorder), a mobile radio communication device such as, e.g., a cellular phone, a car control device, etc. In general, the computing system 100 may be any kind of computing device that includes a processor (which may be implemented as hard-wired logic or as a programmable processor such as, e.g., a microprocessor) and memory cells which will be described in more detail below.

The wireless communication device 110 may include circuitry (not shown) for sending and receiving transmissions over a cellular telephone network, a WiFi wireless network, or other wireless communication network. It will be understood that the variety of input/output devices shown in FIG. 1 is merely an example, in which the computing system 100 may be configured as a cellular telephone or other wireless communications device. Memory devices including memory cells in accordance with embodiments of the invention may be used in a wide variety of systems. Alternative system designs may include different input/output devices, multiple processors, alternative bus configurations, and many other configurations.

The computing system 100 may further include a power supply circuit (not shown) and a removable non-volatile memory device such as, e.g., a small form factor card.

The memory cells in accordance with various embodiments of the invention may include volatile memory cells and/or non-volatile memory cells. The memory cells in accordance with various embodiments of the invention may further include "multi-bit" memory cells and/or "multi-level" memory cells.

A "non-volatile memory cell" may be understood as a memory cell storing data even if it is not active. In an embodiment of the invention, a memory cell may be understood as being not active, e.g., if current access to the content of the memory cell is inactive. In another embodiment, a memory cell may be understood as being not active, e.g., if the power supply is inactive. Furthermore, the stored data may be refreshed on a regular timely basis, but not, as with a "volatile memory cell" every few picoseconds or nanoseconds or milliseconds, but rather in a range of hours, days, weeks or months.

As used herein the term "multi-bit" memory cell is intended to, e.g., include memory cells which are configured to store a plurality of bits by spatially separated electric charge storing regions, thereby representing a plurality of logic states.

Furthermore, as used herein the term "multi-level" memory cell is intended to include memory cells which are configured to store a plurality of bits or data, e.g., by showing distinguishable threshold voltages dependent on the amount of electric charge stored in the memory cell, thereby representing a plurality of logic states.

In various embodiments, different types of memory cells may be provided such as, e.g., memory cells selected from a group of memory cells consisting of:

charge storing memory cells such as, e.g., floating gate memory cells or charge trapping memory cells;

resistive memory cells such as, e.g., phase change random access memory (PCRAM) cells, conductive bridging random access memory (CBRAM) cells, magnetoresistive random access memory (MRAM) cells, organic random access memory (ORAM) cells.

In an embodiment of the invention, the memory cells may be planar memory cells of fin memory cells (e.g., fin field effect transistor memory cells), e.g. having one or more control gates. By way example, the transistor type memory cells may be multi-gate field effect transistors (MuGFET) or fully surrounded gate field effect transistors.

In an embodiment of the invention, each charge trapping memory cell includes a charge trapping layer structure. The charge trapping layer structure includes a dielectric layer stack including one or at least two dielectric layers being formed above one another, wherein charge carriers can be trapped in at least one of the at least two dielectric layers. By way of example, the charge trapping layer structure includes a charge trapping layer, which may include or consist of one or more materials being selected from a group of materials that consists of: aluminum oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In one embodiment of the invention, the charge trapping layer structure includes a dielectric layer stack including three dielectric layers being formed above one another, e.g., a first oxide layer (e.g., silicon oxide), a nitride layer as charge trapping layer (e.g., silicon nitride) on the first oxide layer, and a second oxide layer (e.g., silicon oxide or aluminium oxide) on the nitride layer. This type of dielectric layer stack is also referred to as ONO layer stack. In an alternative embodiment of the invention, the charge trapping layer structure includes two, four or even more dielectric layers being formed above one another.

As described above, the computing system 100 may include a non-volatile memory cell device such as, e.g., a NAND Flash memory cell device.

To enable a further shrink of a NAND array to below 50 nm half-pitch and to improve performance of the memory cell device and therewith, of the computing system 100, a shared bit line approach to the layout is provided in accordance with embodiments of the invention. Local switches that fit into the array pitch and that switch the signal from a 4F (wherein F designates a minimum feature size of the manufacturing process used) to a 2F pitch are also provided in an embodiment of the invention, as will be outlined below. The minimum feature size of the manufacturing process used is one example of a predetefined feature size of the manufacturing process used. Processes will be described to integrate such switches and to improve, e.g., their transistor performance in addition to the pitch relaxed bit line contacts.

In a conventional floating gate NAND Flash memory device, local switching for buried bit lines or source/drain regions in a shared bit line structure may be provided by select lines for various sorts of memories. The conventional local switching structure usually shows, e.g., the following characteristics:

Depletion mode transistors are usually formed out of enhancement mode transistors.

These depletion mode transistors are usually made by an additional channel implant of the source/drain type of doping into the active areas.

Implanted transistors usually have a lower, i.e., a negative threshold voltage $V_t$ but still have a high transistor channel resistance.

These depletion mode transistors usually contribute significantly to the series resistance of the buried bit lines.

FIG. 2 shows a top view of an integrated circuit including a switch structure 200, e.g. a local switch structure 200, in accordance with an embodiment of the invention.

The switch structure 200 includes a plurality of adjacent electrically conductive lines 202 which are respectively coupled to a plurality of memory cells (not shown in FIG. 2). The memory cells may be of any type, e.g., of a type as described above. The electrically conductive lines 202 may be bit lines, e.g., buried bit lines.

As shown in FIG. 2, the switch structure 200 further includes a plurality of select lines to select a respective electrically conductive line 202. In an embodiment of the invention, two select lines, e.g., a first select line 204 and a second select line 206, are provided crossing all of the plurality of electrically conductive lines 202.

The switch structure 200 further may include a plurality of contacts 208, wherein each contact 208 is provided to electrically contact two respective electrically conductive lines 202, e.g., with another electrically conductive structure (e.g., metallically conductive structure) which may be provided in another manufacturing plane (e.g., in metallization plane) above or below the switch structure 200 in an integrated circuit.

The switch structure 200 further may include a plurality of switching elements which are arranged at each of the crossing points of a respective electrically conductive line 202 and a respective select line 204, 206. In an embodiment of the invention, the switching elements may be of different types, e.g., a normally-on switching element 210 or a normally-off switching element 212. In an embodiment of the invention. The switching elements 210, 212 may be implemented as transistors, e.g., as field effect transistors, e.g., as metal-oxide-semiconductor (MOS) field effect transistors, e.g., as complementary metal-oxide-semiconductor (CMOS) field effect transistors. In an embodiment of the invention, the normally-on switching element 210 may be implemented by a field effect transistor having a threshold voltage ($V_t$) smaller than 0 V ($V_t<0$ V), and the normally-off switching element 212 may be implemented by a field effect transistor having a threshold voltage ($V_t$) greater than 0 V ($V_t>0$ V). In an embodiment of the invention, the normally-on switching element 210 may be formed by a semiconductor body structure being heavily doped with doping atoms, thereby forming an electically conductive line structure within the semiconductor body structure below the respective crossing points.

In an embodiment of the invention, at least two respective adjacent switching elements in the switch structure 200 are of the same type. In an embodiment of the invention, at least two respective adjacent switching elements in the switch structure 200 are normally-off switching elements 212. In an embodiment of the invention, on both sides of the at least two normally-off switching elements 212 along a respective select line 204, 206, there are provided at least two normally-on switching elements 210. At least two normally-off switching elements 212 are arranged adjacent to space each group of the normally-off switching elements 212 along a respective select line 204, 206. In an embodiment of the invention, at least some of the adjacent switching elements of the same type are coupled with each other. In an embodiment of the invention, the metallically conductive structures of respective adjacent switching elements may be electrically coupled (e.g., by means of an ohmic coupling) with each other. The (e.g., lateral) electrical coupling (in the current flow direction along the respective select line) of normally-off switching elements 212 are symbolized in FIG. 2 by means of a coupling block 214. Coupled with the respective electrically conductive lines 202 but with the respective other select line, switching elements of the other type are provided. In an embodiment of the invention, two adjacent electrically coupled normally-off switching elements 212 are coupled with the first select line 204 and in vertical direction (seen in FIG. 2) adjacent switching element coupled with the second select line 206, two normally-on transistors are provided. Thus, a two times two local switching matrix (a switching matrix is one example of a switching field) may be provided for each adjacent two electrically conductive lines 202.

In an embodiment of the invention, a first group of a plurality of switching elements includes a plurality (e.g., two) of adjacent switching elements which are coupled with each other, wherein a first switching element of the adjacent switching elements is coupled to a first contact of first memory cells and a second switching element of the adjacent switching elements is coupled to a second contact of second memory cells. The first switching element and the second switching element may be of a first type of switching element (e.g., a normally-off switching element). Furthermore, a third group of a plurality of switching elements includes a plurality (e.g., two) of adjacent switching elements which are coupled with each other, wherein a fifth switching element of the adjacent switching elements is coupled to a fifth contact of fifth memory cells and a sixth switching element of the adjacent switching elements is coupled to a sixth contact of sixth memory cells. The fifth switching element and the sixth switching element may be of the first type of switching element (e.g., a normally-off switching element). A second group of a plurality of switching elements may be arranged between the first group of a plurality of switching elements and the third group of a plurality of switching elements, wherein a plurality (e.g., two) adjacent switching elements are coupled with each other, wherein a third switching element of the adjacent switching elements is coupled to a third contact of third memory cells and a fourth switching element of the two adjacent switching elements is coupled to a fourth contact of fourth memory cells, wherein the third switching element and the fourth switching element are of a second type of switching element, which is different from the first type of switching element (e.g., a normally-on switching element).

In other words, along a respective select line, there are provided alternating groups of a plurality of switching elements, wherein the switching elements within each group of a plurality of switching elements are of the same type and wherein the switching elements of adjacent groups of a plurality of switching elements are of a different type.

One effect of this arrangement can be seen in an increase of the pitch of the switching elements, since a plurality of adjacent switching elements may be coupled with each other and may be formed with relaxed feature size. Further, the coupling capacities of adjacent switching elements is reduced. In an embodiment of the invention, in which respective two normally-off switching elements are of the same type and are coupled with each other, the pitch may be increased by a factor of two.

FIG. 3 shows a top view of an integrated circuit including a switch structure 300 in accordance with another embodiment of the invention.

In addition to the elements provided in the switch structure 200 of FIG. 2, the switch structure 300 of FIG. 3 includes at least one additional select line (in alternative embodiments, a plurality of additional select lines may be provided, e.g., two, three, four, five, . . . ), e.g., a third select line 302.

In this embodiment, along a respective select line, a respective group of two switching elements of the same type is provided with respect to other groups of switching elements in each case of the other type. In an embodiment of the invention, two normally-off switching elements 212 are provided with the first select line 204, whereas four normally-on switching elements 210 are provided next to the two normally-off switching elements 212 on both sides of the two normally-off switching elements 212 along the first select line 204. Thus, in an embodiment of the invention, two adjacent electrically coupled normally-off switching elements 212 are coupled with the first select line 204 and the in vertical direction (seen in FIG. 3) adjacent switching elements are coupled with the second select line 206 and with a third select line 302, two normally-on transistors 210 are provided, respectively. The normally-off transistors 212 that are coupled to the same contacts 208 are arranged along the select lines 204, 206, 302 such that exactly one normally-off transistor 212 is provided on each of the select lines 204, 206, 302. Furthermore, additional contacts 216 are provided to contact the normally-off switching elements 212 that are positioned blow the crossing points of a respective electrically conductive line 202 and the second select line 206. Thus, a three times three local switching matrix may be provided for each adjacent three electrically conductive lines 202.

FIG. 4 shows a top view (e.g., in the form of a basic layout) of a portion of a NAND Flash memory device 400 in accordance with an embodiment of the invention In an embodiment of the invention, the NAND Flash memory device 400 is a floating gate NAND Flash memory device 400 (including floating gate memory cells), although other types of NAND Flash memory devices 400 may be provided in an alternative embodiment of the invention such as, e.g., a charge trapping NAND Flash memory device (including charge trapping memory cells).

As shown in FIG. 4, the floating gate NAND Flash memory device 400 includes a plurality of NAND memory cell strings 402, 404, 406, 408, 410, 412, 414, 416, of straight active areas between STI isolations 418, 420, 422, 424, 426, 428, 430 typically filled with oxide as well as word lines and select gates that cross these active areas and form respective memory cells and select gates, e.g., in the form of transistors, e.g., in the form of metal-oxide-semiconductor (MOS) transistors, e.g., in the form of field effect transistors. In FIG. 4, the word lines are desgnated with $WL_n$ 432, $WL_{n-1}$ 434, $WL_{n-2}$ 436, $WL_{n-3}$ 438, . . . . Each NAND memory cell string 402, 404, 406, 408, 410, 412, 414, 416, includes a plurality of serially source-to-drain coupled floating gate memory cells. The serial coupling of the serially source-to-drain coupled floating gate memory cells is provided by means of so called buried bit lines or source/drain regions (e.g., heavily doped silicon regions).

In order to control the memory cells (e.g., to carry out write operations, e.g., programming operations or erase operations, and read operations) of each of the NAND memory cell strings 402, 404, 406, 408, 410, 412, 414, 416, respective bit line contacts 440, 442, 444, 446, are provided, wherein one bit line contact is provided for a plurality of NAND memory cell strings (e.g., for two adjacent NAND memory cell strings) of the plurality of NAND memory cell strings 402, 404, 406, 408, 410, 412, 414, 416. In an embodiment of the invention, the bit line contact pitch between the bit line contacts 440, 442, 444, 446, is 4 F (i.e., four times the minimum feature size of the respectively used manufacturing process).

Furthermore, a bit line select line (not shown) is provided between the bit line contacts 440, 442, 444, 446, and the first word line $WL_n$ 432 of the plurality of word lines $WL_n$ 432, $WL_{n-1}$ 434, $WL_{n-2}$ 436, $WL_{n-3}$ 438, . . . . A source select line (not shown) is provided opposite to the bit line select line with respect to the plurality of word lines $WL_n$ 432, $WL_{n-1}$ 434, $WL_{n-2}$ 436, $WL_{n-3}$ 438, . . . . Next to the source select line, a source line (not shown) may be provided, which is coupled to a fixed reference potential, e.g., to the ground potential.

Furthermore, the floating gate NAND Flash memory device 400 includes a plurality of switching elements, e.g., switching elements as described above with reference to FIG. 2, and a plurality of switching elements select lines (e.g., bit line select lines), e.g., a first switching elements select line 448 and a second switching elements select line 450. The plurality of switching elements include normally-off switching elements, also referred to as select switches (e.g., in the form of pairs of enhancement mode transistors that can open the channels of adjacent memory cell strings of the NAND memory cell strings 402, 404, 406, 408, 410, 412, 414, 416). In other words, in an embodiment, two select switches are provided next to each other along a respective switching elements select line 448, 450 to thereby enable addressing a respective NAND memory cell string. Furthermore, a respective first switching elements select line 448 electrically coupled to a pair of select switches is electrically coupled to a first bit line contact of the bit line contacts 440, 442, 444, 446 and the respective second switching elements select line 450 electrically coupled to the pair of select switches is electrically coupled to a second bit line contact of the bit line contacts 440, 442, 444, 446, wherein the first bit line contact and the second bit line contact are electrically isolated from each other. Thus, illustratively, each bit line contact is laterally dislocated or shifted by one memory cell string with respect to a select switch pair including a respective first select switch (including a first normally-off transistor, for example) and second select switch (including a second normally-off transistor, for example), which may be electrically coupled with each other. Each select switch pair is denoted in FIG. 4 with reference numeral 452.

In an embodiment of the invention, the first switching elements select line 448 and a second switching elements select line 450 are metal select lines that interconnect lines of switches, i.e., respective pairs of select switches assigned to a respective switching elements select line 448, 450.

In accordance with embodiments of the invention, the transistors below the word lines are configured as memory cells that can store one or more bits per memory cell. The memory cell strings are addressed from the bit lines through contacts. The memory cell strings are tied together by a common source line via a source select line. A single select gate line acts as a local switch to connect a particular bit line with the corresponding NAND memory cell string.

Figure 5:
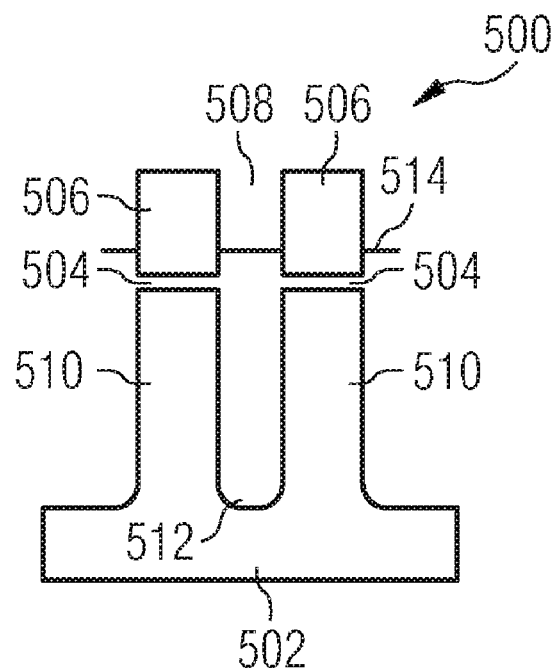
FIG. 5 shows a cross sectional view of a portion of a NAND Flash memory device along the cross section line B-B' of FIG. 4 at a first stage of its manufacture in accordance with an embodiment of the invention.

FIG. 5 shows a cross sectional view 500 of a portion of a NAND Flash memory device along the cross section line B-B' of FIG. 4 at a first stage of a first method for manufacturing the NAND Flash memory device in accordance with an embodiment of the invention.

The process starts with forming a layer stack of a so called tunnel dielectric layer 504, a floating gate material layer, and a hardmask combination, as will be described in more detail below.

At first, a substrate 502 is provided. The substrate 502 may be a wafer substrate 502. The wafer substrate 502 may be made of semiconductor material, although in another embodiment of the invention, other suitable materials can also be used, e.g., polymers. In an embodiment of the invention, the wafer substrate 502 is made of silicon (doped or undoped), in an alternative embodiment of the invention, the wafer substrate 502 is a silicon on insulator (SOI) wafer. As an alternative, any other suitable semiconductor materials can be used for the wafer substrate 502, for example, semiconductor compound material such as gallium arsenide (GaAs), indium phosphide (InP), but also any suitable ternary semiconductor compound material or quaternary semiconductor compound material such as indium gallium arsenide (InGaAs).

Then, a tunnel dielectric layer 504 is grown or deposited on or above the upper surface of the substrate 502, e.g., by means of a chemical vapor deposition (CVD) process or by means of a physical vapor deposition (PVD) process or by means of a thermal oxidation process. The tunnel dielectric layer 504 may have a layer thickness of at least 6 nm, for example, 6 nm to 120 nm or greater. In a specific embodiment, the tunnel dielectric layer 504 may be formed from an ONO triple dielectric layer stack, for example, and more particularly, a material which is substantially "trapless", such as, e.g., silicon oxide ($SiO_2$), trapless nitride, hafnium silicate, aluminum oxide ($Al_2O_3$), aluminates (e.g., $AlHfO_x$), or double-layer or triple-layer stacks like $SiO_2/Si_3N_4/SiO_2$.

Then, a floating gate material layer is provided which serves to form the floating gate regions 506 of the floating gate transistors to be formed. In general, any suitable electrically conductive material may be used for the floating gate material layer. In an embodiment of the invention, one or more of the following materials may be used for the floating gate material layer: poly-Si, TaN, W, WN, TiN, and the like.

After having formed the floating gate material layer, an auxiliary mask is deposited on the upper surface of the floating gate material layer. The auxiliary mask may be a photo resist layer and/or a hardmask layer (including silicon nitride, silicon oxide or carbon, for example). In embodiment of the invention, a hardmask layer is provided on or above the upper surface of the floating gate material layer and a photo resist layer is deposited on or above the upper surface of the hardmask layer.

Then, using a lithography process, active areas of the NAND memory cell strings 402, 404, 406, 408, 410, 412, 414, 416, to be formed are defined and patterned.

Then, using the auxiliary mask, in accordance with the previous lithography process, material between the active areas of the NAND memory cell strings 402, 404, 406, 408, 410, 412, 414, 416, to be formed is removed, e.g., by means of an anisotropic etching, e.g., by means of an anisotropic dry etching, e.g., by means of reactive ion etching (RIE), to form isolation trenches 508 between active areas 510.

Then, the resulting structure is filled with an isolation fill material 512 (e.g., a dielectric material such as silicon oxide or silicon nitride) and the isolation fill material is etched back down to a level 514 that is below the upper surface of the floating gate material layer but above the upper surface of the tunnel dielectric layer 504. Then, the auxiliary mask (e.g., the hardmask layer) is removed. The resulting structure 500 is shown in FIG. 5.

Figure 6:
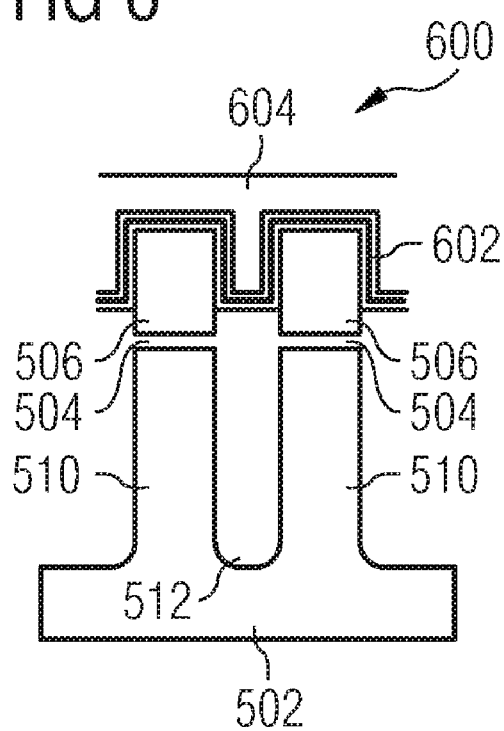
FIG. 6 shows a cross sectional view of a portion of a NAND Flash memory device along the cross section line B-B' of FIG. 4 at a second stage of its manufacture in accordance with an embodiment of the invention.

FIG. 6 shows a cross sectional view 600 of a portion of a NAND Flash memory device along the cross section line B-B' of FIG. 4 at a second stage of its manufacture in accordance with an embodiment of the invention.

In an embodiment of the invention, then, a coupling dielectric layer 602 and a first control gate layer 604 (e.g., made of poly-Si, alternatively, made of Ti, TaN, WN, W, Cu, or of any other suitable electrically conductive material) are deposited on the upper surface of the structure 500 shown in FIG. 5 (e.g., by means of a CVD process or a PVD process). The resulting structure 600 is shown in FIG. 6.

FIG. 7 shows a top view 700 of a portion of a NAND Flash memory device of FIG. 4 at a third stage of its manufacture in accordance with an embodiment of the invention.

Then, a lithography process step is carried out to pattern open areas (OA) 702, where the first control gate layer 604 and the coupling dielectric layer 602 are to be etched away to allow for electrically conductive connection with subsequently formed word line layers (which are to be deposited next).

It should be mentioned that the word line mask contour of the layout is not in place yet at this process stage, FIG. 7 is used to illustrate the location of the OA openings 702.

FIG. 8 shows a cross sectional view 800 of a portion of a NAND Flash memory device along the cross section line B-B' of FIG. 4 at a fourth stage of its manufacture in accordance with an embodiment of the invention. Furthermore, FIG. 9 shows a cross sectional view 900 of a portion of a NAND Flash memory device along the cross section line A-A' of FIG. 4 at a fourth stage of its manufacture in accordance with an embodiment of the invention.

Then, optionally, one or more additional control gate layers (also referred to as word line layers) 802 are deposited, e.g., made of poly-Si, of a metal such as, e.g., Ti, TaN, WN, W, Cu, or of any other suitable electrically conductive material) on the upper surface of the structure 600 of FIG. 6. Next, an auxiliary mask 804 is deposited on or above the one or more additional control gate layers 802.

Then, a lithography process is applied to pattern the word lines and the select lines. Next, using the auxiliary mask 804, in accordance with the previous lithography process, material between the word lines and the select lines to be formed is removed, e.g., by means of an anisotropic etching, e.g., by means of an anisotropic dry etching, e.g., by means of reactive ion etching (RIE) to form trenches 902 between the word lines and the select lines to be formed. In this manner, regions of the upper surface of the tunnel dielectric layer 504 are exposed, below which source/drain regions are to be formed.

Subsequently, source/drain regions 904 (also referred to as source/drain junctions) along NAND memory cell strings are formed, e.g., by means of ion implantation. Optionally, spacer and/or liner combinations may be additionally provided to tailor the transistor source/drain junctions (not shown).

The resulting structure 800, 900 is shown in FIG. 8 and FIG. 9.

Figure 10:
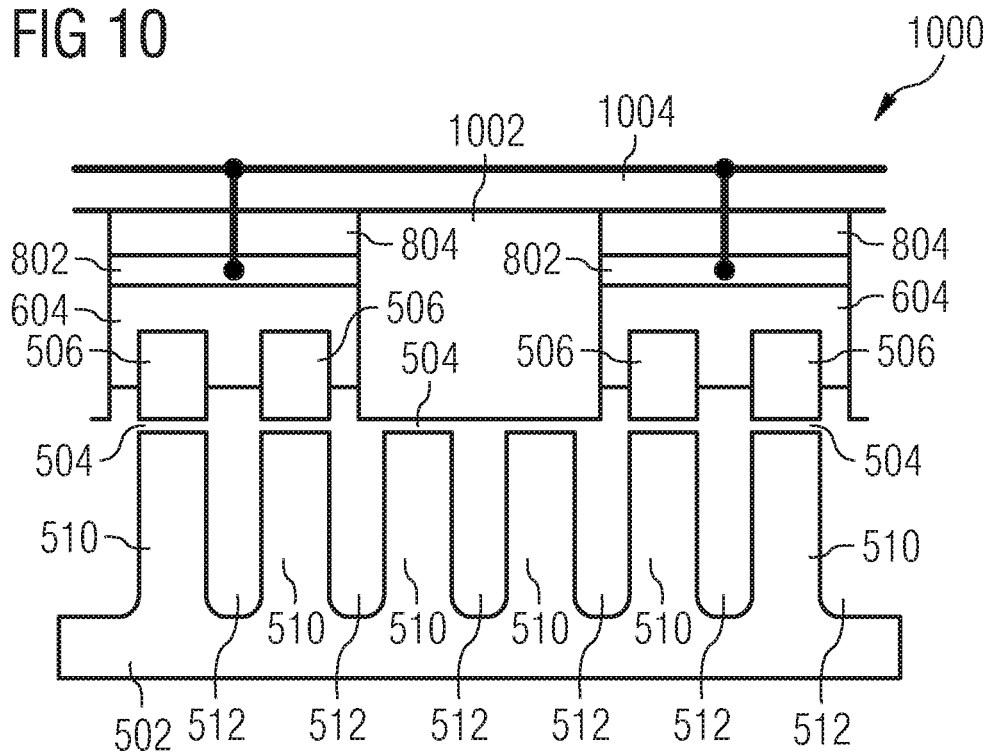
FIG. 10 shows a cross sectional view of a portion of a NAND Flash memory device along the cross section line B-B' of FIG. 4 at a fifth stage of its manufacture in accordance with an embodiment of the invention.

FIG. 10 shows a cross sectional view 1000 of a portion of a NAND Flash memory device along the cross section line B-B' of FIG. 4 at a fifth stage of its manufacture in accordance with an embodiment of the invention. Furthermore, FIG. 11 shows a cross sectional view 1100 of a portion of a NAND Flash memory device along the cross section line A-A' of FIG. 4 at the fifth stage of its manufacture in accordance with an embodiment of the invention.

Figure 11:
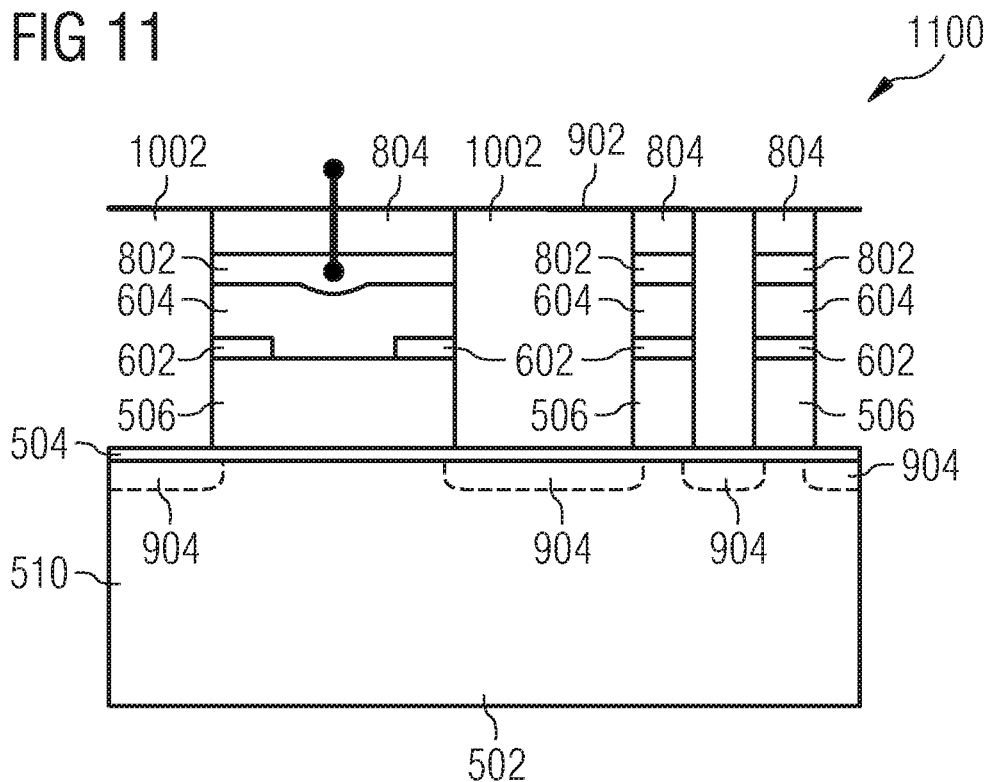
FIG. 11 shows a cross sectional view of a portion of a NAND Flash memory device along the cross section line A-A' of FIG. 4 at a fifth stage of its manufacture in accordance with an embodiment of the invention.

As shown in FIG. 10 and FIG. 11, interlayer dielectrics 1002 such as e.g. High-Density Plasma (HDP) oxide is deposited on the structure 800, 900 of FIG. 8 and FIG. 9, followed by a planarization process such as, e.g., a chemical mechanical polishing (CMP) process. Thus, the trenches 902 are filled with the HPD oxide.

Next, an appropriate kind of metallization is applied to interconnect and address the groups of switches (e.g., the switching elements, e.g., the normally-off switching elements, as described above). In an embodiment of the invention, metal conductor tracks 1004 made of, e.g., a metal such as, e.g., copper (Cu) or aluminum (Al) are deposited forming the metallization.

Figure 12:
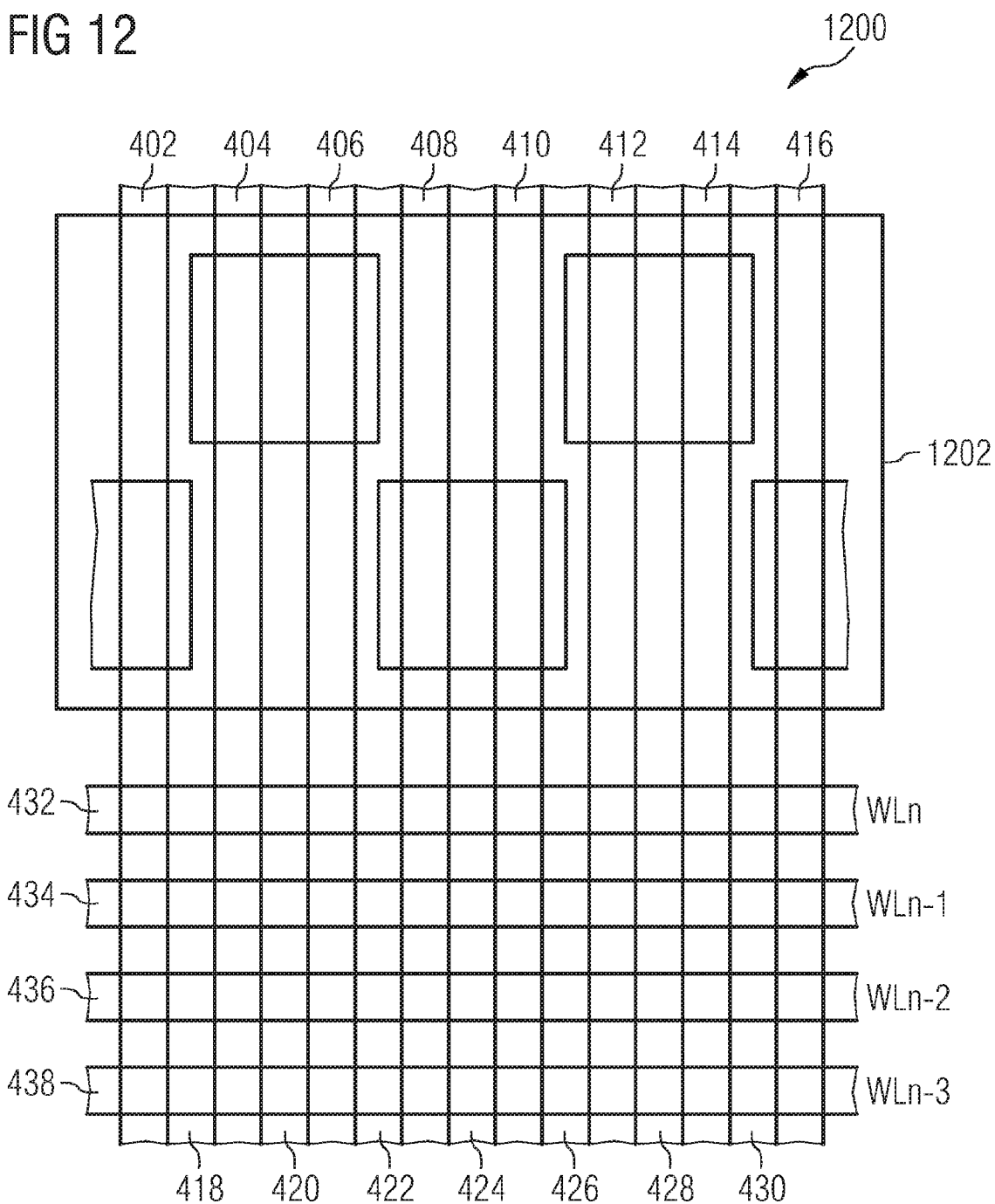
FIG. 12 shows a top view of a portion of a NAND Flash memory device of FIG. 4 at a sixth stage of its manufacture in accordance with an embodiment of the invention.

FIG. 12 shows a top view 1200 of a portion of a NAND Flash memory device of FIG. 4 at a sixth stage of its manufacture in accordance with an embodiment of the invention.

Using a metal mask 1202 (e.g., using a hardmask), and using a lithography process, the switching elements and the interlayer dielectric 1002 are patterned. Then, using the metal mask 1202 in accordance with the previous lithography process, material between the metallization 1004 is removed, e.g., by means of an anisotropic etching, e.g., by means of an anisotropic dry etching, e.g., by means of reactive ion etching (RIE) to form trenches between the metallization 1004. In an embodiment of the invention, the applied anisotropic etching has same etching rate for both the switch mask and the interlayer dielectric 1002 (e.g., the HDP fill) to make the trench for the metallization 1002.

Figure 13:
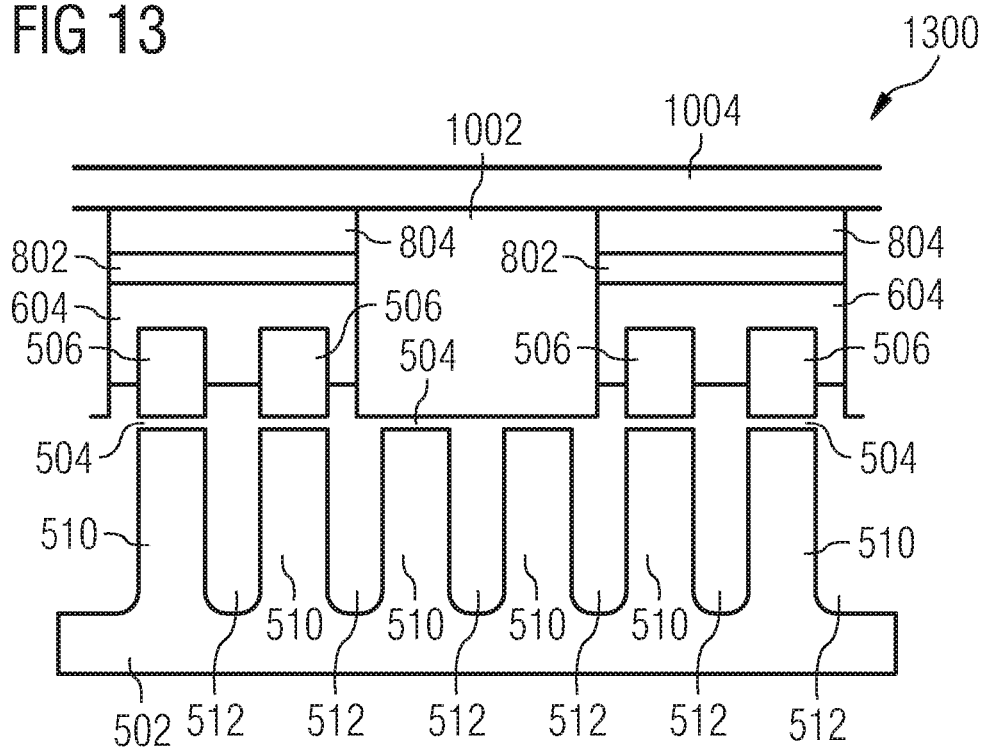
FIG. 13 shows a cross sectional view of a portion of a NAND Flash memory device along the cross section line B-B' of FIG. 4 at a seventh stage of its manufacture in accordance with an embodiment of the invention.

FIG. 13 shows a cross sectional view 1300 of a portion of a NAND Flash memory device along the cross section line B-B' of FIG. 4 at a seventh stage of its manufacture in accordance with an embodiment of the invention. Furthermore, FIG. 14 shows a cross sectional view 1400 of a portion of a NAND Flash memory device along the cross section line A-A' of FIG. 4 at the seventh stage of its manufacture in accordance with an embodiment of the invention.

Figure 14:
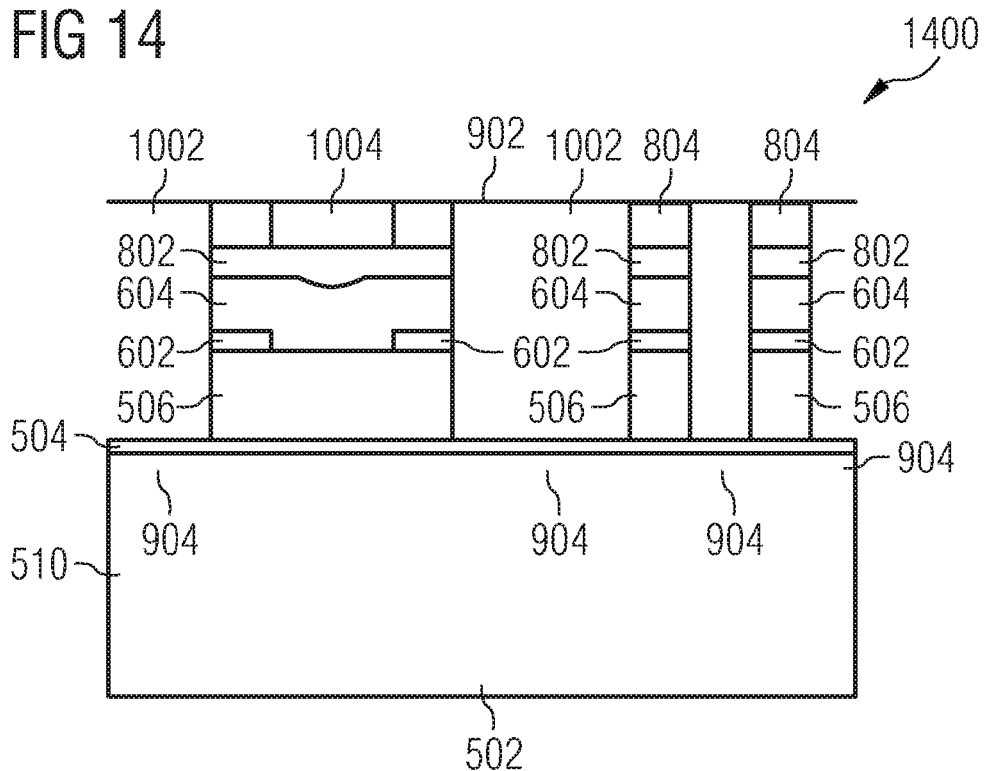
FIG. 14 shows a cross sectional view of a portion of a NAND Flash memory device along the cross section line A-A' of FIG. 4 at a seventh stage of its manufacture in accordance with an embodiment of the invention.

As shown in FIG. 13 and FIG. 14, a metal layer is deposited forming the metallization 1004, followed by a CMP process. In an embodiment of the invention, a plurality of metal layers may be provided for the metallization 1004. One or more of the metals selected of a group of metals consisting of Ti, TiN, W, may be used for the metallization 1004 (in an embodiment, a layer stack Ti/TiN/W may be provided forming the metallization 1004).

Figure 15:
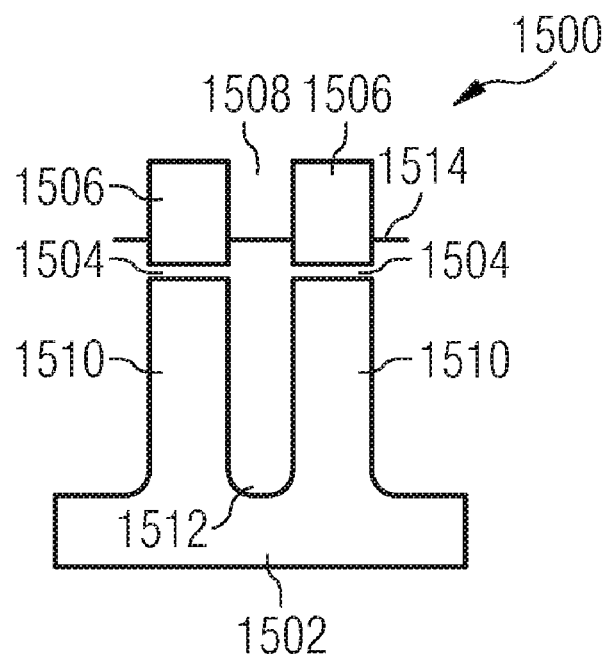
FIG. 15 shows a cross sectional view of a portion of a NAND Flash memory device along the cross section line B-B' of FIG. 4 at a first stage of its manufacture in accordance with another embodiment of the invention.

FIG. 15 shows a cross sectional view 1500 of a portion of a NAND Flash memory device along the cross section line B-B' of FIG. 4 at a first stage of a first method for manufacturing the NAND Flash memory device in accordance with another embodiment of the invention.

The process starts with forming a layer stack of a so called tunnel dielectric layer 1504, a floating gate material layer, and a hardmask combination, as will be described in more detail below.

At first, a substrate 1502 is provided. The substrate 1502 may be a wafer substrate 1502. The wafer substrate 1502 may be made of semiconductor material, although in another embodiment of the invention, other suitable materials can also be used, e.g., polymers. In an embodiment of the invention, the wafer substrate 1502 is made of silicon (doped or undoped), in an alternative embodiment of the invention, the wafer substrate 1502 is a silicon on insulator (SOI) wafer. As an alternative, any other suitable semiconductor materials can be used for the wafer substrate 1502, for example, semiconductor compound material such as gallium arsenide (GaAs), indium phosphide (InP), but also any suitable ternary semiconductor compound material or quaternary semiconductor compound material such as indium gallium arsenide (InGaAs).

Then, a tunnel dielectric layer 1504 is deposited on the upper surface of the substrate 1502, e.g., by means of a chemical vapor deposition (CVD) process or by means of a physical vapor deposition (PVD) process or by means of a thermal oxidation process. The tunnel dielectric layer 1504 may have a layer thickness of at least 6 nm, for example, 6 nm to 120 nm or greater. In a specific embodiment, the tunnel dielectric layer 1504 may be formed from an ONO triple dielectric layer stack, for example, and more particularly, a material which is substantially "trapless", such as, e.g., silicon oxide ($SiO_2$), trapless nitride, hafnium Silicate, aluminum oxide ($Al_2O_3$), aluminates (e.g., $AlHfO_x$), or doublelayer or triple-layer stacks like $SiO_2/Si_3N_4/SiO_2$.

Then, a floating gate material layer is provided which serves to form the floating gate regions 1506 of the floating gate transistors to be formed. In general, any suitable electrically conductive material may be used for the floating gate material layer. In an embodiment of the invention, one or more of the following materials may be used for the floating gate material layer: poly-Si, TaN, W, WN, TiN, and the like.

After having formed the floating gate material layer, an auxiliary mask is deposited on or above the upper surface of the floating gate material layer. The auxiliary mask may be a photo resist layer and/or a hardmask layer including silicon nitride or carbon, for example. In an embodiment of the invention, a hardmask layer is provided on or above the upper surface of the floating gate material layer and a photo resist layer is deposited on or above the upper surface of the hardmask layer.

Then, using a lithography process step, active areas of the NAND memory cell strings 402, 404, 406, 408, 410, 412, 414, 416, to be formed are defined and patterned.

Then, using the auxiliary mask, in accordance with the previous lithography process, material between the active areas of the NAND memory cell strings 402, 404, 406, 408, 410, 412, 414, 416, to be formed is removed, e.g., by means of an anisotropic etching, e.g., by means of an anisotropic dry etching, e.g., by means of reactive ion etching (RIE) to form isolation trenches 1508 between active areas 1510.

Then, the structure is filled with an isolation fill material 1512 (e.g., a dielectric material such as silicon oxide or silicon nitride) and the isolation fill material is etched back down to a level 1514 that is below the upper surface of the floating gate material layer but above the upper surface of the tunnel dielectric layer 1504. Then, the auxiliary mask (e.g., the hardmask layer) is removed. The resulting structure 1500 is shown in FIG. 15.

The process according to this embodiment of the invention uses a coupling dielectric to control gate material selectivity in later process stages to allow for larger misalignment tolerance in word line level patterning, as will be described in more detail below.

Figure 16:
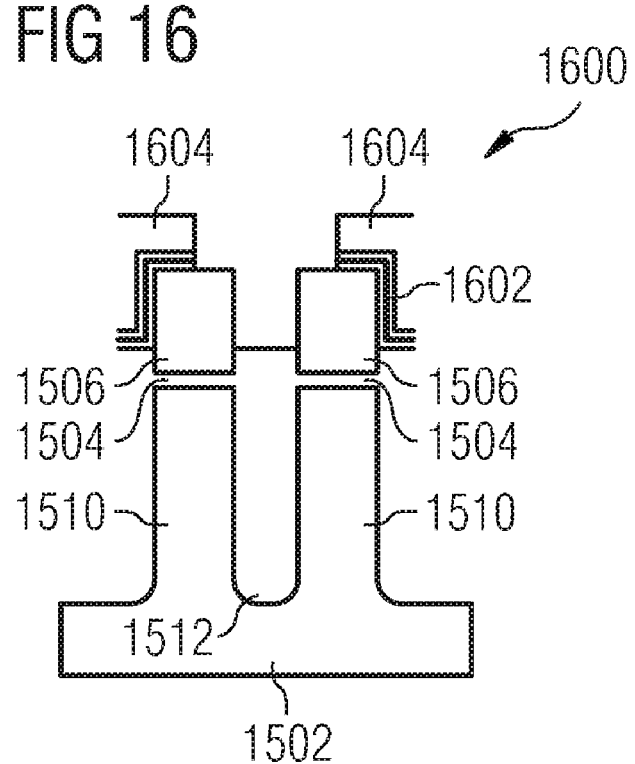
FIG. 16 shows a cross sectional view of a portion of a NAND Flash memory device along the cross section line B-B' of FIG. 4 at a second stage of its manufacture in accordance with another embodiment of the invention.

FIG. 16 shows a cross sectional view 1600 of a portion of a NAND Flash memory device along the cross section line B-B' of FIG. 4 at a second stage of its manufacture in accordance with an embodiment of the invention.

In an embodiment of the invention, then, a coupling dielectric layer 1602 and a first control gate layer 1604 (e.g., made of poly-Si, alternatively, made of Ti, TaN, WN, W, Cu, or of any other suitable electrically conductive material) are deposited on the upper surface of the structure 1500 shown in FIG. 15 (e.g., by means of a CVD process or a PVD process).

Figure 17:
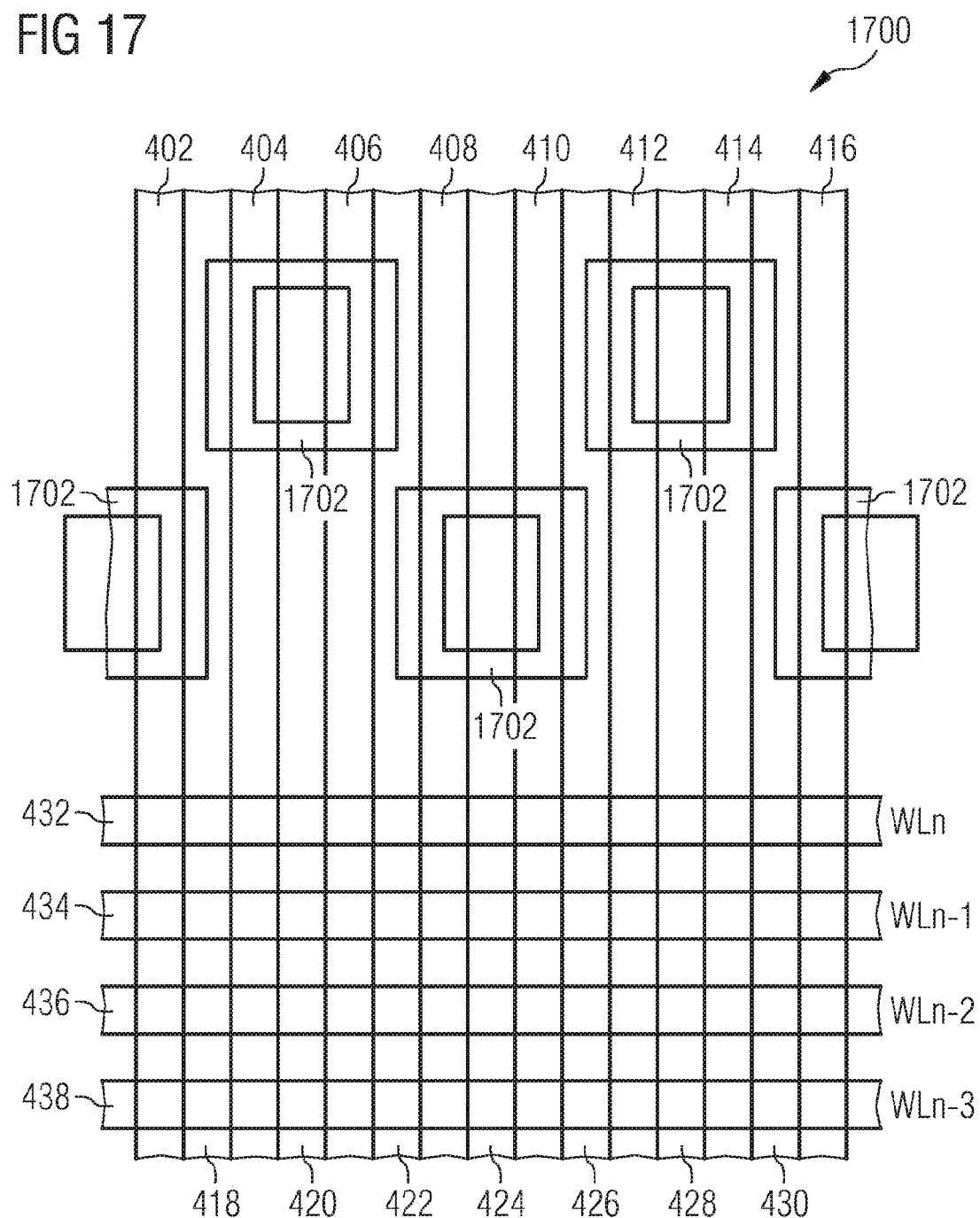
FIG. 17 shows a top view of a portion of a NAND Flash memory device of FIG. 4 at a third stage of its manufacture in accordance with an embodiment of the invention.

FIG. 17 shows a top view 1700 of a portion of a NAND Flash memory device of FIG. 4 at a third stage of its manufacture in accordance with an embodiment of the invention.

Then, a lithography process is carried out to pattern open areas (OA) 1702, where the first control gate layer 1604 and the coupling dielectric layer 1602 are to be etched away to allow for electrically conductive connection with subsequently formed word line layers (which are to be deposited next). As shown in FIG. 16, the regions of the first control gate layer 1604 and the coupling dielectric layer 1602 that are exposed by the open areas 1702 are removed. The resulting structure 1600 is shown in FIG. 16.

It should be mentioned that the word line mask contour of the layout is not in place yet at this process stage, FIG. 17 is used to illustrate the location of the OA openings 1702.

Figure 18:
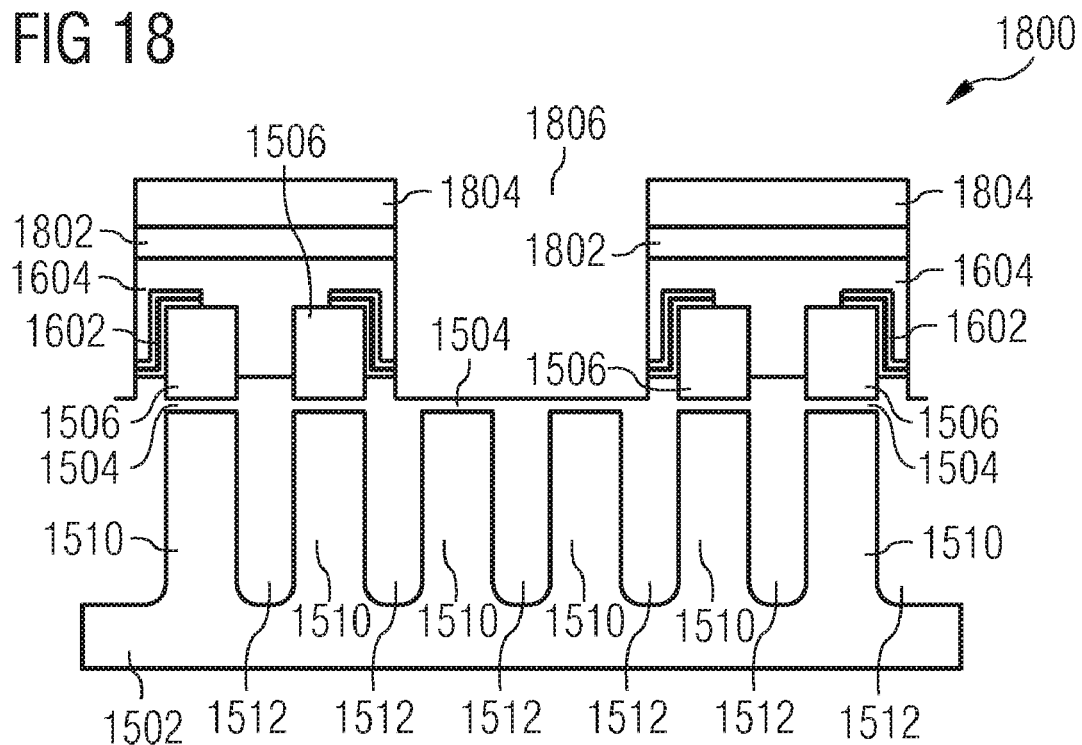
FIG. 18 shows a cross sectional view of a portion of a NAND Flash memory device along the cross section line B-B' of FIG. 4 at a fourth stage of its manufacture in accordance with an embodiment of the invention.
Figure 19:
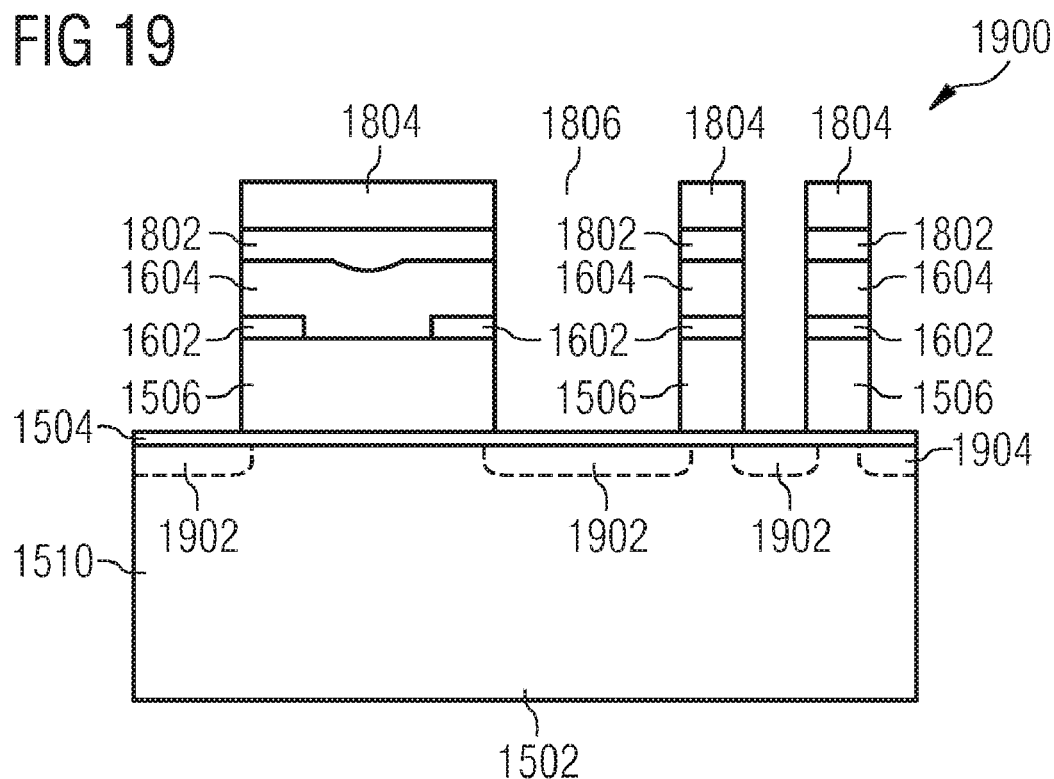
FIG. 19 shows a cross sectional view of a portion of a NAND Flash memory device along the cross section line A-A' of FIG. 4 at a fourth stage of its manufacture in accordance with an embodiment of the invention.

FIG. 18 shows a cross sectional view 1800 of a portion of a NAND Flash memory device along the cross section line B-B' of FIG. 4 at a fourth stage of its manufacture in accordance with an embodiment of the invention. Furthermore, FIG. 19 shows a cross sectional view 1900 of a portion of a NAND Flash memory device along the cross section line A-A' of FIG. 4 at the fourth stage of its manufacture in accordance with an embodiment of the invention.

Then, optionally, one or more additional control gate layers (also referred to as word line layers) 1802 are deposited, e.g., made of poly-Si, or of a metal such as, e.g., Ti, TaN, WN, W, Cu, or of any other suitable electrically conductive material) on or above the upper surface of the structure 1600 of FIG. 16.

Since the regions between the floating gate regions 1506 and a portion of the upper surface of the floating gate regions 1506 are free of the coupling dielectric layer 1602 and the first control gate layer 1604, the one or more additional control gate layers 1802 have direct electrical contact with the floating gate regions 1506. Thus, an improved misalignment tolerance is achieved.

Then, a lithography process is applied to pattern the word lines and the select lines. Next, using an auxiliary mask 1804, in accordance with the previous lithography process, material between the word lines and the select lines to be formed is removed, e.g., by means of an anisotropic etching, e.g., by means of an anisotropic dry etching, e.g., by means of reactive ion etching (RIE) to form trenches 1806 between the word lines and the select lines to be formed. In this manner, regions of the upper surface of the tunnel dielectric layer 1504 are exposed, below which exposed regions source/drain region are to be formed.

Subsequently, source/drain regions 1902 (also referred to as source/drain junctions) along NAND memory cell strings are formed, e.g., by means of ion implantation. Optionally, spacer and/or liner combinations may be additionally provided to tailor the transistor source/drain junctions (not shown).

The resulting structure 1800, 1900 is shown in FIG. 18 and FIG. 19.

The process continues in the same manner as previously described with reference to FIGS. 10 to 14. Therefore, a repeated description of these processes is omitted.

Figure 20:
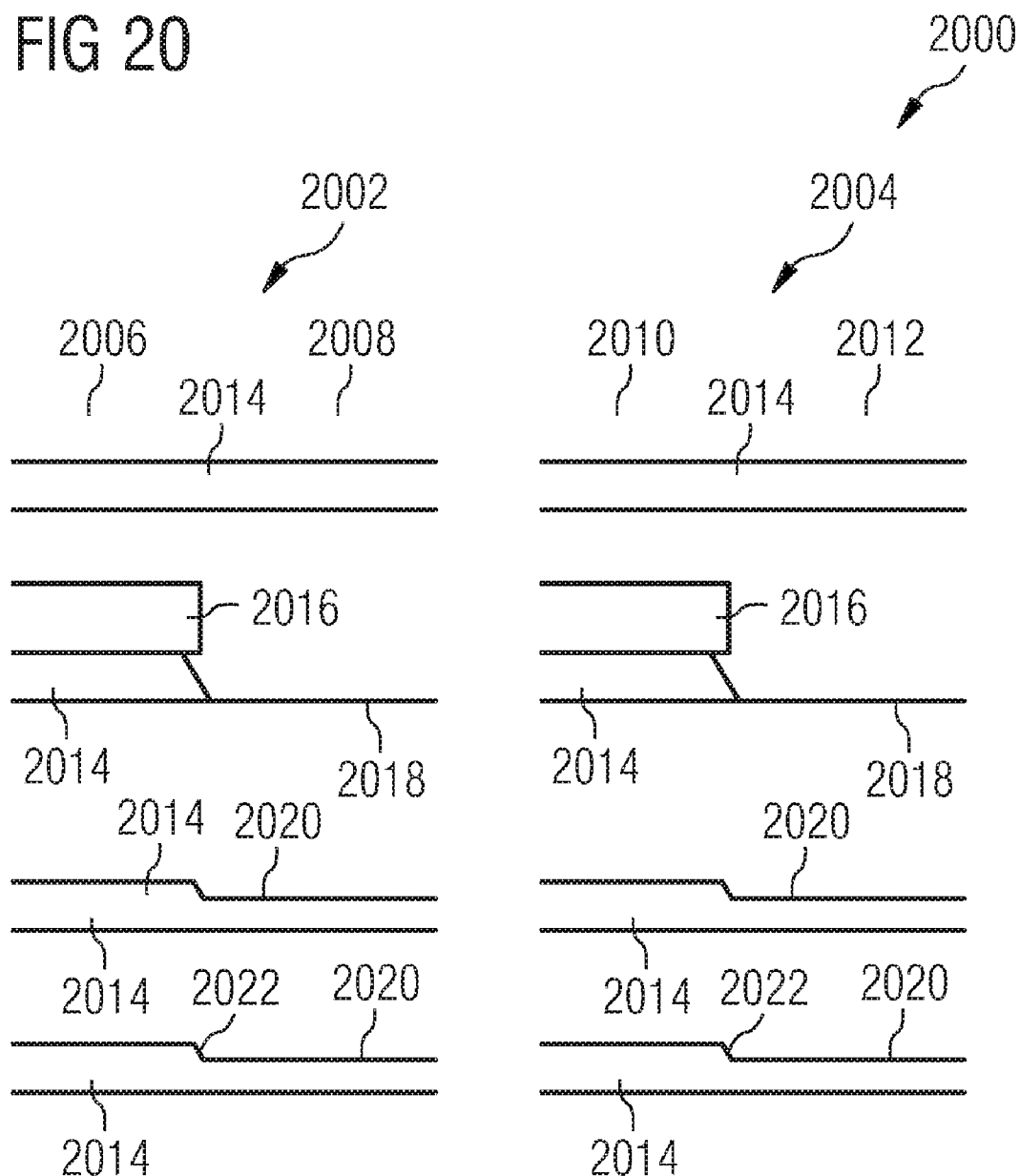
FIG. 20 shows a cross sectional view of portions of a NAND Flash memory device of a periphery area and the NAND Flash memory cell string area at a first stage of its manufacture in accordance with yet another embodiment of the invention.

FIG. 20 shows a cross sectional view 2000 of portions of a NAND Flash memory device of a periphery area 2002 and the NAND Flash memory cell string area 2004 at a first stage of its manufacture in accordance with an embodiment of the invention The process in accordance with this embodiment of the invention addresses the Gate Induced Drain Leakage (GIDL) issue of the select devices. It also takes into account that an overall optimized integration scheme might need different gate dielectrics or at least different thicknesses for low voltage periphery devices, select gates and memory cells. Thus, in an embodiment, the tunnel oxide of the memory cells can be grown thinner, initially, in order to allow for a later-on thickening during the gate reoxidation step.

FIG. 20 shows a medium voltage region 2006 and a low voltage region 2008 in the periphery area 2002, wherein medium voltage devices (medium voltage transistors, for example) may be provided in the medium voltage region 2006 and wherein low voltage devices (low voltage transistors, for example) may be provided in the low voltage region 2008.

FIG. 20 further shows a select device region 2010 and a memory cell region 2012 in the NAND Flash memory cell string area 2004, wherein select devices (for example the switching elements) are provided in the memory cell region 2012 and wherein the memory cells (for example the memory cell transistors, e.g., the floating gate memory cell transistors) are provided in the memory cell region 2012.

In a first process, a gate dielectric layer 2014 is deposited on a substrate (not shown), e.g., a wafer substrate as described above. The gate dielectric layer 2014 is deposited having a thickness in the range of about 3 nm to about 12 nm, e.g., in the range of about 4 nm to about 8 nm, e.g., about 5 nm. In an embodiment of the invention, the gate dielectric layer 2014 is made of a thermally grown oxide, e.g., a thermal silicon oxide.

Then, a lithography process is carried out, followed, e.g., by a wet chemically remove of the gate dielectric layer 2014, e.g., the oxide, from the regions that are uncovered by the used patterned mask 2016 (e.g., photo resist and/or hardmask). In this way, the upper surface 2018 of the substrate is exposed in the low voltage region 2008 in the periphery area 2002 and in the memory cell region 2012 in the NAND Flash memory cell string area 2004.

After having removed the mask 2016, a thin gate oxide layer 2020 (e.g., forming the periphery oxide layer and the memory cell area tunnel oxide layer) is grown, e.g., with a thickness in the range of about 4 nm to about 10 nm, e.g., in the range of about 5 nm to about 8 nm, e.g. about 6 nm. Thus, the thickness of the remaining first gate dielectric layer 2014 is increased to a thickness of about 8 nm.

In this context, it should be mentioned that the tunnel oxide layer only would grow somewhat thicker later-on during the reoxidation process, e.g., to a thickness of about 7 nm (end of process).

In an embodiment of the invention, sidewall oxide 2022 of at least approximately 3 nm (alternatively at least approximately 4 nm or at least approximately 5 nm) is grown to reduce or minimize GIDL of the select devices, e.g., of the select transistors.

Figure 21:
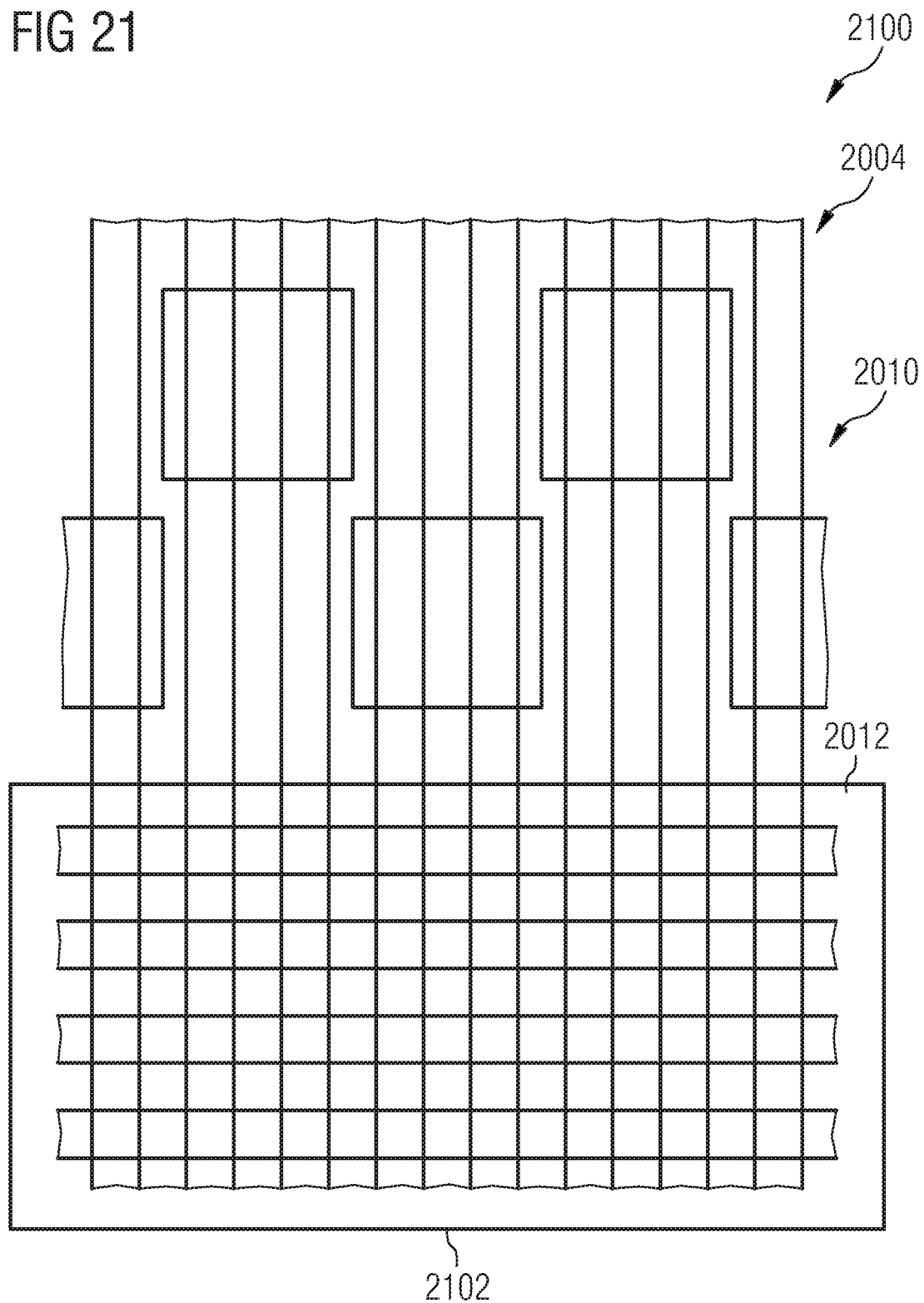
FIG. 21 shows a top view of a portion of a NAND Flash memory device of FIG. 4 at a second stage of its manufacture in accordance with an embodiment of the invention.

FIG. 21 shows a top view 2100 of a portion of a NAND Flash memory device of FIG. 4 at a second stage of its manufacture in accordance with an embodiment of the invention.

The gate dielectric is formed with a thickness, that—at the end of the process—meets the requirements of the select devices, e.g., the select transistors, e.g., with a thickness in the range of about 6 nm to about 10 nm, e.g., of about 8 nm (at the end) thermal oxide.

Furthermore, a lithography process is applied to wet chemically remove, e.g., the gate oxide from the memory cell area 2012 (and, advantageously, low voltage peripheral area 2008 for improved low voltage devices with thinner gate oxide) using a respective mask 2102 to open, e.g., the memory cell area 2012.

The gate oxide is then grown to obtain the desired lower thickness of the memory cell devices; it would gain the final thickness (e.g., in the range of about 7 nm minimal thickness) during gate reoxidation process.

Figure 22:
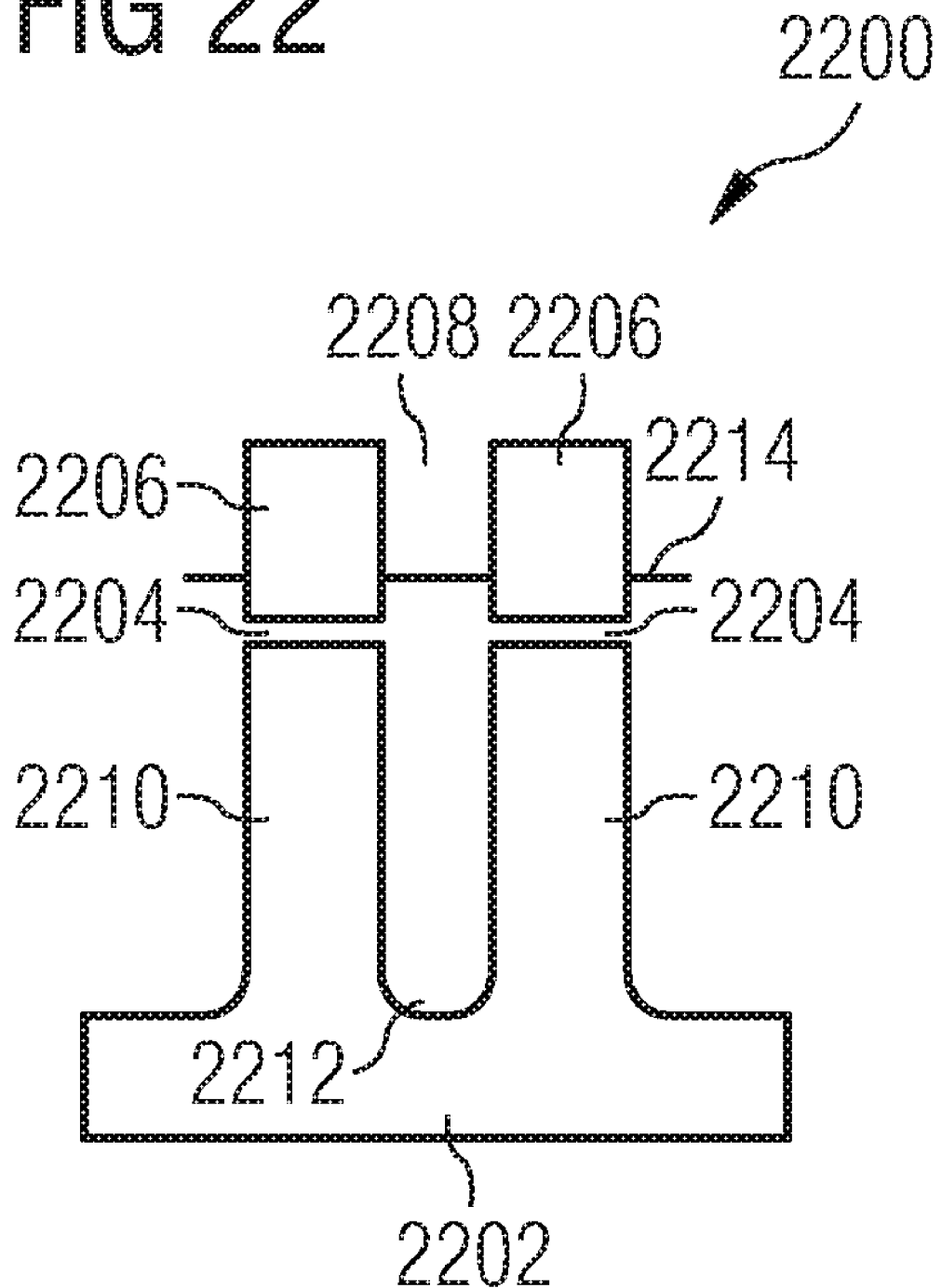
FIG. 22 shows a cross sectional view of a portion of a NAND Flash memory device along the cross section line B-B' of FIG. 4 at a third stage of its manufacture in accordance with another embodiment of the invention.

FIG. 22 shows a cross sectional view 2200 of a portion of a NAND Flash memory device along the cross section line B-B' of FIG. 4 at a third stage of its manufacture in accordance with another embodiment of the invention.

The process starts with forming a layer stack of a tunnel dielectric layer 2204, a floating gate material layer, and a hardmask combination, as will be described in more detail below.

At first, a substrate 2202 is provided. The substrate 2202 may be a wafer substrate 2202. The wafer substrate 2202 may be made of semiconductor material, although in another embodiment of the invention, other suitable materials can also be used, e.g., polymers. In an embodiment of the invention, the wafer substrate 2202 is made of silicon (doped or undoped), in an alternative embodiment of the invention, the wafer substrate 2202 is a silicon on insulator (SOI) wafer. As an alternative, any other suitable semiconductor materials can be used for the wafer substrate 2202, for example, semiconductor compound material such as gallium arsenide (GaAs), indium phosphide (InP), but also any suitable ternary semiconductor compound material or quaternary semiconductor compound material such as indium gallium arsenide (InGaAs).

Then, a tunnel dielectric layer 2204 is deposited on the upper surface of the substrate 2202, e.g., by means of a chemical vapor deposition (CVD) process or by means of a physical vapor deposition (PVD) process or by means of a thermal oxidation process. The tunnel dielectric layer 2204 may have a layer thickness of at least 6 nm, for example, 6 nm to 120 nm or greater. In a specific embodiment, the tunnel dielectric layer 2204 may be formed from an ONO triple dielectric layer stack, and more particularly, a material which is substantially "trapless", such as, e.g., silicon oxide ($SiO_2$), trapless nitride, hafnium silicate, aluminum oxide ($Al_2O_3$), aluminates (e.g., $AlHfO_x$), or double-layer or triple-layer stacks like $SiO_2/Si_3N_4/SiO_2$.

Then, a floating gate material layer is provided which serves to form the floating gate regions 2206 of the floating gate transistors to be formed. In general, any suitable electrically conductive material may be used for the floating gate material layer. In an embodiment of the invention, one or more of the following materials may be used for the floating gate material layer: poly-Si, TaN, W, WN, TiN, and the like.

After having formed the floating gate material layer, an auxiliary mask is deposited on or above the upper surface of the floating gate material layer. The auxiliary mask may be a photo resist layer and/or a hardmask layer including silicon nitride or carbon, for example. In an embodiment of the invention, a hardmask layer is provided on or above the upper surface of the floating gate material layer and a photo resist layer is deposited on or above the upper surface of the hardmask layer.

Then, using a lithography process, active areas of the NAND memory cell strings 402, 404, 406, 408, 410, 412, 414, 416, to be formed are defined and patterned.

Then, using the auxiliary mask, in accordance with the previous lithography process, material between the active areas of the NAND memory cell strings 402, 404, 406, 408, 410, 412, 414, 416, to be formed is removed, e.g., by means of an anisotropic etching, e.g., by means of an anisotropic dry etching, e.g., by means of reactive ion etching (RIE) to form isolation trenches 2208 between active areas 2210.

Then, the structure is filled with an isolation fill material 2212 (e.g., a dielectric material such as silicon oxide or silicon nitride) and the isolation fill material is etched back down to a level 2214 that is below the upper surface of the floating gate material layer but above the upper surface of the tunnel dielectric layer 2204. Then, the auxiliary mask (e.g., the hardmask layer) is removed. The resulting structure 2200 is shown in FIG. 22.

The following processes are similar to the processes of the above described embodiments described with reference to FIG. 6 to FIG. 9 and FIG. 16 to FIG. 19, respectively, and will therefore not be described again herein.

Figure 23:
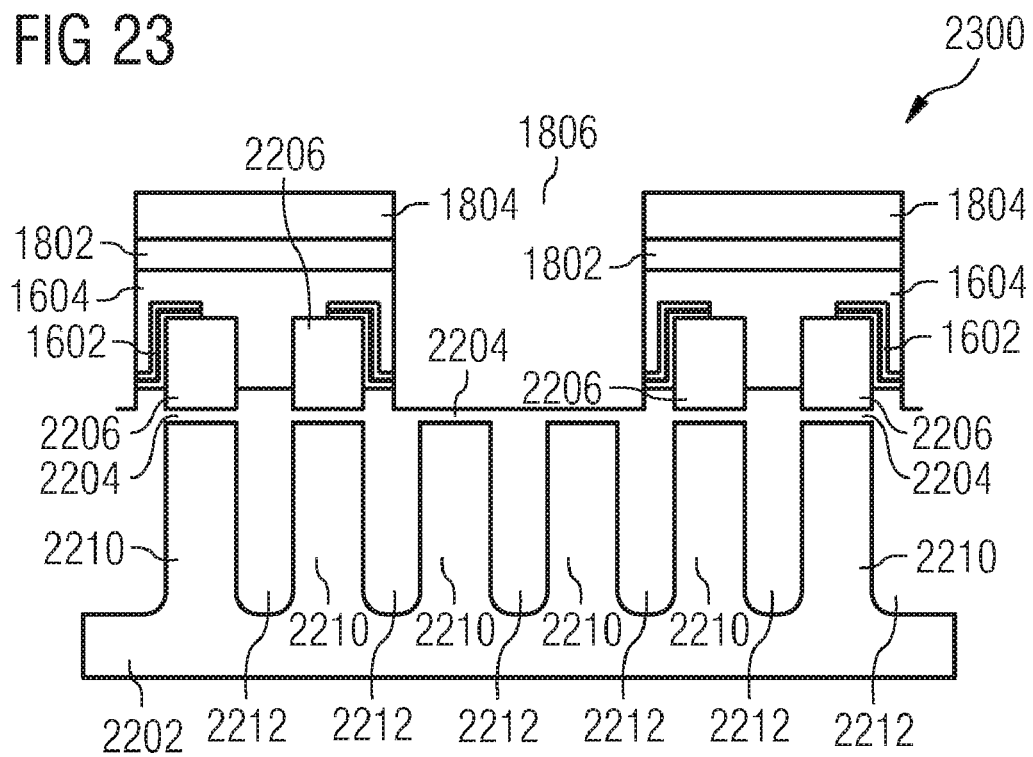
FIG. 23 shows a cross sectional view of a portion of a NAND Flash memory device along the cross section line B-B' of FIG. 4 at a fourth stage of its manufacture in accordance with an embodiment of the invention.
Figure 24:
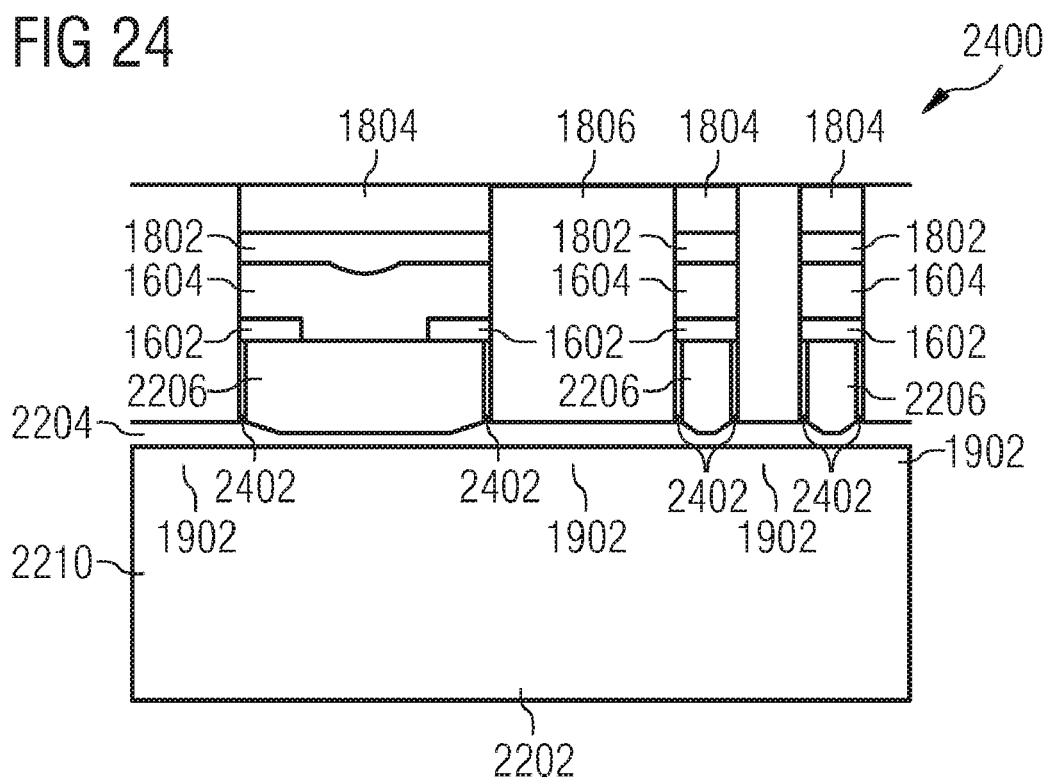
FIG. 24 shows a cross sectional view of a portion of a NAND Flash memory device along the cross section line A-A' of FIG. 4 at a fourth stage of its manufacture in accordance with an embodiment of the invention.

FIG. 23 shows a cross sectional view 2300 of a portion of a NAND Flash memory device along the cross section line B-B' of FIG. 4 at a fourth stage of its manufacture in accordance with an embodiment of the invention. Furthermore, FIG. 24 shows a cross sectional view 2400 of a portion of a NAND Flash memory device along the cross section line A-A' of FIG. 4 at a fourth stage of its manufacture in accordance with an embodiment of the invention.

In an embodiment of the invention, a sidewall oxidation process (also referred to as reoxidation process) is carried out, thereby forming sidewall oxide portions 2402. Furthermore, as described above, then, source/drain junctions may be implanted along NAND memory cell strings, select transistors may be formed, and, optionally: spacer and liner combinations may be provided to tailor transistor source/drain junctions (not shown).

Figure 25:
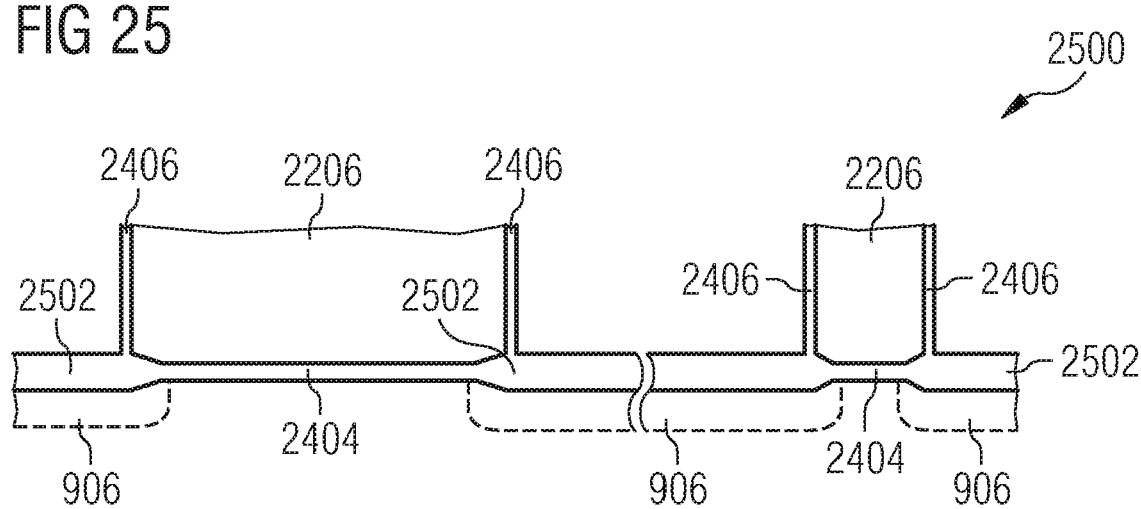
FIG. 25 shows a cross sectional view of a portion of a NAND Flash memory device along the cross section line A-A' of FIG. 4 at a fifth stage of its manufacture in accordance with an embodiment of the invention.

FIG. 25 shows a cross sectional view 2500 of a portion of a NAND Flash memory device along the cross section line A-A' of FIG. 4 at a fifth stage of its manufacture in accordance with an embodiment of the invention after the previously described reoxidation process.

Starting with a different (i.e., thinner) oxide thickness in the memory cell devices in accordance with an embodiment helps to compensate for the enhanced reoxidation growth rate below narrow structures, such as, e.g., the memory cell transistors. Sufficient birds beak 2502 with minimized GIDL of the select transistors can be realized in an embodiment without thickening the memory cell's tunnel oxide too much.

In an embodiment of the invention, the select switches are defined by the word line patterning masks, so there is no misalignment introduced between the word lines and the select gate footprint.

Furthermore, in an embodiment of the invention, bit line to NAND memory cell string contacts that address pairs of NAND memory cell strings, these contacts include local interconnect structures between adjacent active areas.

Embodiments of the invention have one or more of the following effects:

too narrowly spaced minimum pitch type bit lines having large capacitances that degrades device performance in sub 50 nm range and causing a severe reliability issue for aluminum based bit lines (electromigration issue) are relaxed by providing an enlarged pitch;

the contact resistance of minimum pitch type bit line contacts which is conventionally too high, is reduced;

the overlay tolerance of contacts is relaxed;

the lateral gate oxide regrowth enhances effective tunnel oxide thickness.

Furthermore, in some or all of the above embodiments, bit line sharing of adjacent memory cell strings is provided.

Moreover, local switching fit into the memory cell array may be provided.

Embodiments of the invention provide a solution for select gates that act as switches, but do not add high series resistance to the non-switched memory cell strings (such as, e.g., depletion mode transistors).

Furthermore, layout solutions, detailed manufacturing processes, and metallization schemes for NAND memory cell devices are provided in accordance with embodiments of the invention.

Figure 26:
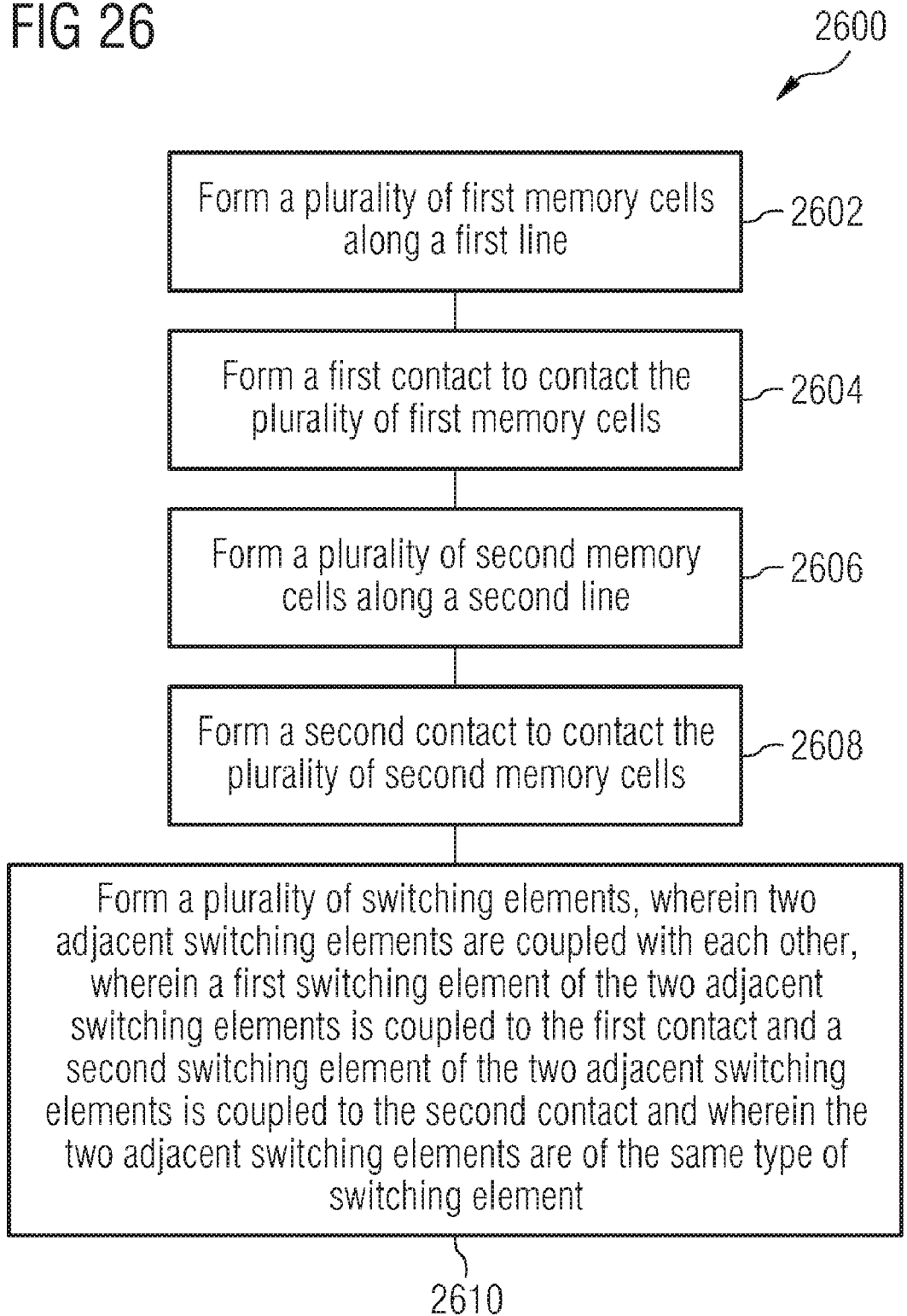
FIG. 26 shows a method for manufacturing an integrated circuit in accordance with an embodiment of the invention.

FIG. 26 shows a method 2600 for manufacturing an integrated circuit in accordance with an embodiment of the invention.

At 2602, a plurality of first memory cells are formed along a first line.

At 2604, a first contact is formed to contact the plurality of first memory cells.

At 2606, a plurality of second memory cells are formed along a second line.

At 2608, a second contact is formed to contact the plurality of second memory cells.

At 2610, a plurality of switching elements are formed, wherein two adjacent switching elements are coupled with each other, wherein a first switching element of the two adjacent switching elements is coupled to the first contact and a second switching element of the two adjacent switching elements is coupled to the second contact and wherein the two adjacent switching elements are of the same type of switching element.

It should be mentioned, that the above method can be carried out in different order. By way of example, processes 2602 and 2606 may be carried out simultaneously and, e.g., before the processes 2604 and 2608, which may be carried out simultaneously as well.

In the context of another embodiment of the invention, it is to be noted that with ongoing shrinking of NAND flash for data storage in the sub 50 nm range the high bit line capacity seriously increases power consumption and reduces write performance due to longer rise times and, therefore, should be kept constant or reduced. A way to realize this would be to reduce the length of the bit line. However, this would require space for additionally required page buffers and reduce area efficiency.

Furthermore the contact bit line (CB) contacts will be increasingly difficult to manufacture since the aspect ratio is steadily increasing. Therefore, checkerboard type contacts as will be described in more detail below may be implemented that require additional space. Another way to reduce the aspect ratio of the contact bit line contacts is to use shared bit lines where two (usually adjacent) NAND memory cell strings are addressed via one contact bit line contact and two select gates. Effects of the conventional realization of shared bit lines with two normally-on transistors are area penalty, inhibited functionality, since the memory cell string potential is capacitively coupled to a normally-on transistor at low voltage, and mask concerns with the $n^+$-implant of the normally-on transistors.

As will be described in more detail below, embodiments of the invention realize the shared bit line concept with a regular array of select gate stripes that are self aligned to the active areas and checkerboard-type contacts (e.g., by means of ONO breakthrough) between the control gate select line (in the case that the switching elements have a floating gate structure) that may be arranged perpendicular to the select gate stripes and the select gate stripes. The data select gate stripes (a first data select gate stripe is also referred to as DSG1 and a second data select gate stripe is also referred to as DSG2) are made by polysilicon lines of typically approximately 100 nm widths that contact every second floating gate via the checkerboard contact. The gate length of the select gate is therefore given simply by the parallel array of the self-aligned first polysilicon stripes (floating gate polysilicon) that have a gate length sufficiently long to provide the checkerboard contacts and the two polysilicon lines DSG1 and DSG2 on top. The select lines may be low ohmic by regular contacts to a first metallization plane (also referred to as M0) where low ohmic metal lines may be available on top.

Effects of embodiments of the invention as outlined below may be one or more of the following effects:

an area efficient way to realize shared bit lines may be provided;

the memory cell string length for all memory cell strings may be the same;

lithographic-friendly and etch-friendly processes may be used in accordance with embodiments of the invention.

In embodiments of the invention, a regular array of select gate stripes is provided self-aligned to the active area with alternating checkerboard contact of the select gate stripes with the control gate polysilicon select lines that allows an area efficient shared bit line scheme avoiding high aspect ratios.

Figure 27:
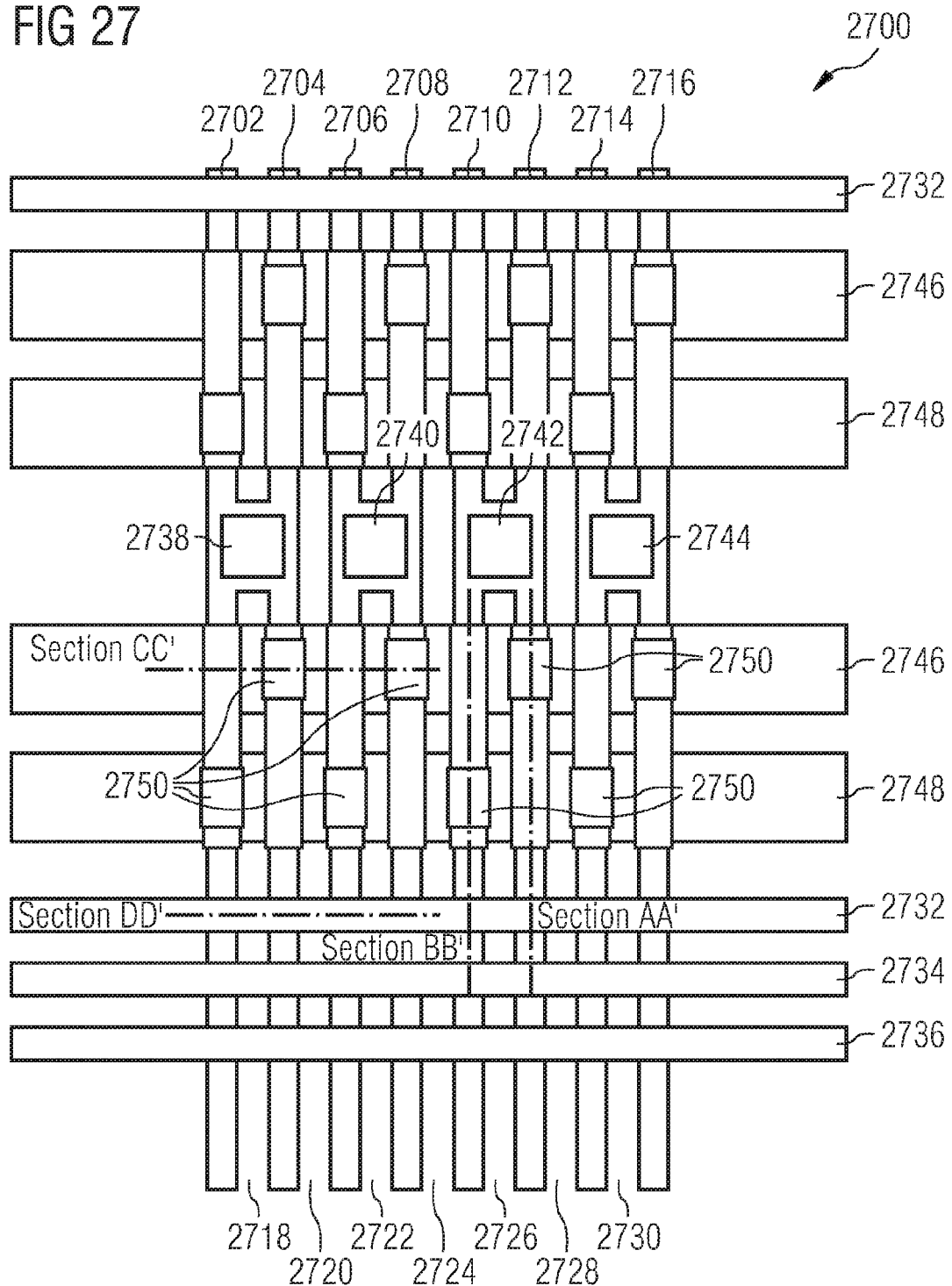
FIG. 27 shows a top view of a portion of a NAND Flash memory device in accordance with another embodiment of the invention.

FIG. 27 shows a top view of a portion of a NAND Flash memory device 2700 in accordance with an embodiment of the invention.

As will be described in more detail below, in an embodiment of the invention, an integrated circuit having the NAND Flash memory device 2700 is provided. In an embodiment of the invention, the integrated circuit includes a plurality of first memory cells arranged along a first line and a plurality of second memory cells arranged along a second line. In an embodiment of the invention, the first line may be substantially parallel to the second line. Furthermore, a plurality of switching elements may be provided, wherein a first switching element is coupled to the first memory cells and a second switching element may be coupled to the second memory cells. The integrated circuit further includes a first select line crossing the first line and the second line and a second select line crossing the first line and the second line. The first switching element includes a control gate region which has a portion overlapping (e.g., below or above) the first select line and a portion overlapping (e.g., below or above) the second select line, wherein the control gate region extends along the first line. The second switching element may include a control gate region which has a portion below or above the first select line and a portion below the second select line, wherein the control gate region extends along the second line.

As shown in FIG. 27, in a particular embodiment, the floating gate NAND Flash memory device 2700 includes a plurality of NAND memory cell strings 2702, 2704, 2706, 2708, 2710, 2712, 2714, 2716, of straight active areas between STI isolations 2718, 2720, 2722, 2724, 2726, 2728, 2730, which are typically filled with oxide, as well as word lines and select gates that cross these active areas and form respective memory cells and select gates, e.g., in the form of transistors, e.g., in the form of metal-oxide-semiconductor (MOS) transistors, e.g., in the form of field effect transistors, e.g., in the form of charge storing field effect transistors (in the form of floating gate field effect transistors or in the form of charge trapping field effect transistors).

In the floating gate NAND Flash memory device 2700, 64 word lines are provided in each memory cell array; however, any other number of word lines may be provided per memory cell array in an alternative embodiment of the invention (e.g., 8 word lines, 16 word lines, 32 word lines, 128 word lines, 256 word lines, 512 word lines, 1024 word lines, . . . ). Furthermore, in another embodiment, the floating gate NAND Flash memory device 2700 has a dummy word line 2732 between the select gates and the memory cells. This dummy word line 2732 can be used for bit storage but not necessarily. In FIG. 27, two of the word lines shown and are designated with 2734, 2736.

Each NAND memory cell string 2702, 2704, 2706, 2708, 2710, 2712, 2714, 2716, includes a plurality of serially source-to-drain coupled floating gate memory cells. The serial coupling of the serially source-to-drain coupled floating gate memory cells is provided by means of buried bit lines (e.g., heavily doped silicon regions).

In order to control the memory cells of each of the NAND memory cell strings 2702, 2704, 2706, 2708, 2710, 2712, 2714, 2716, respective bit line contacts 2738, 2740, 2742, 2744 are provided for each of the NAND memory cell strings 2702, 2704, 2706, 32708, 2710, 2712, 2714, 2716, wherein one bit line contact is configured to electrically connect a plurality (e.g., two) of adjacent NAND memory cell strings 2702, 2704, 2706, 2708, 2710, 2712, 2714, 2716 (e.g., one or more adjacent buried bit lines).

Furthermore, two bit line select lines (e.g., a first bit line select line DSG1 2746 and a second bit line select line DSG2 2748) are provided between the bit line contacts 2738, 2740, 2742, 2744, and the respective dummy word line 2732 or the first word line (in case no dummy word line is provided) of the plurality of word lines 2734, 2736. Illustratively, the bit line select lines DSG1 2746, DSG2 2748 act as memory cell string selectors. In an embodiment of the invention, the dummy word line 2732 serves as a capacitive shielding between the word lines 2734, 2736 and the bit line select lines (e.g., a first bit line select line DSG1 2746 and a second bit line select line DSG2 2748).

Furthermore, usually, a source select line (not shown) is provided opposite to the bit line select lines DSG1 2746, DSG2 2748 with respect to the plurality of word lines 2734, 2736. Next to the source select line, a source line (not shown) may be provided, which may be coupled to a fixed reference potential, e.g., to the ground potential.

The transistors below the word lines are configured as memory cells (e.g., as charge storing transistors, e.g., as floating gate transistors or charge trapping transistors) that can store one or more bits per memory cell. The memory cell strings are addressed from the bit lines through contacts. The memory cell strings are tied together by a common source line. A single select gate line acts as a local switch to connect a particular bit line with the corresponding NAND memory cell string 2702, 2704, 2706, 2708, 2710, 2712, 2714, 2716.

As shown in FIG. 27, a mask 2750 is provided, which serves for exposing portions of the crossing points of the memory cell strings 2702, 2704, 2706, 2708, 2710, 2712, 2714, 2716, and the first bit line select line DSG1 2746 and the second bit line select line DSG2 2748 so that a tunnel dielectric may be at least partially removed in the exposed regions in order to provide a direct electrical contact between the floating gate and the control gate, e.g., in the case that the switching elements are provided in a floating gate structure. This will be described in more detail below.

In an embodiment of the invention, the normally-off regions along a respective memory cell string 2702, 2704, 2706, 2708, 2710, 2712, 2714, 2716 extend below both, the first bit line select line DSG1 2746 and the second bit line select line DSG2 2748, thereby increasing the gate length of the switching elements, for example. Furthermore, in an embodiment of the invention, the gate lengths of all adjacent switching elements are substantially the same since the manufacturing thereof is self-aligned to the outer edges of the bit line select lines DSG1 2746, DSG2 2748. Furthermore, in an embodiment of the invention, the string lengths are substantially the same. In an embodiment of the invention, the width of each of the bit line select lines DSG1 2746, DSG2 2748 may be in the range of about 50 nm to about 300 nm, e.g., about 100 nm and the distance between the bit line select lines DSG1 2746, DSG2 2748 may be in the range of about 30 nm to about 300 nm, e.g., about 100 nm. Thus, the entire gate length of the switching elements formed by the control gate regions below the crossing points along a respective memory cells string 2702, 2704, 2706, 2708, 2710, 2712, 2714, 2716, may be in the range of about 100 nm to about 900 nm, e.g., about 300 nm.

In an alternative embodiment of the invention, an arbitrary number (e.g., 3, 4, 5, 6, 7, . . . ) of bit line select lines and thus a corresponding number of bit line select line contacts coupling the respective bit line select line with the control gate region of the corresponding switching element may be provided. In an embodiment of the invention, a first bit line select line contact is provided coupling the first bit line select line with the control gate region of the first switching element and a second bit line select line contact is provided coupling the second bit line select line with the control gate region of the second switching element.

The bit line select line contacts may be provided in a checkerboard pattern with respect to the bit line select lines. By way of example, the bit line select line contacts may be arranged in an alternating manner along the respective bit line select lines, e.g., with respect to the first bit line select line and the second bit line select line.

Figure 28:
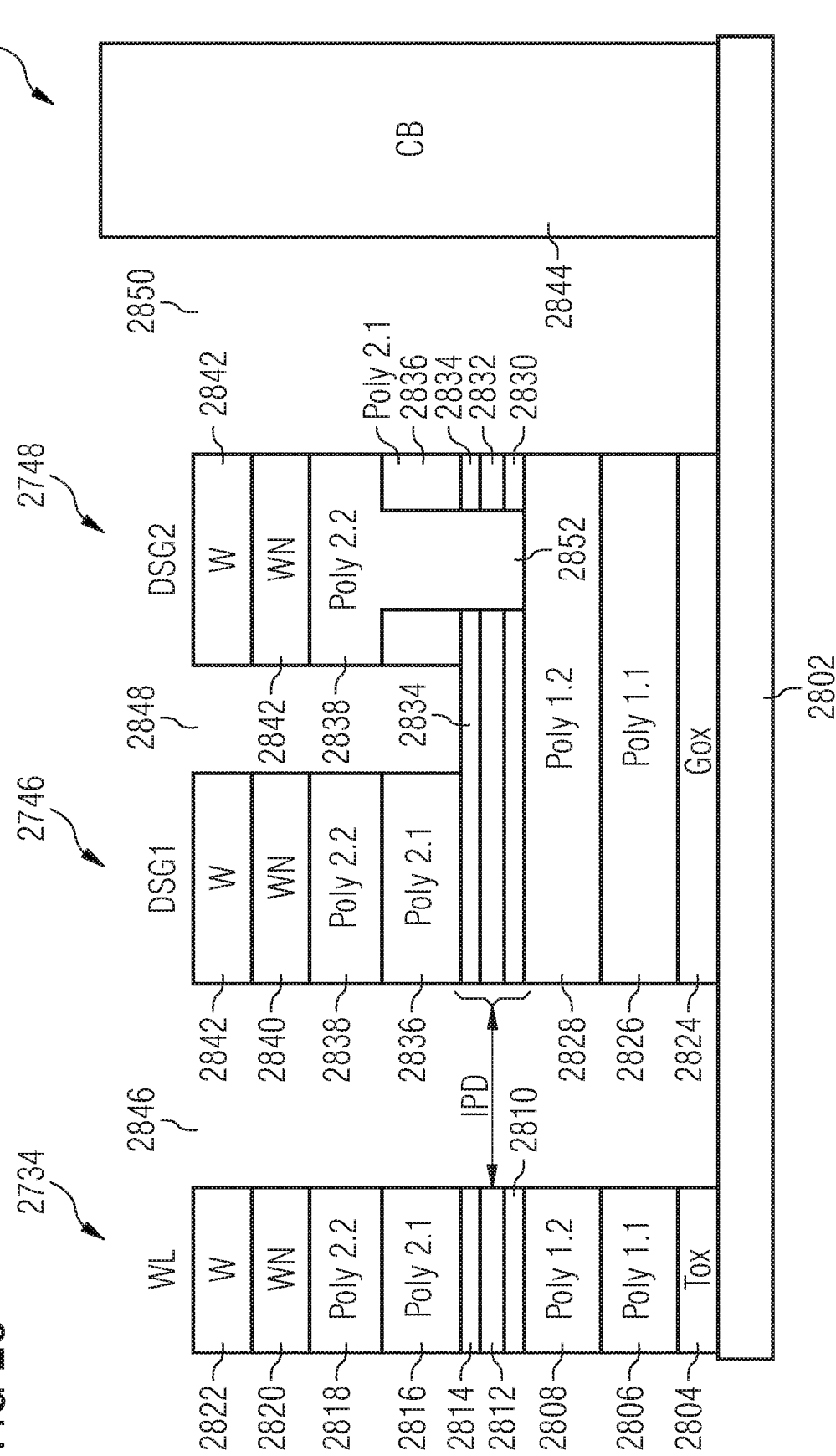
FIG. 28 shows a cross sectional view of a portion of a NAND Flash memory device along the cross section line A-A' of FIG. 27 in accordance with an embodiment of the invention.
Figure 29:
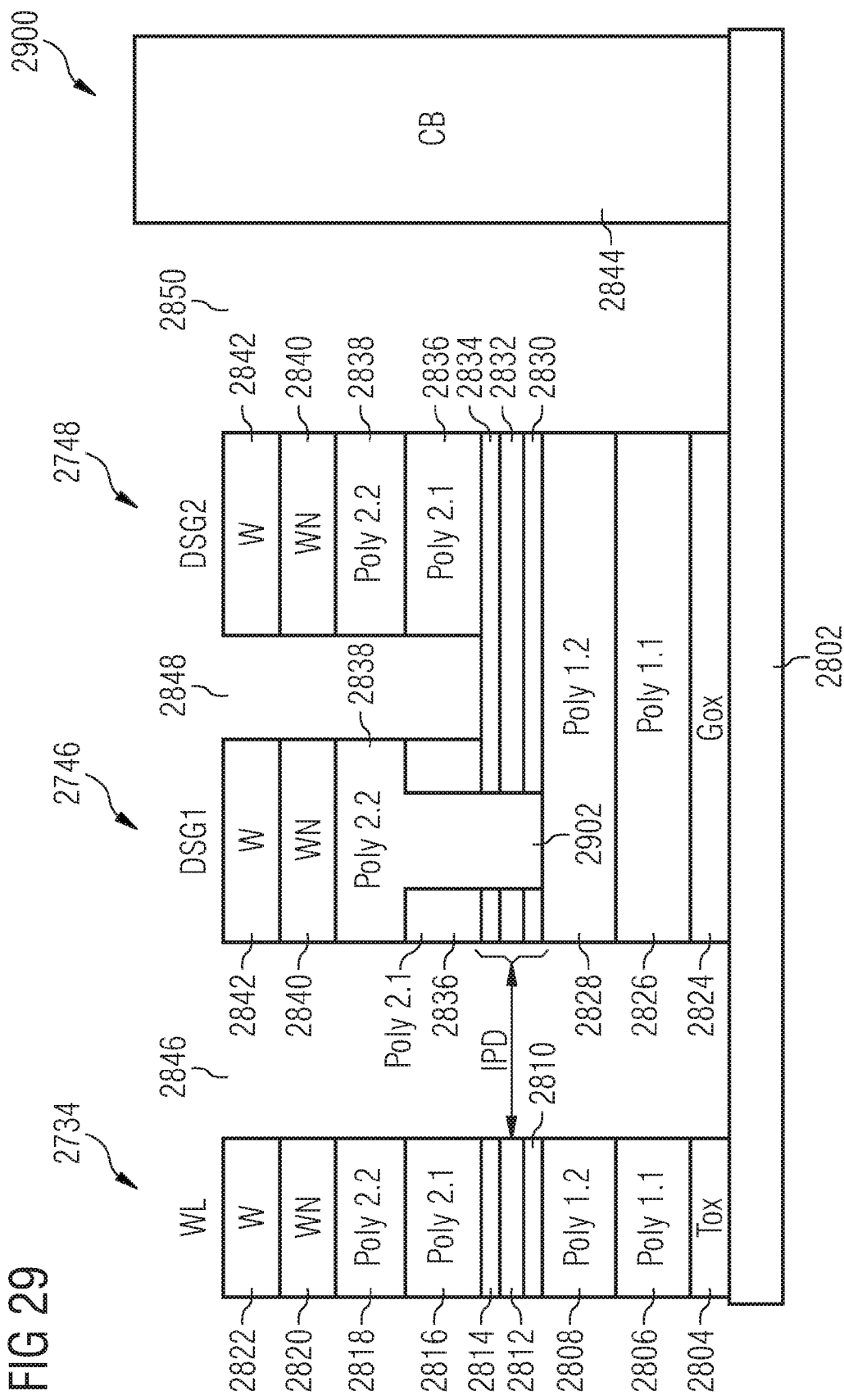
FIG. 29 shows a cross sectional view of a portion of a NAND Flash memory device along the cross section line B-B' of FIG. 27 in accordance with an embodiment of the invention.
Figure 30:
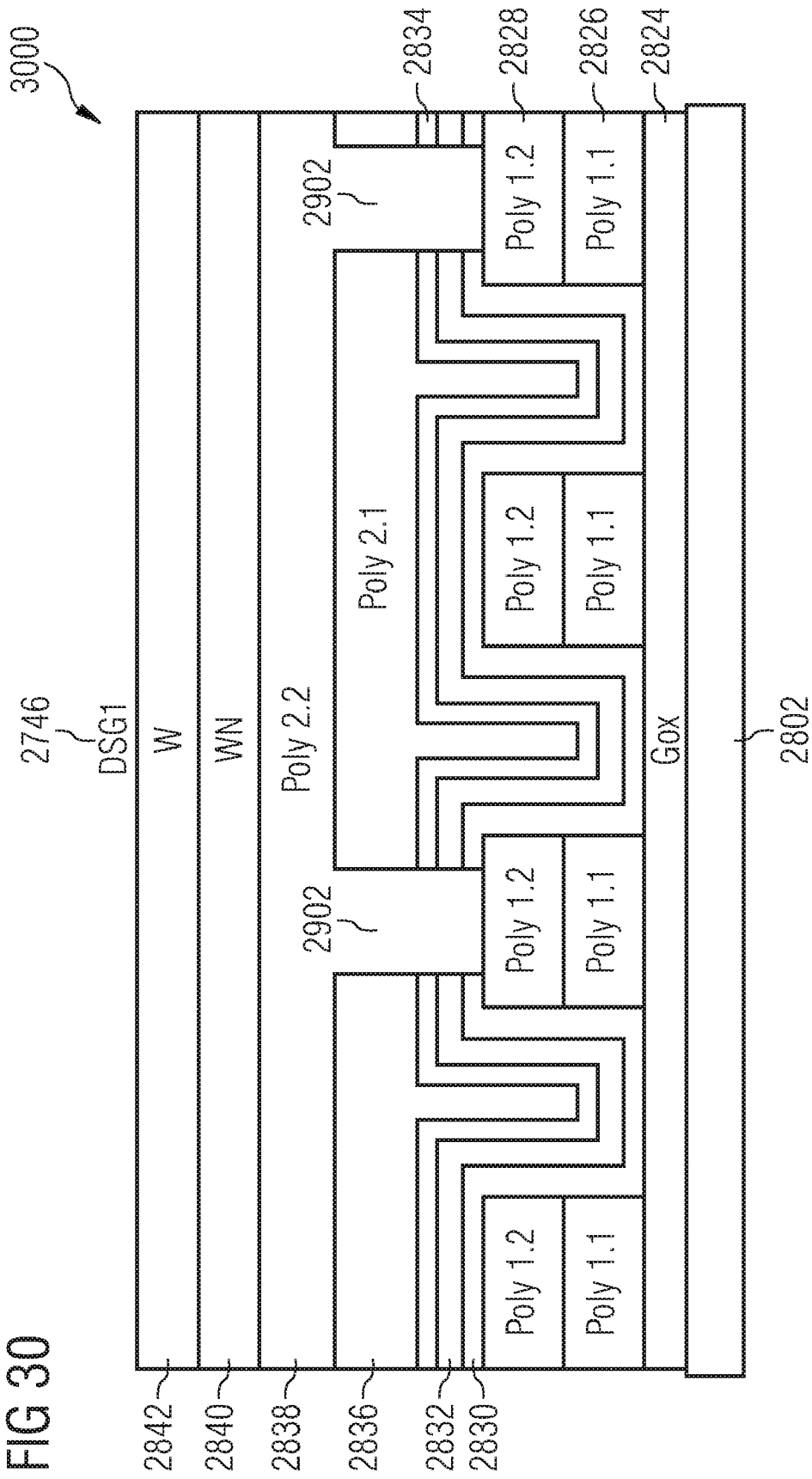
FIG. 30 shows a cross sectional view of a portion of a NAND Flash memory device along the cross section line C-C' of FIG. 27 in accordance with an embodiment of the invention.

FIG. 28 shows a cross sectional view 2800 of a portion of a NAND Flash memory device along the cross section line A-A' of FIG. 27 in accordance with an embodiment of the invention. FIG. 29 shows a cross sectional view 2900 of a portion of a NAND Flash memory device along the cross section line B-B' of FIG. 27 in accordance with an embodiment of the invention. FIG. 30 shows a cross sectional view 3000 of a portion of a NAND Flash memory device along the cross section line C-C' of FIG. 27 in accordance with an embodiment of the invention.

In an embodiment of the invention, the NAND Flash memory device includes a substrate 2802.

The structure of the dummy word line and the structure of the word lines (e.g., the word line 2734) includes a tunnel dielectric layer (e.g., a tunnel oxide layer) 2804 on or above the substrate 2802, a floating gate region, e.g., formed by a first electrically conductive layer 2806 on or above the tunnel dielectric layer 2804 and a second electrically conductive layer 2808 on or above the first electrically conductive layer 2806. Furthermore, a coupling dielectric region may be provided on or above the second electrically conductive layer 2808. In an embodiment of the invention, the coupling dielectric region may include one dielectric layer or a plurality of dielectric layers. In an embodiment of the invention, the coupling dielectric region may include a layer stack of three dielectric layers, such as, e.g., a bottom oxide layer (e.g., made of silicon oxide) 2810 on or above the second electrically conductive layer 2808, a nitride layer (e.g., made of silicon nitride) 2812 on or above the bottom oxide layer 2810, and an upper oxide layer (e.g., made of silicon oxide or aluminum oxide) 2814 on or above the nitride layer 2812. A control gate region is provided, e.g., formed by a third electrically conductive layer 2816 on or above the upper oxide layer 2814 and a fourth electrically conductive layer 2818 on or above the third electrically conductive layer 2816. Further, a metallic region is provided, e.g., formed by a first metallic layer 2820 on or above the fourth electrically conductive layer 2818 and a second metallic layer 2822 on or above the first metallic layer 2820.

The structure of the first bit line select line DSG1 2746 and the second bit line select line DSG2 2748 at the crossing points with the memory cell strings includes a gate dielectric layer (e.g., a gate oxide layer) 2824 on or above the substrate 2802, a floating gate region, e.g., formed by a first electrically conductive layer 2826 on or above the gate dielectric layer 2824 and a second electrically conductive layer 2828 on or above the first electrically conductive layer 2826. Furthermore, a coupling dielectric region may be provided on or above the second electrically conductive layer 2828. In an embodiment of the invention, the coupling dielectric region may include one dielectric layer or a plurality of dielectric layers. In an embodiment of the invention, the coupling dielectric region may include a layer stack of several dielectric layers, e.g., three dielectric layers, such as, e.g., a bottom oxide layer (e.g., made of silicon oxide) 2830 on or above the second electrically conductive layer 2828, a nitride layer (e.g., made of silicon nitride) 2832 on or above the bottom oxide layer 2830, and an upper oxide layer (e.g., made of silicon oxide or aluminum oxide) 2834 on or above the nitride layer 2832. Furthermore, a control gate region is provided, e.g., formed by a third electrically conductive layer 2836 on or above the upper oxide layer 2834 and a fourth electrically conductive layer 2838 on or above the third electrically conductive layer 2836. Further, a metallic region is provided, e.g., formed by a first metallic layer 2840 on or above the fourth electrically conductive layer 2838 and a second metallic layer 2842 on or above the first metallic layer 2840.

Furthermore, a bit line contact 2844 is shown in FIG. 28. The word line 2734 (or the dummy word line 2732) is isolated from the first bit line select line DSG1 2746 by means of isolating material 2846, e.g., made of silicon oxide or silicon nitride. Furthermore, the portions of the control gate region and the metallic region of the both bit line select lines DSG1 2746, DSG2 2748 are isolated from each other as well by means of isolating material 2848, e.g., made of silicon oxide or silicon nitride disposed above the coupling dielectric region. The second bit line select line DSG2 2748 and the bit line contact 2844 are isolated from each other as well by means of isolating material 2850, e.g., made of silicon oxide or silicon nitride.

The tunnel dielectric layer 2804 and the gate dielectric layer 2824 may be made of the same material and using the same process, as will be described in more detail below. In an embodiment of the invention, the tunnel dielectric layer 2804 and the gate dielectric layer 2824 may be made of silicon oxide and with a physical thickness in the range of about 3 nm to about 10 nm, e.g., a physical thickness of 8 nm (in an embodiment of the invention, the equivalent oxide thickness (EOT) of these layers may be about 10 nm).

The floating gate regions of the (dummy) word lines and the bit line select lines may be made of the same material and using the same process, as will be described in more detail below. In an embodiment of the invention, the floating gate regions may include one or a plurality of electrically conductive layers which may be stacked above one another. The first electrically conductive layers 2806, 2826 may be made of polysilicon or of a metal such as, e.g., TaN, W, WN. The first electrically conductive layers 2806, 2826 may have a layer thickness in the range of about 20 nm to about 40 nm, e.g., a layer thickness of about 30 nm. The second electrically conductive layers 2808, 2828 may be made of polysilicon or of a metal such as, e.g., TaN, W, WN. In an embodiment of the invention, in which all electrically conductive layers 2806, 2808, 2826, 2828 are made of semiconducting material such as, e.g., polysilicon, the first electrically conductive layers 2806, 2826 may include less doping atoms than the second electrically conductive layers 2808, 2828. In an embodiment of the invention, the different doping profiles may be achieved by providing different conditions in the deposition process for depositing the first electrically conductive layers 2806, 2826 on the one hand, and the second electrically conductive layers 2808, 2828, on the other hand.

The coupling dielectric regions of the (dummy) word lines and the bit line select lines may be made of the same material and using the same process, as will be described in more detail below. In an embodiment of the invention, in which the coupling dielectric regions include an oxide/nitride/oxide layer stack as described above, the physical thickness of the oxide/nitride/oxide layer stack may be in the range of about 12 nm to about 15 nm (the equivalent oxide thickness (EOT) thereof may be in the range of about 8 nm to about 12 nm, e.g., about 10 nm). In an embodiment of the invention, the bottom oxide layers 2810, 2830 may have a layer thickness in the range of about 2 nm to about 8 nm, e.g., 5 nm. In an embodiment of the invention, the nitride layers 2812, 2832 may have a layer thickness in the range of about 2 nm to about 8 nm, e.g., 5 nm. In an embodiment of the invention, the upper oxide layers 2814, 2834 may have a layer thickness in the range of about 2 nm to about 8 nm, e.g., 5 nm.

The control gate regions of the (dummy) word lines and the bit line select lines may be made of the same material and using the same process, as will be described in more detail below. In an embodiment of the invention, the third electrically conductive layers 2816, 2836 may be made of polysilicon or any other suitable electrically conductive material, and may have a layer thickness in the range of about 20 nm to about 40 nm, e.g., a layer thickness of about 30 nm. The fourth electrically conductive layers 2818, 2838 may be made of polysilicon or any other suitable electrically conductive material, and may have a layer thickness in the range of about 30 nm to about 70 nm, e.g., a layer thickness of about 50 nm.

The metallic regions of the (dummy) word lines and the bit line select lines may be made of the same material and using the same process, as will be described in more detail below. In an embodiment of the invention, the first metallic layers 2820, 2840 may be made of tungsten nitride (WN) and may have a layer thickness in the range of about 5 nm to about 20 nm, e.g., a layer thickness of about 10 nm. In an embodiment of the invention, the second metallic layers 2822, 2842 may be made of tungsten (W) and may have a layer thickness in the range of about 30 nm to about 70 nm, e.g., a layer thickness of about 50 nm.

In an embodiment of the invention, the layer stack including the control gate regions and the metallic regions may have an entire layer stack thickness in the range of about 100 nm to about 200 nm, e.g., a layer stack thickness of about 150 nm.

As shown in FIG. 28, a contact hole 2852 (also referred to as a contact via) is provided in the coupling dielectric region of the second bit line select line DSG2 2748 which may be filled with electrically conductive material such as, e.g., polysilicon or tungsten. Thus, a direct electrical ohmic contact is provided between the floating gate region and the control gate region below the second bit line select line DSG2 2748.

As shown in FIG. 29, another contact hole 2902 (also referred to as a contact via) is provided in the coupling dielectric region of the first bit line select line DSG1 2746 which may be filled with electrically conductive material such as, e.g., polysilicon. Thus, a direct electrical ohmic contact is provided between the floating gate region and the control gate region below the first bit line select line DSG1 2746.

Figure 31A:
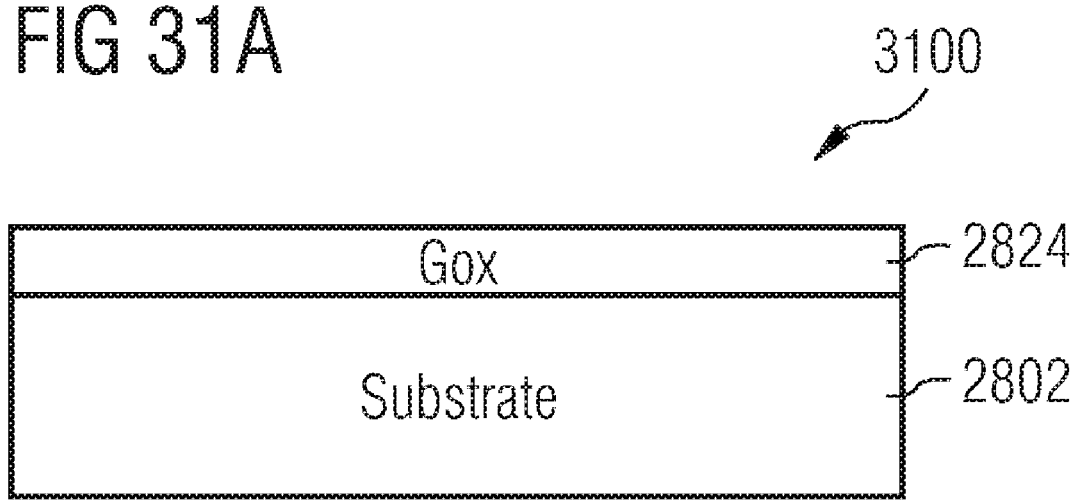
FIGS. 31A and 31B show cross sectional views of a portion of a NAND Flash memory device along the cross section line A-A' (FIG. 31A) and along the cross section line D-D' (FIG. 31B) of FIG. 27 at a first stage of its manufacture in accordance with an embodiment of the invention.
Figure 31B:
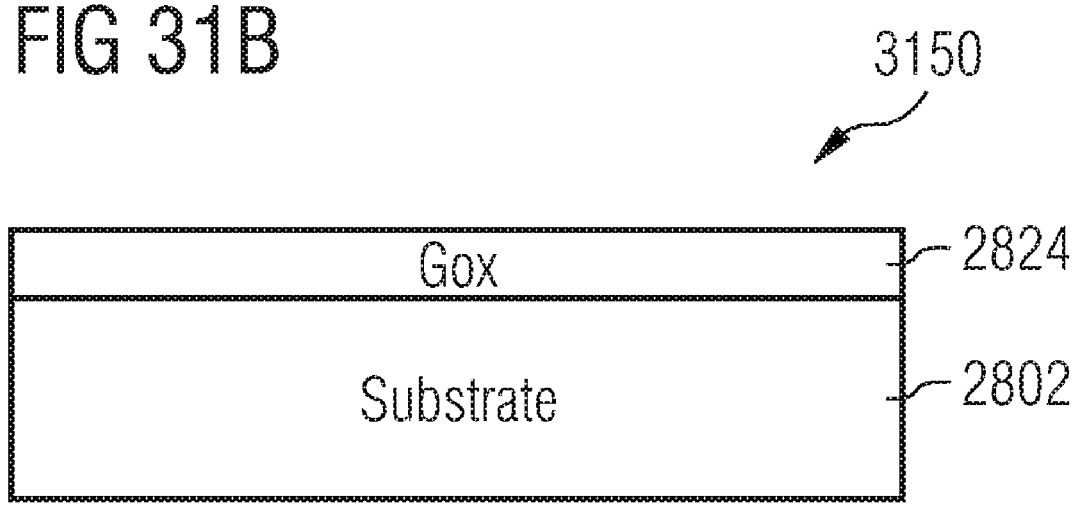

FIGS. 31A and 31B show cross sectional views of a portion of a NAND Flash memory device along the cross section line A-A' 3100 (FIG. 31A) and along the cross section line D-D' 3150 (FIG. 31B) of FIG. 27 at a first stage of its manufacture in accordance with an embodiment of the invention.

In a first process, well implants are provided in the substrate 2802, e.g., p-well implants or n-well implants. Furthermore, a gate dielectric layer 2824 is deposited on the upper surface of the substrate 2802, e.g., by means of a CVD process or a PVD process.

FIGS. 32A and 32B show cross sectional views of a portion of a NAND Flash memory device along the cross section line A-A' 3200 (FIG. 32A) and along the cross section line D-D' 3250 (FIG. 32B) of FIG. 27 at a second stage of its manufacture in accordance with an embodiment of the invention.

Then, the floating gate region is formed. In an embodiment of the invention, the first electrically conductive layer 2826 which may be made of polysilicon or of a metal such as, e.g., TaN, W, WN is deposited on the upper surface of the gate dielectric layer 2824, e.g., by means of a CVD process or a PVD process. Next, the second electrically conductive layer 2828 which may be made of polysilicon or of a metal such as, e.g., TaN, W, WN is deposited on the upper surface of the first electrically conductive layer 2826, e.g., by means of a CVD process or a PVD process.

Then, an auxiliary mask 3202 such as, e.g., a hardmask (e.g., made of a nitride (e.g., silicon nitride), an oxide (e.g., silicon oxide) or carbon) is deposited on the upper surface of the second electrically conductive layer 2828, e.g., by means of a CVD process or a PVD process.

Using a lithography process and an etching process using the patterned auxiliary mask 3202, shallow trench isolation (STI) trenches are formed (in an embodiment self-aligned to the formation of the active areas and thus to the floating gates). After having formed the STI trenches, they are filled and possible overfilled with isolation material such as, e.g., an oxide (e.g., silicon oxide). The trench overfilling material is then removed by means, e.g., of a chemical mechanical polishing (CMP) process, thereby forming STI structures 3204.

Figure 33B:
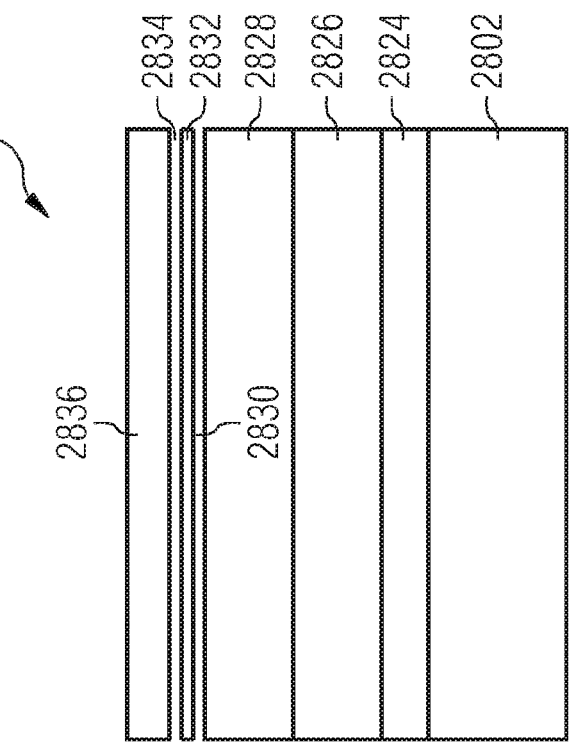
FIGS. 33A and 33B show cross sectional views of a portion of a NAND Flash memory device along the cross section line A-A' (FIG. 33A) and along the cross section line D-D' (FIG. 33B) of FIG. 27 at a third stage of its manufacture in accordance with an embodiment of the invention.
Figure 33A:
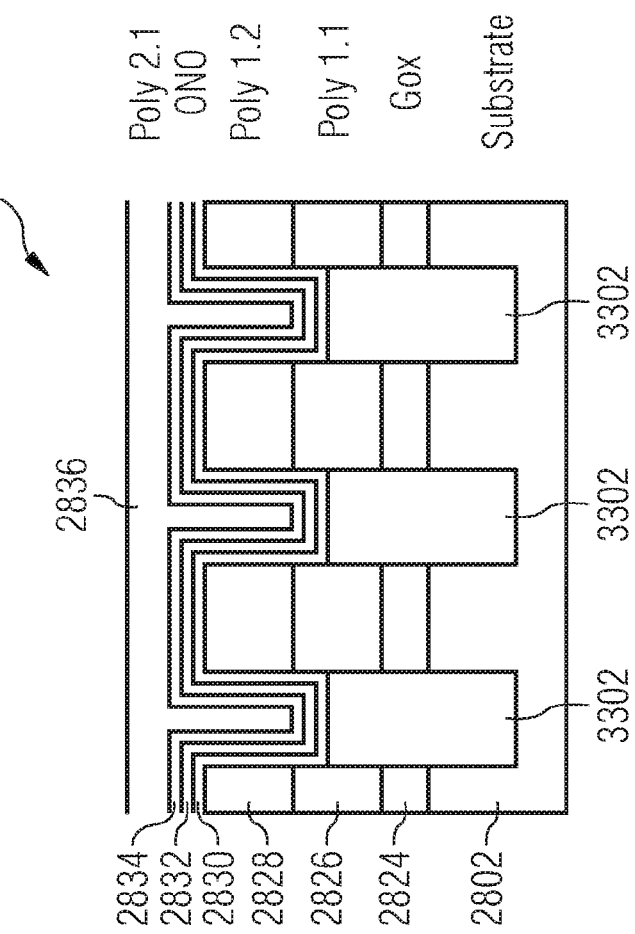

FIGS. 33A and 33B show cross sectional views of a portion of a NAND Flash memory device along the cross section line A-A' 3300 (FIG. 33A) and along the cross section line D-D' 3350 (FIG. 33B) of FIG. 27 at a third stage of its manufacture in accordance with an embodiment of the invention.

Then, using a lithography process, the memory cell array region is exposed, but not the periphery area. Next, the isolation material of the STI structures 3204 is partially removed, thereby forming recessed STI structures 3302. Then, the coupling dielectric region is formed in the memory cell array region including the select gate area, e.g., by sequential deposition of the bottom oxide layer 2830, the nitride layer 2832 and the upper oxide layer 2834. In a following process, the third electrically conductive layer 2836 is deposited on or above the upper oxide layer 2834, e.g., by means of a CVD process or a PVD process.

Figure 34B:
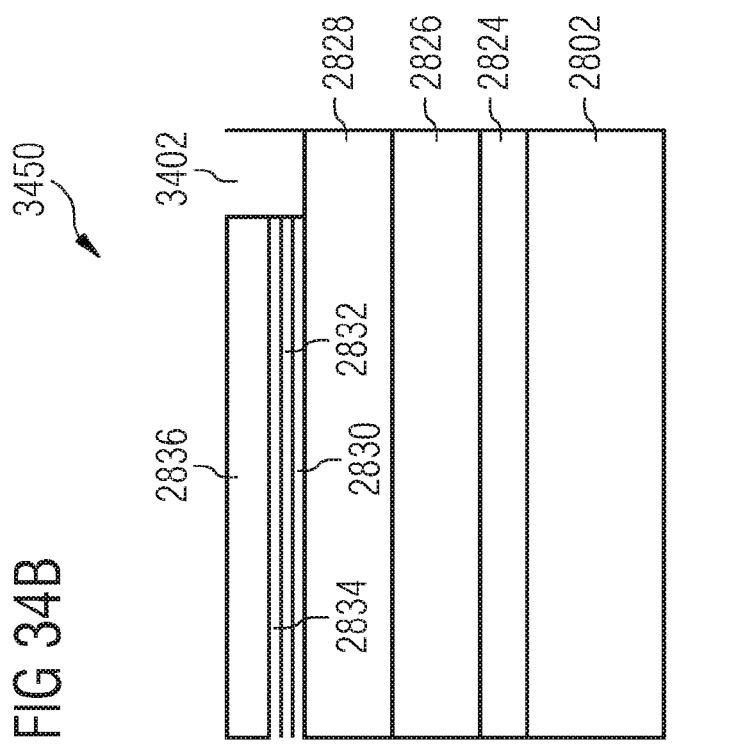
FIGS. 34A and 34B show cross sectional views of a portion of a NAND Flash memory device along the cross section line A-A' (FIG. 34A) and along the cross section line D-D' (FIG. 34B) of FIG. 27 at a fourth stage of its manufacture in accordance with an embodiment of the invention.
Figure 34A:
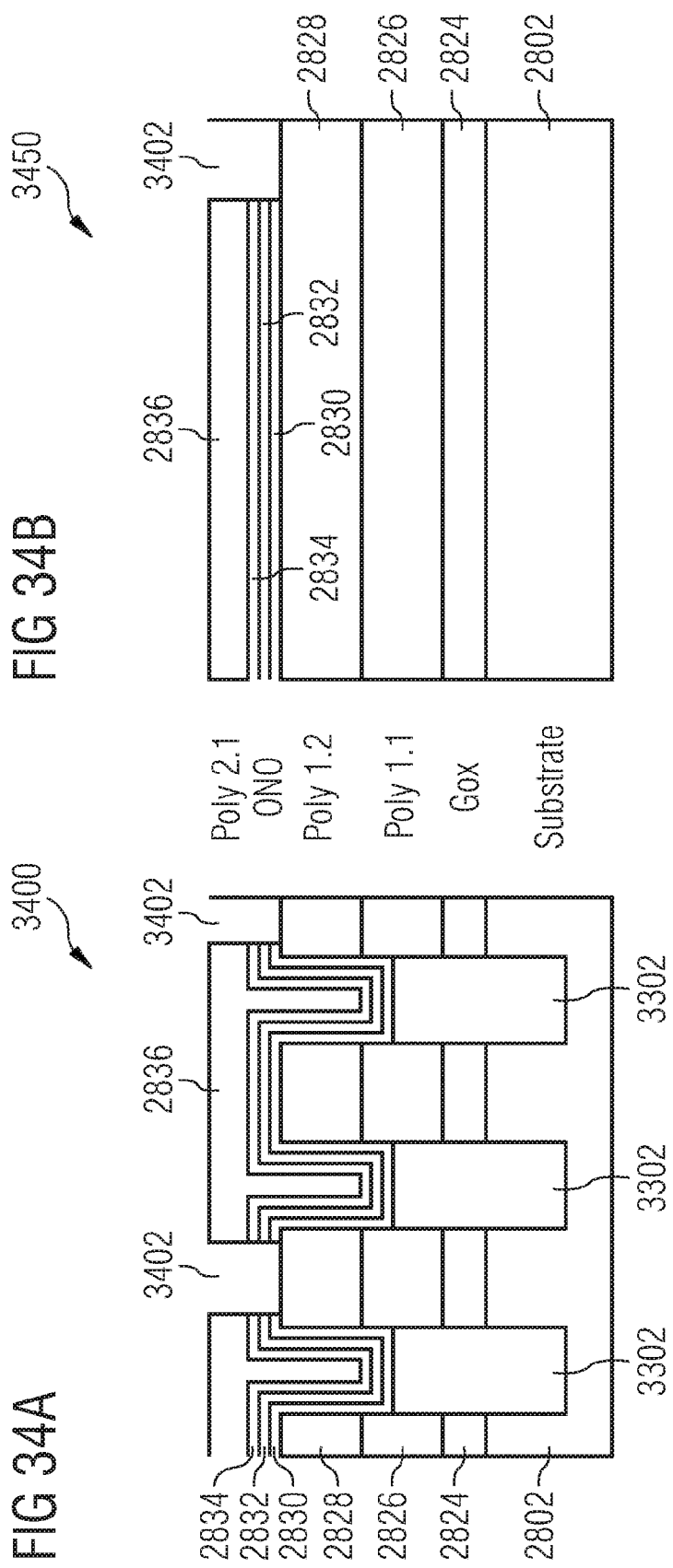

FIGS. 34A and 34B show cross sectional views of a portion of a NAND Flash memory device along the cross section line A-A' 3400 (FIG. 34A) and along the cross section line D-D' 3450 (FIG. 34B) of FIG. 27 at a fourth stage of its manufacture in accordance with an embodiment of the invention.

In a following process, using another lithography process trenches 3402 are formed laterally between the recessed STI structures 3302. In an embodiment of the invention, the trenches are formed in a regular pattern such as, e.g., laterally between every two recessed STI structures 3302 as shown in FIG. 34A. The trenches 3402 are formed to such a depth that the upper surface of the second electrically conductive layer 2828 is exposed so that in the following an electrical ohmic contact with the second electrically conductive layer 2828 may be formed. In other words, the coupling dielectric region is opened (e.g., the ONO layer stack 2830, 2832, 2834 is opened) by means of the etching, e.g., by means of an anisotropic etching process such as, e.g., a reactive ion etching (RIE) process.

FIGS. 35A and 35B show cross sectional views of a portion of a NAND Flash memory device along the cross section line A-A' 3500 (FIG. 35A) and along the cross section line D-D' 3550 (FIG. 35B) of FIG. 27 at a fifth stage of its manufacture in accordance with an embodiment of the invention.

Then, the fourth electrically conductive layer 2838 is deposited on or above the upper surface of the third electrically conductive layer 2836 and the exposed upper surface of the second electrically conductive layer 2828, e.g., by means of a CVD process or a PVD process. Thus, an ohmic electrical contact is achieved between the fourth electrically conductive layer 2838 and the second electrically conductive layer 2828 via the trenches 3402 which are filled with the material of the fourth electrically conductive layer 2838. In a following process, the metallic regions are formed. In an embodiment of the invention, the first metallic layer 2840 is deposited (e.g., WN) on or above the upper surface of the fourth electrically conductive layer 2838, e.g., by means of a CVD process or a PVD process. Further, the second metallic layer 2842 (e.g., W) is deposited (e.g. W) on or above the upper surface of the first metallic layer 2840, e.g., by means of a CVD process or a PVD process. In a subsequent process, a nitride layer 2802 (e.g., a silicon nitride layer 2802) is deposited on on or above the upper surface of the second metallic layer 2842, e.g., by means of a CVD process or a PVD process. Then, another auxiliary mask 3504 such as e.g. a hardmask (e.g., made of a nitride, an oxide or carbon) is deposited on on or above the upper surface of the nitride layer 3502.

FIGS. 36A and 36B show cross sectional views of a portion of a NAND Flash memory device along the cross section line A-A' 3600 (FIG. 36A) and along the cross section line D-D' 3650 (FIG. 36B) of FIG. 27 at a sixth stage of its manufacture in accordance with an embodiment of the invention.

Then, an anisotropic gate contact etching process (e.g., RIE) is carried out down to the upper surface of the upper oxide layer 2834, thereby exposing the upper surface of the upper oxide layer 2834, thereby forming gate contact trenches 3602. It should be mentioned that the nitride encapsulation of the second metallic layer 2842 (e.g., W) is not shown in the figures.

FIGS. 37A and 37B show cross sectional views of a portion of a NAND Flash memory device along the cross section line A-A' 3700 (FIG. 37A) and along the cross section line D-D' 3750 (FIG. 37B) of FIG. 27 at a seventh stage of its manufacture in accordance with an embodiment of the invention.

Then a coupling dielectric region mask 3752 is provided, e.g., made of a photo resist or another suitable material for blocking a subsequent etching process in the select gate region and in the periphery area.

Figure 37C:
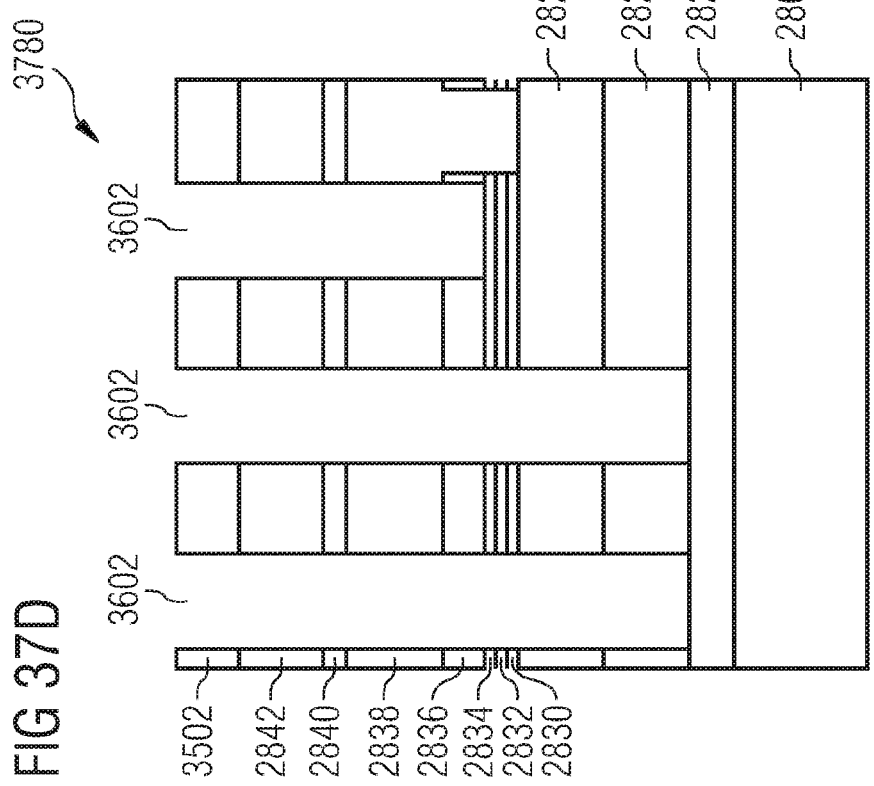
FIGS. 37C and 37D show cross sectional views of a portion of a NAND Flash memory device along the cross section line A-A' (FIG. 37A) and along the cross section line D-D' (FIG. 37B) of FIG. 27 at a seventh stage of its manufacture in accordance with an alternative embodiment of the invention.
Figure 37D:
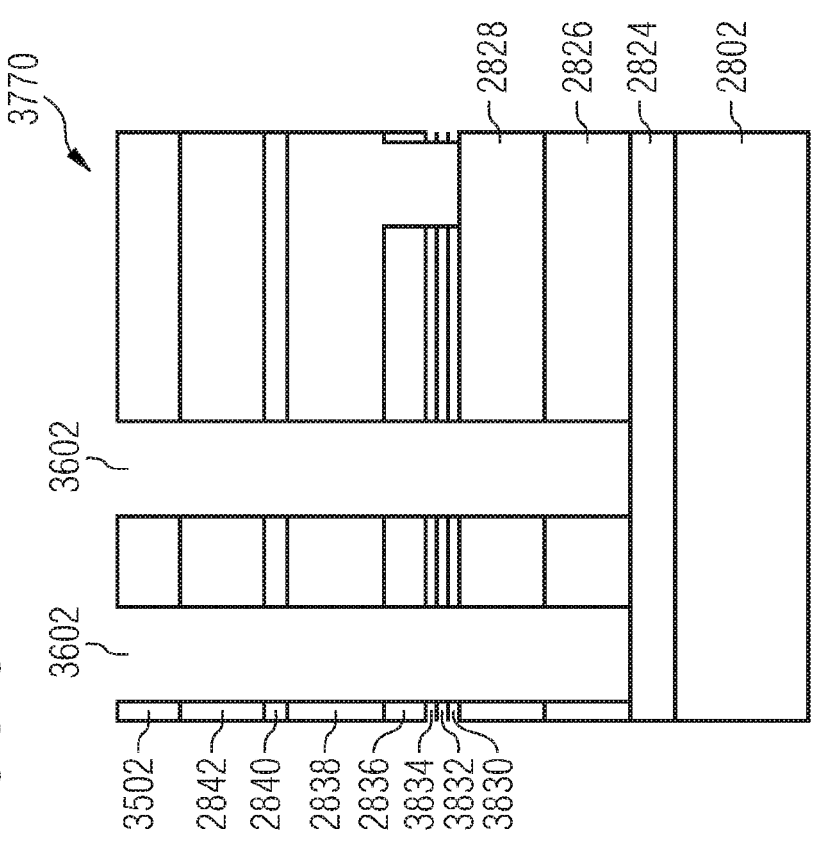

FIGS. 37C and 37D show cross sectional views of a portion of a NAND Flash memory device along the cross section line D-D' at a seventh stage of its manufacture in accordance with an alternative embodiment of the invention.

As shown in FIG. 37C, starting with the structure 3550 shown in FIG. 35B, in an alternative embodiment of the invention, two gate contact trenches 3602 are formed, wherein the gate contact trenches 3602 are removed (e.g., etched) down to the upper surface of the gate dielectric layer (e.g., a gate oxide layer) 2824. In general, gate contact trenches 3602 are formed which serve for the dummy word line and the word lines. However, in this embodiment, the gate contact trenches 3602 for the bit line select lines (e.g., a first bit line select line DSG1 2746 and a second bit line select line DSG2 2748) are not yet formed.

Then, as shown in FIG. 37D, the gate contact trenches 3602 for the bit line select lines (e.g., a first bit line select line DSG1 2746 and a second bit line select line DSG2 2748) are not formed using an additional lithography process and etching process, wherein these gate contact trenches 3602 for the bit line select lines are only etched down to the upper surface of the upper oxide layer (e.g., made of silicon oxide or aluminum oxide) 2834.

Figure 38B:
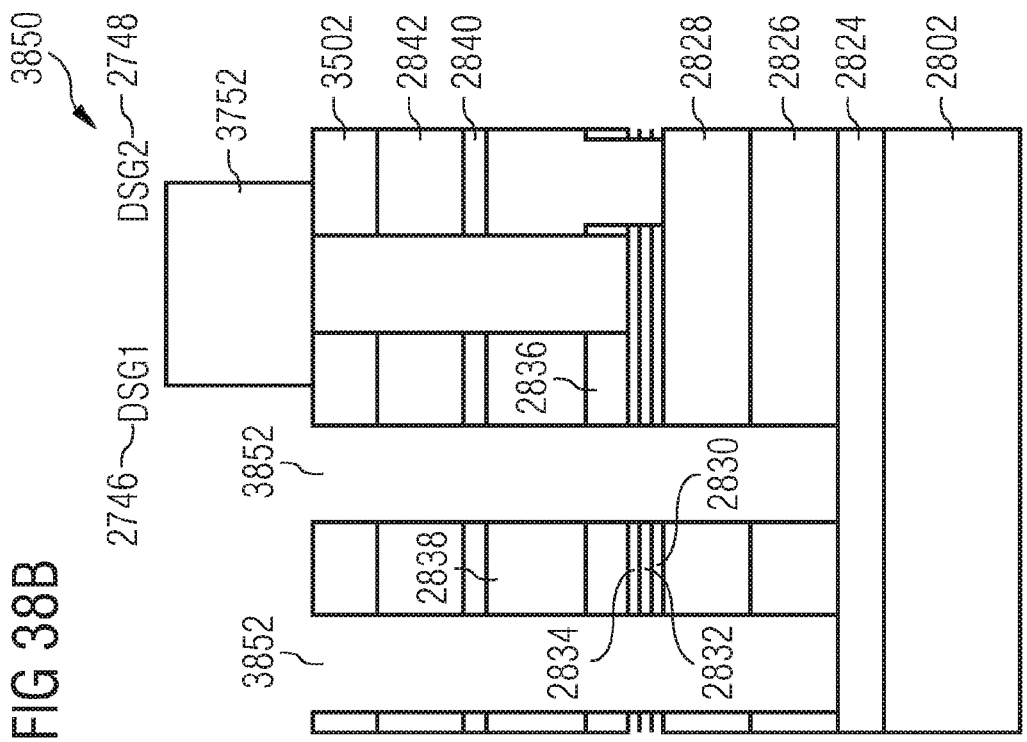
FIGS. 38A and 38B show cross sectional views of a portion of a NAND Flash memory device along the cross section line A-A' (FIG. 38A) and along the cross section line D-D' (FIG. 38B) of FIG. 27 at an eighth stage of its manufacture in accordance with an embodiment of the invention.
Figure 38A:
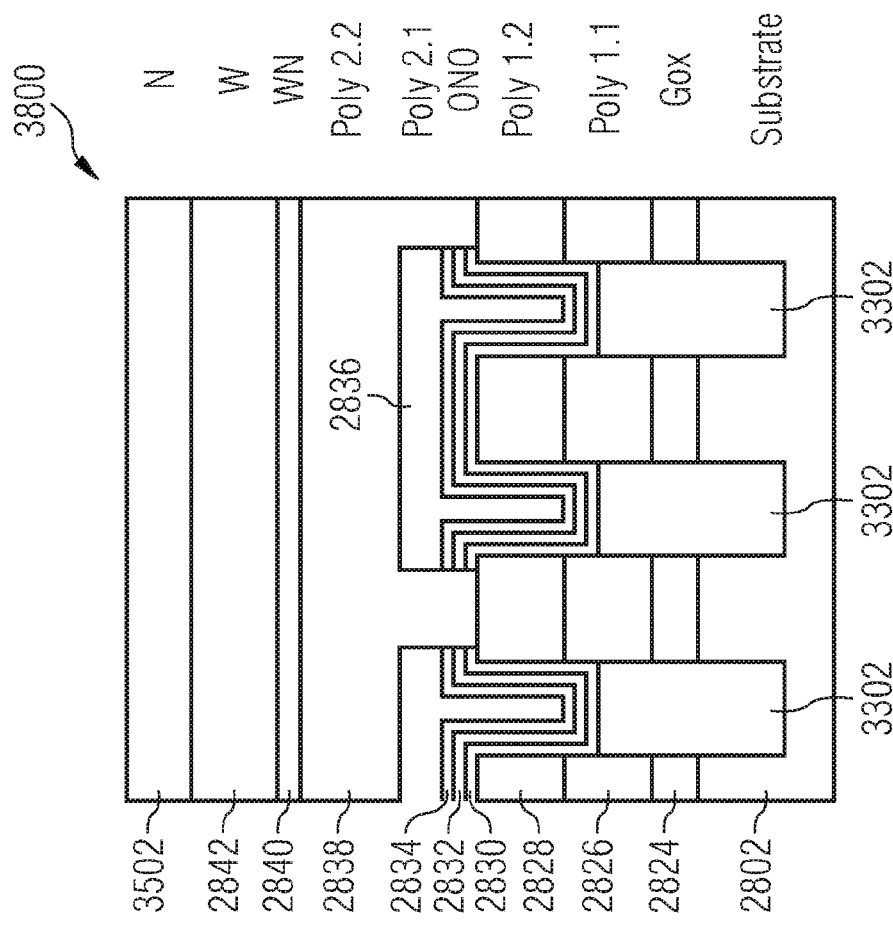

FIGS. 38A and 38B show cross sectional views of a portion of a NAND Flash memory device along the cross section line A-A' 3800 (FIG. 38A) and along the cross section line D-D' 3850 (FIG. 38B) of FIG. 27 at an eighth stage of its manufacture in accordance with an embodiment of the invention.

Then, a final gate contact etching process is carried out of the still exposed gate contact trenches 3602. The etching process may be an anisotropic etching such as, e.g., a RIE process. The final gate contact etching process may be carried out such that the upper surface of the gate dielectric layer 2824 is exposed, thereby forming final gate contact trenches 3852.

Figure 39B:
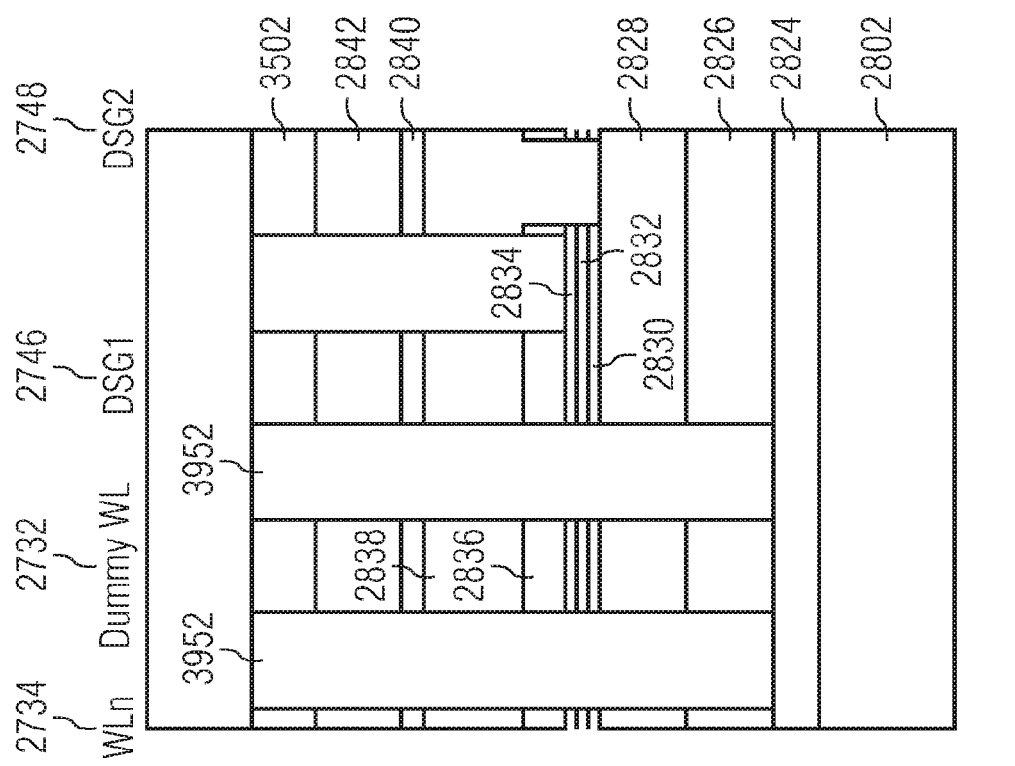
FIGS. 39A and 39B show cross sectional views of a portion of a NAND Flash memory device along the cross section line A-A' (FIG. 39A) and along the cross section line D-D' (FIG. 39B) of FIG. 27 at a ninth stage of its manufacture in accordance with an embodiment of the invention.
Figure 39A:
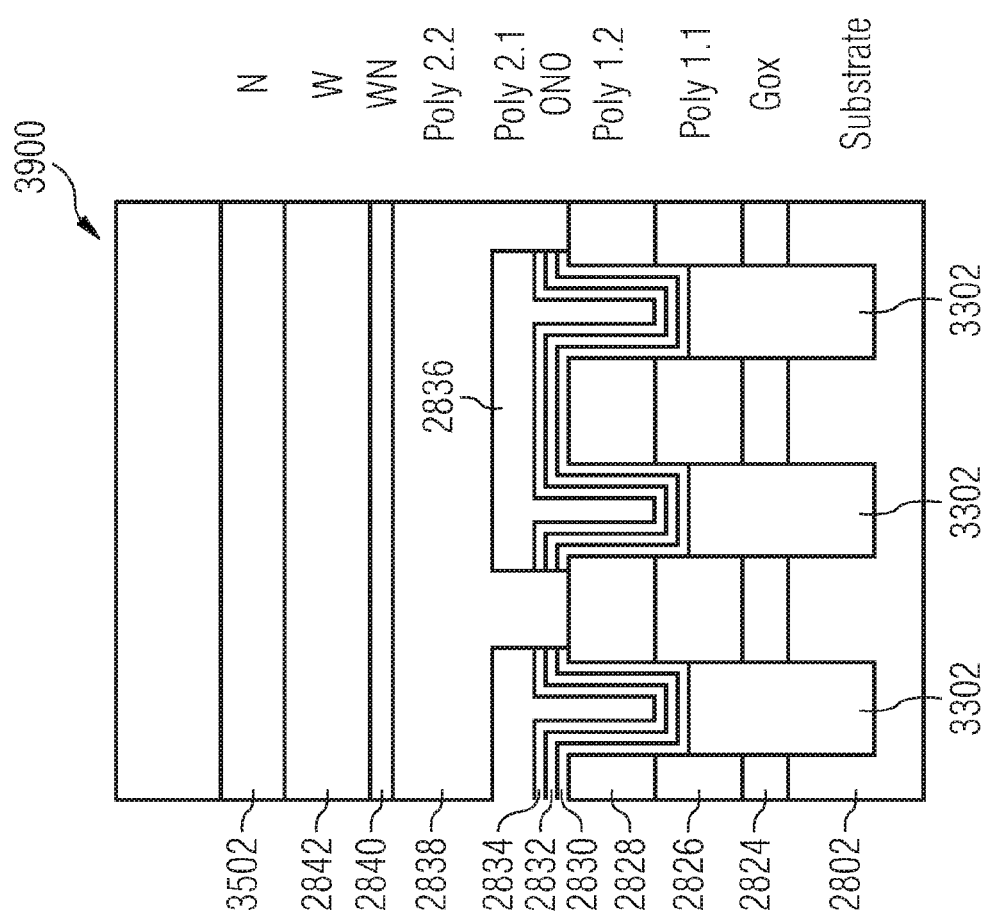

FIGS. 39A and 39B show cross sectional views of a portion of a NAND Flash memory device along the cross section line A-A' 3900 (FIG. 39A) and along the cross section line D-D' 3950 (FIG. 39B) of FIG. 27 at a ninth stage of its manufacture in accordance with an embodiment of the invention.

In the following, the source/drain junctions of the transistors are implanted. Then, spacers (not shown) may be formed (e.g., made of silicon oxide) and a further implantation process is carried out for the formation of the source/drain junctions of the transistors. Next, pre-metal dielectrics are deposited, followed by a deposition of the source line and of the contacts 3952. Then, the metallization processes are carried out as well as the as such conventional back-end-of-line (BEOL) processes.

FIG. 40 shows a top view of a portion of a NAND Flash memory device 4000 in accordance with another embodiment of the invention.

This embodiment is similar to the NAND Flash memory device 2700 shown in FIG. 27 and therefore, only the difference of the NAND Flash memory device 4000 in accordance with this embodiment compared with the NAND Flash memory device 2700 shown in FIG. 27 will be described in the following.

In manufacturing the NAND Flash memory device 4000, a mask 4002 is provided, which serves for exposing portions of the crossing points of the memory cell strings 2702, 2704, 2706, 2708, 2710, 2712, 2714, 2716, and the first bit line select line DSG1 2746 and the second bit line select line DSG2 2748 so that a tunnel dielectric may be at least partially removed in the exposed regions in order to provide a direct electrical contact between the floating gate and the control gate, e.g., in the case that the switching elements are provided in a floating gate structure. In contrast to the mask 2750 of the previous embodiment, the mask 4002 is configured such that regions of two adjacent memory cell strings 2702, 2704, 2706, 2708, 2710, 2712, 2714, 2716 along one respective bit line select line DSG1 2746, DSG2 2748 are exposed, wherein a regular alternating pattern is provided of respectively two regions of two adjacent memory cell strings 2702, 2704, 2706, 2708, 2710, 2712, 2714, 2716 along one respective bit line select line DSG1 2746, DSG2 2748 are exposed and the regions of respective two adjacent memory cell strings 2702, 2704, 2706, 2708, 2710, 2712, 2714, 2716 in each direction along one respective bit line select line DSG1 2746, DSG2 2748 are not exposed. Thus, as will be described in more detail below, an alternating pairwise breakthrough/non-breakthrough through the respective coupling of dielectric layers is provided along one respective bit line select line DSG1 2746, DSG2 2748. In an embodiment of the invention, the mask 4002 is aligned such that there is a lateral (i.e. in a direction substantially parallel to the main direction of the bit line select lines DSG1 2746, DSG2 2748) offset by, e.g., one memory cell string 2702, 2704, 2706, 2708, 2710, 2712, 2714, 2716. with regard to the placement of the respective bit line contacts 2738, 2740, 2742, 2744, so that by electrically contacting one bit line contact 2738, 2740, 2742, 2744, it will always only contact one switching element in a respective bit line select line DSG1 2746, DSG2 2748.

FIG. 41 shows a cross sectional view 4100 of a portion of a NAND Flash memory device along the cross section line C-C' of FIG. 40 in accordance with an embodiment of the invention.

The cross sectional view 4100 substantially corresponds to the previously described cross sectional view 3000, with the difference that the contact holes 2902 are not provided alternatingly every second memory cell string along a bit line select line, but in accordance with this embodiment, one "double" sized contact hole 4102 is provided for electrically contacting two adjacent memory cell strings along a respective bit line select line.

Next to the contact hole 4102, in a direction along a respective bit line select line, two floating gate regions remain completely covered by the coupling dielectric regions, followed by another "double" sized contact hole 4102, and so on, so that a regular alternating pattern results along a respective bit line select line is formed ("double" sized contact hole 4102; two floating gate regions still completely covered by the coupling dielectric regions; "double" sized contact hole 4102; two floating gate regions still completely covered by the coupling dielectric regions; . . . ). The contact hole 4102 will be filled with electrically conductive material as described with reference to FIG. 30.

The process of manufacturing the NAND Flash memory device 4000 of FIG. 40 is substantially the same as the process of manufacturing the NAND Flash memory device 2700 of FIG. 27 with the different size and positioning of the mask 4002 and therewith of the contact holes 4102. Therefore, reference is made in this regard to the description of the process of manufacturing the NAND Flash memory device 2700 of FIG. 27.

FIG. 42 shows a top view of a portion of a NAND Flash memory device 4200 in accordance with yet another embodiment of the invention.

This embodiment is similar to the NAND Flash memory device 2700 shown in FIG. 27 and therefore, only the difference of the NAND Flash memory device 4200 in accordance with this embodiment compared with the NAND Flash memory device 2700 shown in FIG. 27 will be described in the following.

In contrast to the NAND Flash memory device 2700 shown in FIG. 27, in accordance with this embodiment of the invention, the bit line select lines (e.g., a first bit line select line 4202 and a second bit line select line 4204) are provided in a metallization plane, e.g., in the first metallization plane above the gate stack (e.g., the polysilicon level) of the integrated circuit. In this case, a direct ohmic contact from the bit line select lines through the coupling dielectric regions (e.g., through a coupling dielectric breakthrough, e.g., through an ONO breakthrough) to the floating gate region is provided (e.g., the control gate region is omitted in this embodiment in the region in which the switching elements are formed, e.g., no third electrically conductive layer 2836 and no fourth electrically conductive layer 2838 are provided).

It should be mentioned that the embodiment in accordance with the NAND Flash memory device 4200 of FIG. 42 may be combined with the embodiment in accordance with the NAND Flash memory device 4000 of FIG. 40, in this case providing the previously described "double"-size contact holes.

Figure 43:
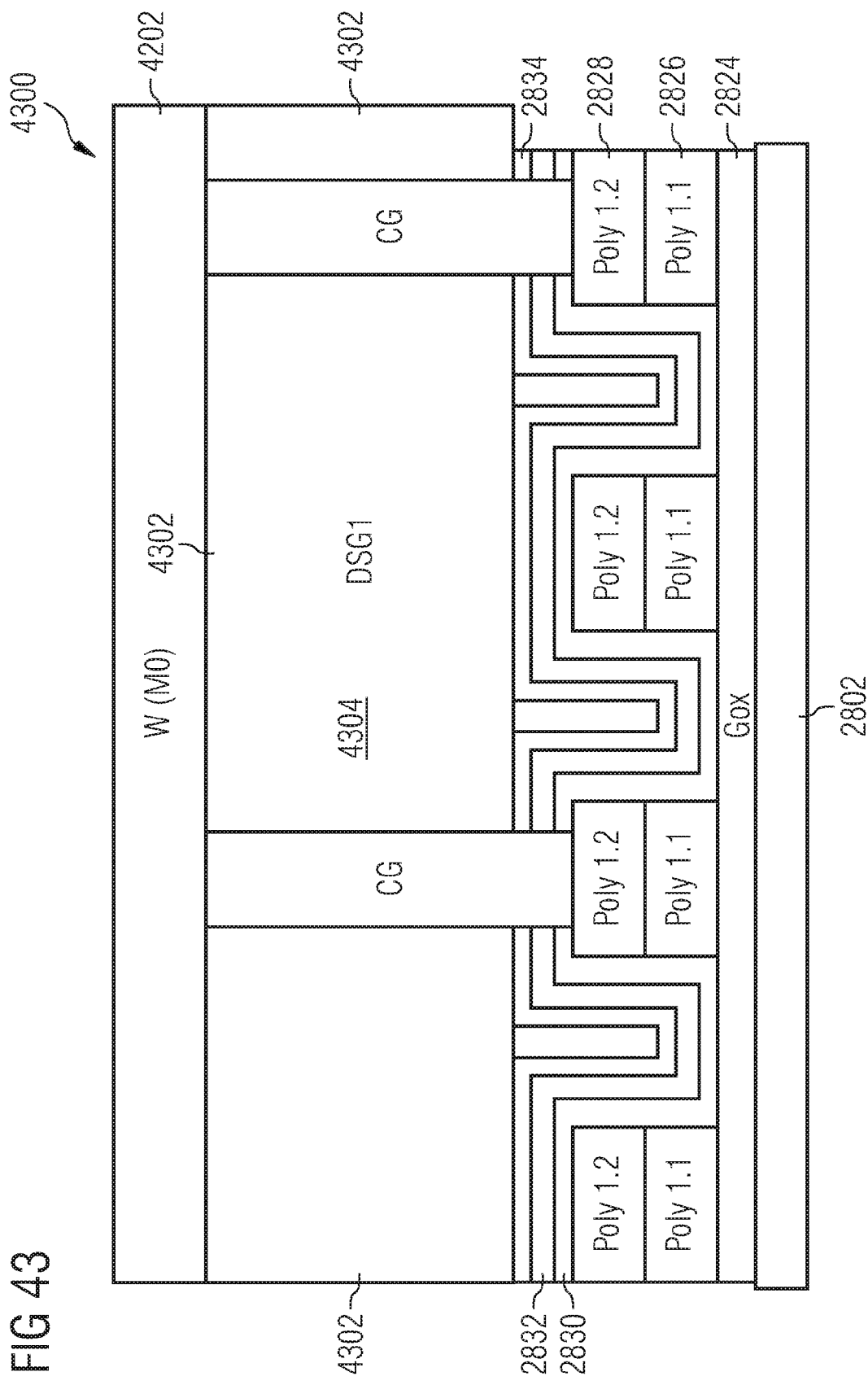
FIG. 43 shows a cross sectional view of a portion of a NAND Flash memory device along the cross section line C-C' of FIG. 42 in accordance with an embodiment of the invention.

FIG. 43 shows a cross sectional view 4300 of a portion of a NAND Flash memory device along the cross section line C-C' of FIG. 42 in accordance with an embodiment of the invention.

The cross sectional view 4300 substantially corresponds to the previously described cross sectional view 3000, with the difference that the control gate regions are omitted in this case in the regions in which the switching elements are manufactured. Instead of the control gate regions, isolating material 4302 is provided directly on the coupling dielectric region (e.g., on the upper surface of the upper oxide layer 2834). Furthermore, in this embodiment, a first metallization structure (also referred to as first metallization plane (M0)) is provided including the conductor tracks of the first metallization plane (M0). The metallic conductor tracks may be made of tungsten, aluminum or copper or any other suitable material and in one embodiment may include the bit line select lines (e.g., the first bit line select line 4202 and the second bit line select line 4204). Furthermore, contact holes 4304 may be provided through the isolating material 4302 and the respective portions of the coupling dielectric region and are filled with electrically conductive material such as tungsten or copper, for example. The filled contact holes 4304 provide an ohmic electrical contact between the bit line select lines and the exposed upper surface of the floating gate region (e.g., the exposed upper surface of the second electrically conductive layer 2828.

Figure 44B:
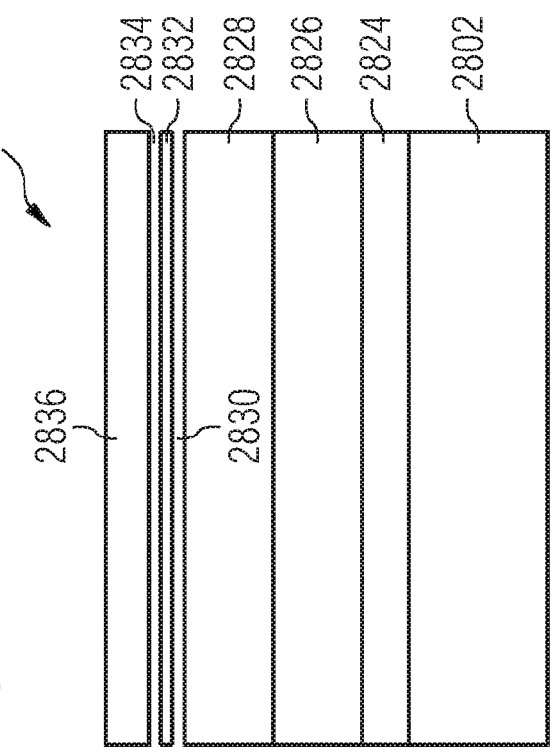
FIGS. 44A and 44B show cross sectional views of a portion of a NAND Flash memory device along the cross section line C-C' (FIG. 44A) and along the cross section line D-D' (FIG. 44B) of FIG. 42 at a first stage of its manufacture in accordance with an embodiment of the invention.
Figure 44A:
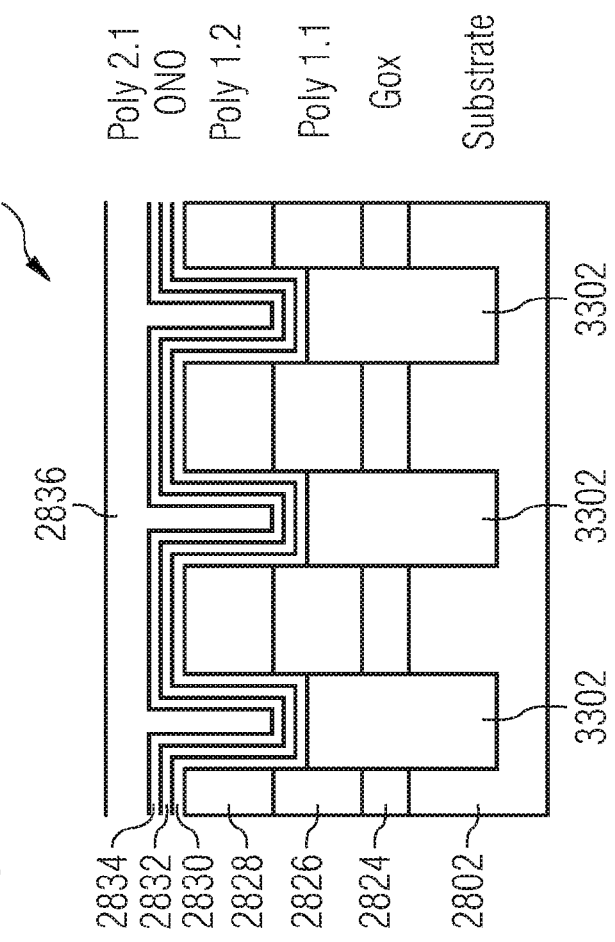

FIGS. 44A and 44B show cross sectional views of a portion of a NAND Flash memory device along the cross section line C-C' 4400 (FIG. 44A) and along the cross section line D-D' 4450 (FIG. 44B) of FIG. 42 at a first stage of its manufacture in accordance with an embodiment of the invention.

Up to this manufacturing state, the process in accordance with this embodiment of the invention corresponds to the manufacturing process described above with reference to FIGS. 31A, 31B and to FIGS. 33A, 33B. Therefore, in this embodiment, reference is made to the above description.

In this embodiment of the invention, using a lithography process and a corresponding etching process (e.g., an anisotropic etching such as, e.g., RIE), portions of the third electrically conductive layer 2836 are removed and the coupling dielectric region is opened only in the periphery area of the integrated circuit, thereby exposing the upper surface of the coupling dielectric region, e.g., the upper surface of the upper oxide layer 2834.

FIGS. 45A and 45B show cross sectional views of a portion of a NAND Flash memory device along the cross section line C-C' 4500 (FIG. 45A) and along the cross section line D-D' 4550 (FIG. 45B) of FIG. 42 at a second stage of its manufacture in accordance with an embodiment of the invention.

In a following process, the fourth electrically conductive layer 2838 is deposited, e.g., by means of a CVD process or a PVD process, followed by a deposition of a metallic region, e.g., formed by depositing a first metallic layer 2840 on or above the fourth electrically conductive layer 2838 and by depositing a second metallic layer 2842 on or above the first metallic layer 2840, e.g., by means of a CVD process or a PVD process.

In a subsequent process, a nitride layer 4502 (e.g., a silicon nitride layer 4502) is deposited on on or above the upper surface of the second metallic layer 2842, e.g., by means of a CVD process or a PVD process. Then, another auxiliary mask 4504 such as, e.g., a hardmask (e.g., made of a nitride, an oxide or carbon) is deposited on on or above the upper surface of the nitride layer 4502.

FIGS. 46A and 46B show cross sectional views of a portion of a NAND Flash memory device along the cross section line C-C' 4600 (FIG. 46A) and along the cross section line D-D' 4650 (FIG. 46B) of FIG. 42 at a third stage of its manufacture in accordance with an embodiment of the invention.

Next, using the auxiliary mask 4502 as a mask, an anisotropic etching process such as a RIE process is carried out to etch a first portion of gate contact trenches 4652 with an etching stop on the upper surface of the coupling dielectric region, e.g., with an etching stop on the upper surface of the upper oxide layer 2834. It should be mentioned that the nitride encapsulation of the second metallic layer 2842 (e.g., W) is not shown in the figures.

Figures 47A, 47B:
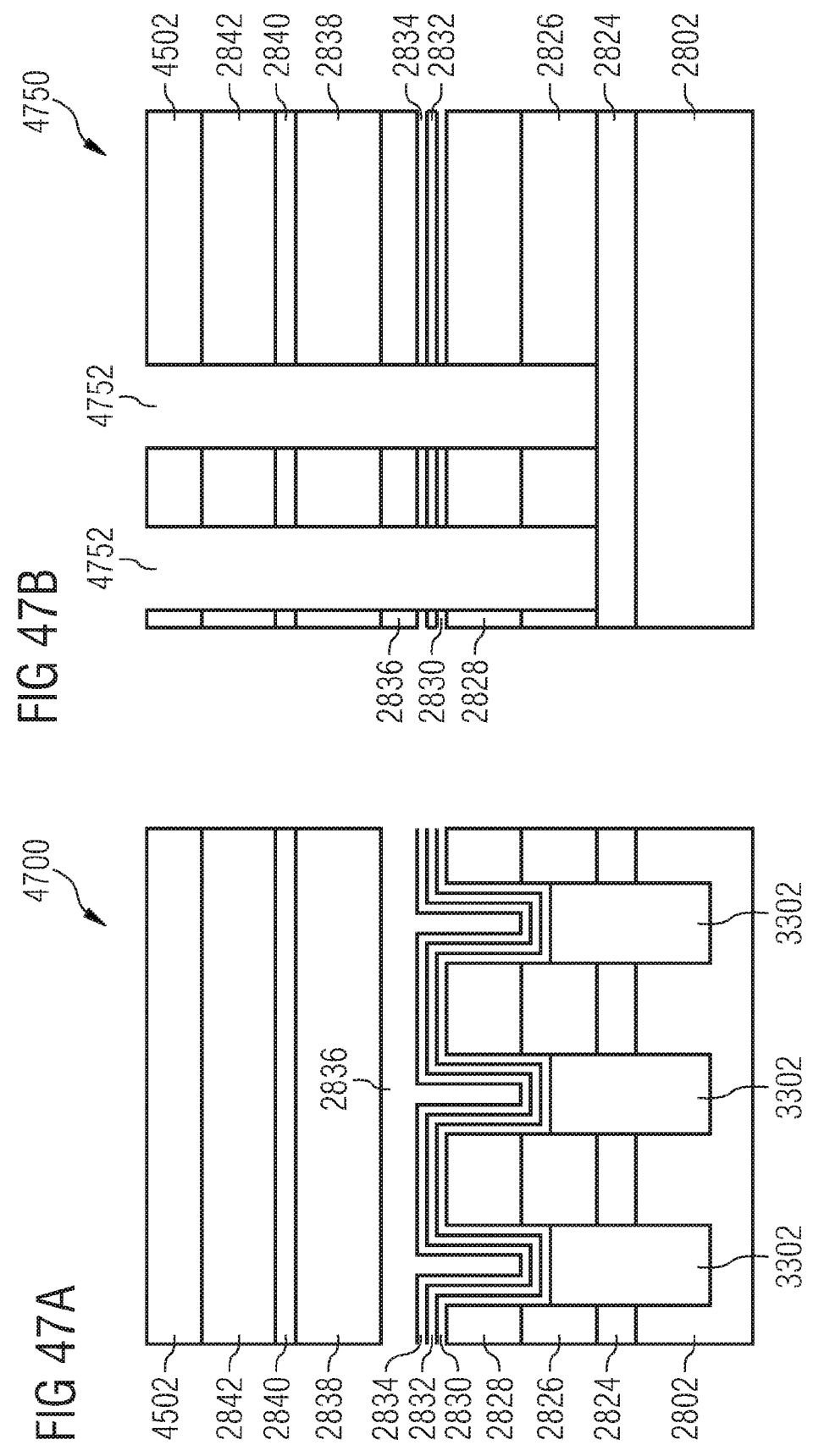

FIGS. 47A and 47B show cross sectional views of a portion of a NAND Flash memory device along the cross section line C-C' 4700 (FIG. 47A) and along the cross section line D-D' 4750 (FIG. 47B) of FIG. 42 at a fourth stage of its manufacture in accordance with an embodiment of the invention.

Then, a final gate contact etching process is carried out of the still exposed gate contact trenches 4652. The etching process may be an anisotropic etching such as, e.g., a RIE process. The final gate contact etching process may be carried out such that the upper surface of the gate dielectric layer 2824 is exposed, thereby forming final gate contact trenches 4752.

FIGS. 48A and 48B show cross sectional views of a portion of a NAND Flash memory device along the cross section line C-C' 4800 (FIG. 48A) and along the cross section line D-D' 4850 (FIG. 48B) of FIG. 42 at a fifth stage of its manufacture in accordance with an embodiment of the invention.

In the following, the source/drain junctions of the transistors are optionally implanted. Then, spacers (not shown) may be formed (e.g., made of silicon oxide) and a further implantation process is carried out for the formation of the source/drain junctions of the transistors. Next, pre-metal dielectric material 4852 are deposited, followed by a CMP process to remove the pre-metal dielectric overfilling the final gate contact trenches 4752.

FIGS. 49A and 49B show cross sectional views of a portion of a NAND Flash memory device along the cross section line C-C' 4900 (FIG. 49A) and along the cross section line D-D' 4950 (FIG. 49B) of FIG. 42 at a sixth stage of its manufacture in accordance with an embodiment of the invention.

Next, another auxiliary mask 4952 (e.g., a hardmask e.g., made of a nitride, an oxide or of carbon) is deposited and patterned using a lithography process such that the region in which the bit line contact lines are to be formed, are exposed and can be removed in a subsequent process.

FIGS. 50A and 50B show cross sectional views of a portion of a NAND Flash memory device along the cross section line C-C' 5000 (FIG. 50A) and along the cross section line D-D' 5050 (FIG. 50B) of FIG. 42 at a seventh stage of its manufacture in accordance with an embodiment of the invention.

Then, in the regions exposed of the auxiliary mask 4952, using an anisotropic etching process such as, e.g., a RIE process, the material of the third electrically conductive layer 2836, the fourth electrically conductive layer 2838, the first metallic layer 2840 and the second metallic layer 2842 is removed. In an embodiment of the invention, the anisotropic etching process is stopped at the upper surface of the coupling dielectric region, e.g., at the upper surface of the upper oxide layer 2834.

The thus formed recesses are filled and overfilled with a dielectric material 5052 such as an oxide (e.g., silicon oxide) or a nitride (e.g., silicon nitride) by means of a deposition process such as, e.g., a CVD process or a PVD process.

FIGS. 51A and 51B show cross sectional views of a portion of a NAND Flash memory device along the cross section line C-C' 5100 (FIG. 51A) and along the cross section line D-D' 5150 (FIG. 51B) of FIG. 42 at an eighth stage of its manufacture in accordance with an embodiment of the invention.

Then, in the regions, in which the bit line contact lines should be formed, contact trenches are formed (e.g., by means of an anisotropic etching such as, e.g., a RIE process), wherein the contact trenches are so deep that the upper surface of portions of the coupling dielectric region is exposed (e.g., portions of the upper surface of the upper oxide layer 2834). The contact trenches are then filled with electrically conductive material 5152 such as, e.g., tungsten or copper.

FIGS. 52A and 52B show cross sectional views of a portion of a NAND Flash memory device along the cross section line C-C' 5200 (FIG. 52A) and along the cross section line D-D' 5250 (FIG. 52B) of FIG. 42 at a ninth stage of its manufacture in accordance with an embodiment of the invention.

In a subsequent process, the metal 5202 of the first metalization plane (also referred to as M0) is deposited and patterned, thereby forming, e.g., conductor tracks 5252 forming the bit line contact lines.

Figure 53A:
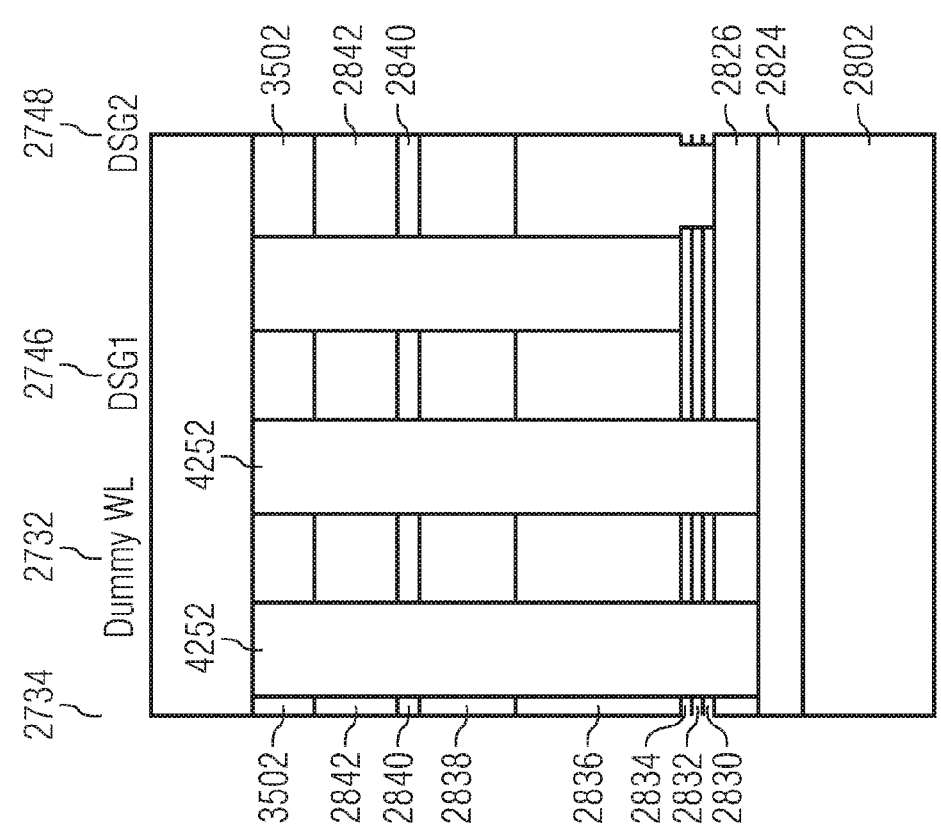
FIGS. 53A and 53B show cross sectional views of a portion of a NAND Flash memory device along the cross section line A-A' (FIG. 53A) and along the cross section line D-D' (FIG. 53B) of FIG. 27 in accordance with yet another embodiment of the invention.
Figure 53B:
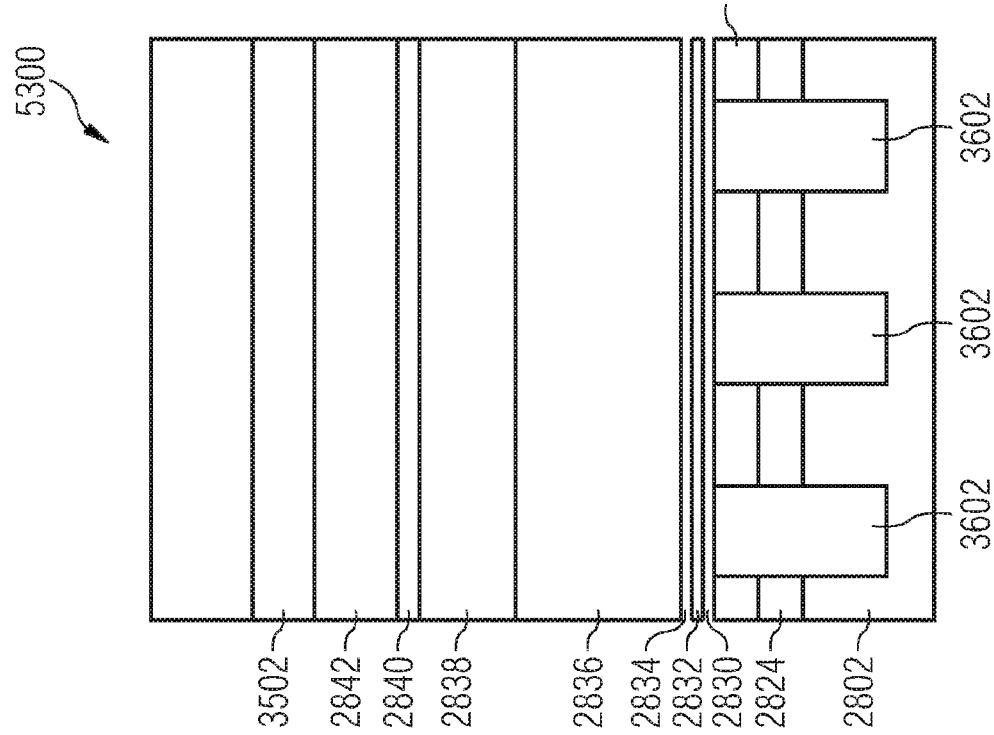

FIGS. 53A and 53B show cross sectional views of a portion of a NAND Flash memory device along the cross section line A-A' 5300 (FIG. 53A) and along the cross section line D-D' 5350 (FIG. 53B) of FIG. 27 in accordance with another embodiment of the invention.

This embodiment is similar to the NAND Flash memory device 2700 shown in FIG. 27 and therefore, only the difference of the NAND Flash memory device 5300 in accordance with this embodiment compared with the NAND Flash memory device 2700 shown in FIG. 27 will be described in the following.

The difference of the NAND Flash memory device 5300 to the NAND Flash memory device 2700 shown in FIG. 27 is that the floating gate region in this case merely consists of one electrically conductive layer, e.g., the first electrically conductive layer 2826. The other elements are the same as the elements of the NAND Flash memory device 2700. Furthermore, the process of manufacturing is the same as the corresponding process described above with reference to the FIGS. 31A and 31B to FIGS. 39A and 39B.

It should be mentioned that the above described embodiments may be combined with each other.

As described above, in various embodiments of the invention, a shared bit line scheme with a regular array of self aligned poly select gates is provided that are contacted alternatingly by checkerboard contacts to two or more conducting select lines.

In an embodiment of the invention, checkerboard contacts are provided between self aligned floating gate polysilicon (in general, e.g., the floating gate region) and control gate polysilicon (in general, e.g., the control gate region).

Furthermore, in an embodiment of the invention, checkerboard contacts may be provided on top of two self aligned floating gate polysilicon regions and control gate polysilicon regions, thereby relaxing the pitch of the bit contact.

In another embodiment of the invention, checkerboard contacts may be provided between self aligned floating gate polysilicon to conductor tracks of the first metallization plane (M0).

Figure 54:
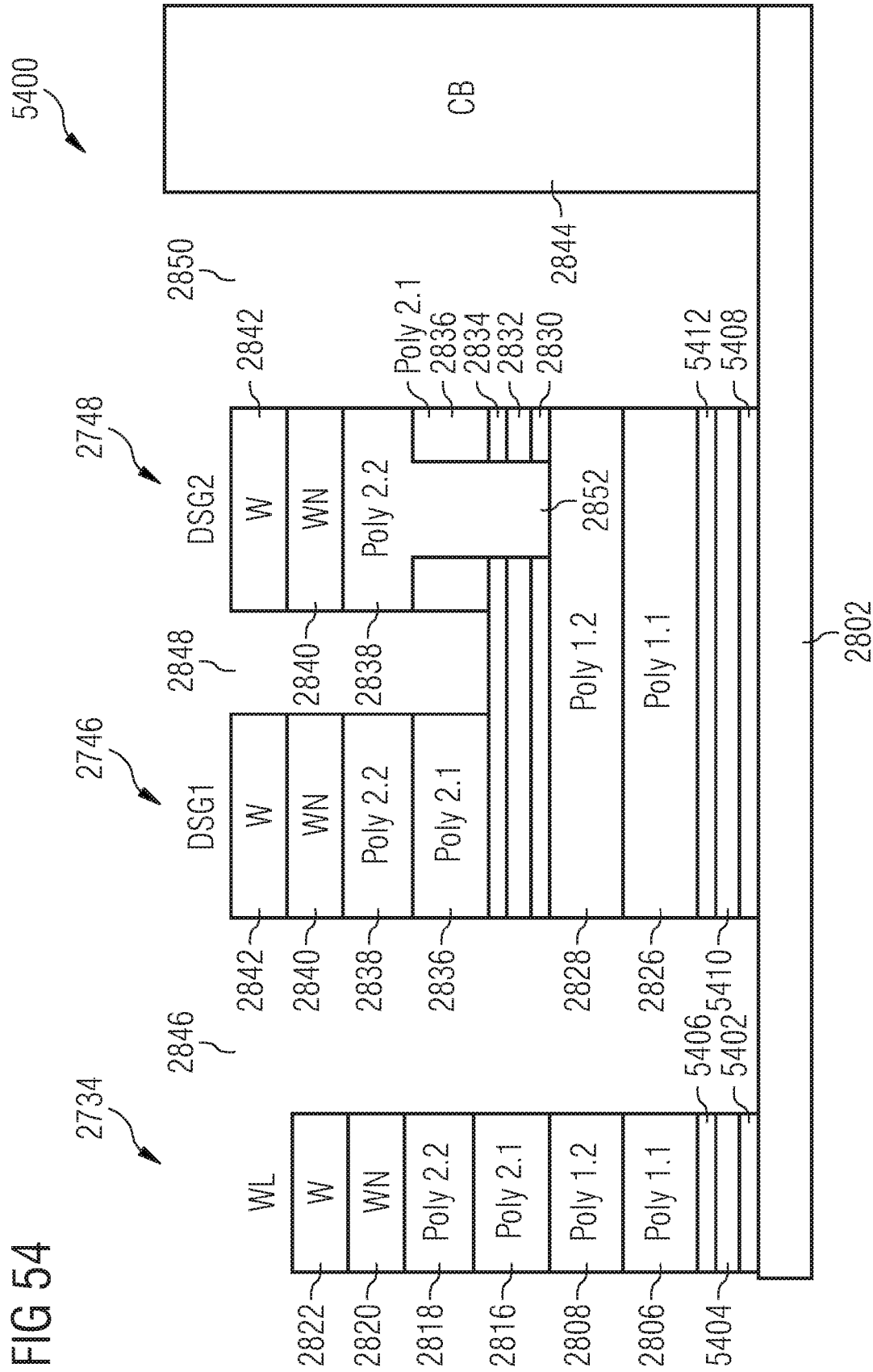
FIG. 54 shows a cross sectional view of a portion of a NAND Flash memory device along the cross section line A-A' of FIG. 27 in accordance with another embodiment of the invention.
Figure 55:
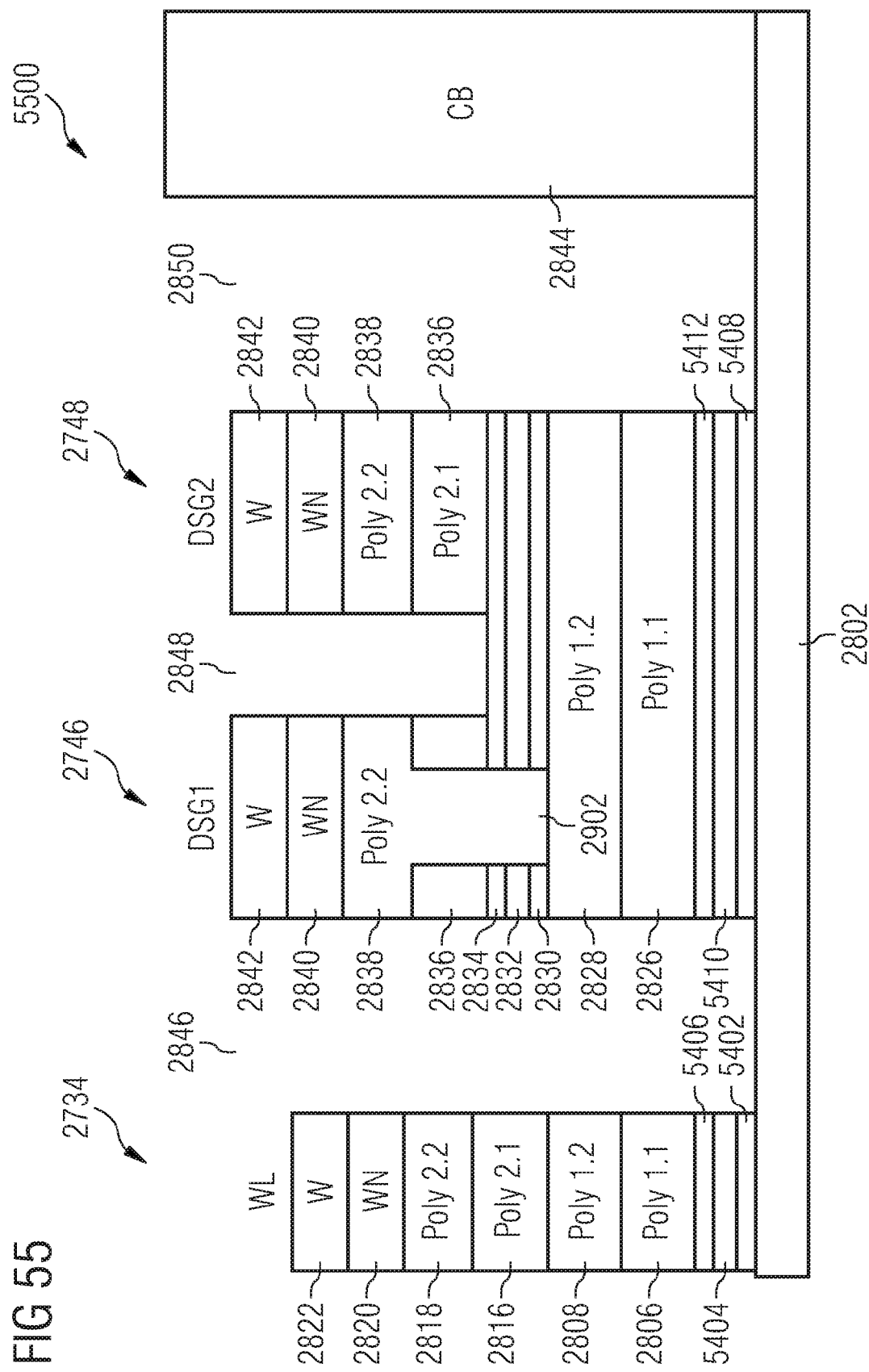
FIG. 55 shows a cross sectional view of a portion of a NAND Flash memory device along the cross section line B-B' of FIG. 27 in accordance with another embodiment of the invention.
Figure 56:
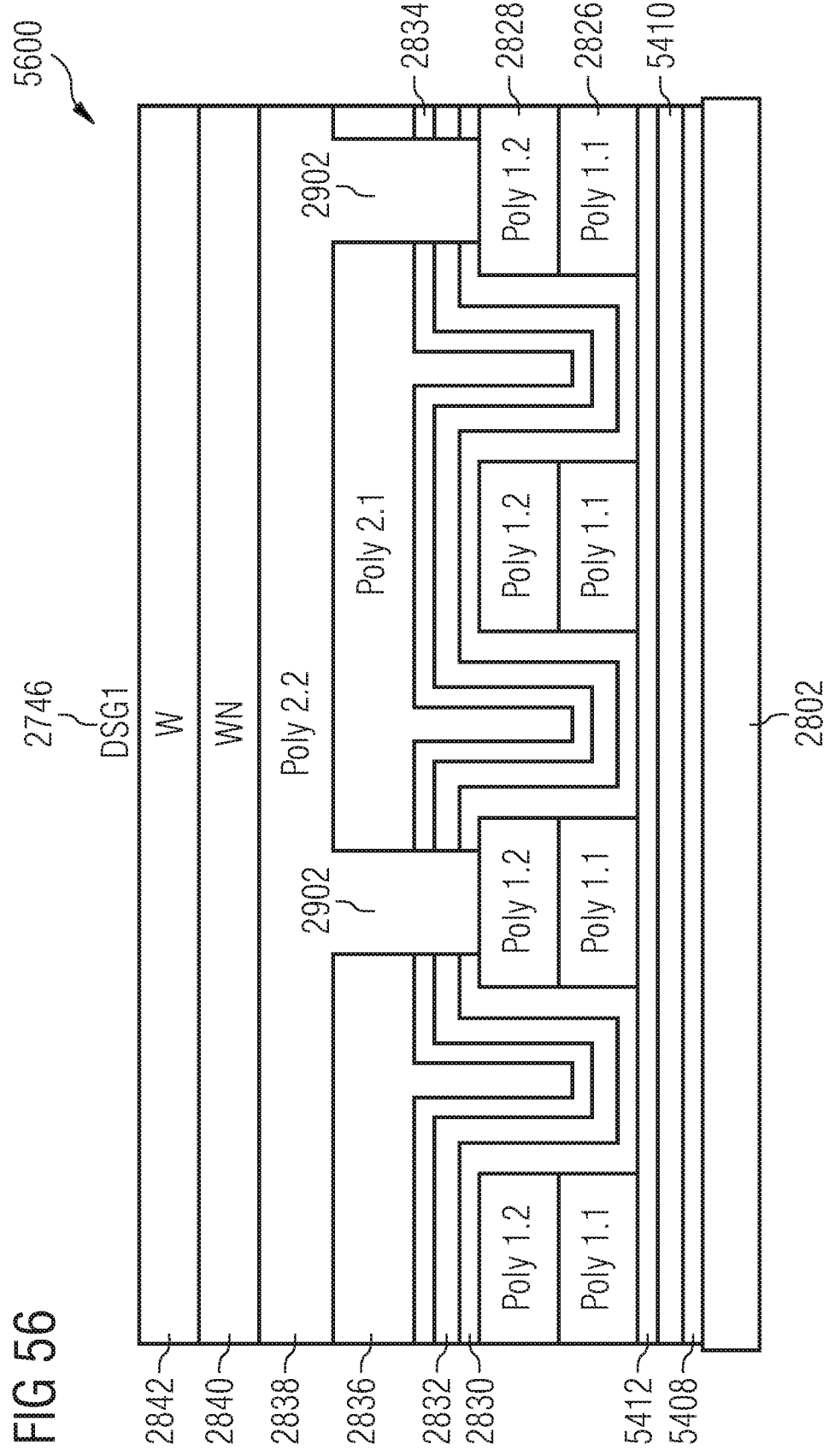
FIG. 56 shows a cross sectional view of a portion of a NAND Flash memory device along the cross section line C-C' of FIG. 27 in accordance with another embodiment of the invention.

FIG. 54 shows a cross sectional view 5400 of a portion of a NAND Flash memory device along the cross section line A-A' of FIG. 27 in accordance with another embodiment of the invention. FIG. 55 shows a cross sectional view 5500 of a portion of a NAND Flash memory device along the cross section line B-B' of FIG. 27 in accordance with the other embodiment of the invention. FIG. 56 shows a cross sectional view 5600 of a portion of a NAND Flash memory device along the cross section line C-C' of FIG. 56 in accordance with the other embodiment of the invention.

This embodiment is similar to the embodiment of the NAND Flash memory device 2700 shown in the FIGS. 28, 29 and 30 and therefore, only the difference of the embodiment of the NAND Flash memory device 2700 in accordance with this embodiment shown in the FIGS. 54, 55 and 56 compared with the embodiment of the NAND Flash memory device 2700 shown in the FIGS. 28, 29 and 30 will be described in the following.

In this embodiment, the memory cells are configured as charge trapping memory cells instead of floating gate memory cells in the embodiments shown in the FIGS. 28, 29 and 30.

In this embodiment of the invention, the material of the gate layer disposed on the gate dielectric layer may be selected as any electrically conductive material that is available in the manufacturing process used. In an embodiment of the invention, the material of the gate layer disposed on the gate dielectric layer may be a metal such as, e.g., W, TaN, WN, electrically conductive carbon or a doped poly-silicon (e.g., $p^+$-doped poly-silicon, e.g., poly-silicon being heavily doped with boron, $BF_2$ or indium).

As shown in FIG. 54, in the structure of the dummy word line and in the structure of the word lines (e.g., the word line 2734) the tunnel dielectric layer (e.g., a tunnel oxide layer) 2804 of the embodiment shown in the FIGS. 28, 29 and 30 is replaced by a charge trapping structure as, e.g., a charge trapping layer stack as described above. In an embodiment of the invention, the charge trapping structure may include a layer stack of three dielectric layers, such as, e.g., a bottom oxide layer (e.g. made of silicon oxide) 5402 on or above the substrate 2802, a nitride layer (e.g., made of silicon nitride) 5404 on or above the bottom oxide layer 5402, and an upper oxide layer (e.g., made of silicon oxide or aluminum oxide) 5406 on or above the nitride layer 5404. Another difference may be seen in that the coupling dielectric region (e.g., including the bottom oxide layer 2810, the nitride layer 2812 and the upper oxide layer 2814 is omitted (more specifically removed) in the layer stack of the structure of the dummy word line and the word lines.

Furthermore, in the structure of the first bit line select line DSG1 2746 and the second bit line select line DSG2 2748 at the crossing points with the memory cell strings, the gate dielectric layer (e.g., a gate oxide layer) 2824 may also be replaced by a charge trapping structure as, e.g., a charge trapping layer stack as described above. In an embodiment of the invention, the charge trapping structure may include a layer stack of three dielectric layers, such as, e.g., a bottom oxide layer (e.g., made of silicon oxide) 5408 on or above the substrate 2802, a nitride layer (e.g., made of silicon nitride) 5410 on or above the bottom oxide layer 5408, and an upper oxide layer (e.g., made of silicon oxide or aluminum oxide)

5412 on or above the nitride layer 5408. It should be mentioned that in an alternative embodiment of the invention, the charge trapping structure in the structure of the first bit line select line DSG1 2746 and the second bit line select line DSG2 2748 may be replaced by a single oxide layer such as, e.g., the gate dielectric layer (e.g., a gate oxide layer) 2824.

The process of manufacturing is similar to the embodiment of the NAND Flash memory device 2700 shown in the FIGS. 28, 29 and 30 with the difference that in the process of forming the contact hole 2852, a different mask is used, thereby not only forming the ONO breakthrough but in this case substantially entirely also removing the coupling gate region in the structure of the dummy word line and the word lines.

FIG. 57 shows a cross sectional view 5700 of a portion of a NAND Flash memory device along the cross section line C-C' of FIG. 42 in accordance with another embodiment of the invention.

This embodiment is similar to the embodiment of the NAND Flash memory device 4200 shown in the FIGS. 42 to 53B and therefore, only the difference of the embodiment of the NAND Flash memory device 2700 in accordance with this embodiment shown in the FIG. 57 compared with the embodiment of the NAND Flash memory device 2700 shown in the FIGS. 42 to 53B will be described in the following.

In this embodiment, the memory cells are configured as charge trapping memory cells instead of floating gate memory cells in the embodiments shown in the FIGS. 42 to 53B.

Thus, in this embodiment of the invention, the tunnel dielectric layer (e.g. a tunnel oxide layer) 2804 and the gate dielectric layer (e.g., a gate oxide layer) 2824 of the embodiment shown in the FIGS. 42 to 53B is replaced by a charge trapping structure as, e.g., a charge trapping layer stack as described above. In an embodiment of the invention, the charge trapping structure may include a layer stack of three dielectric layers, such as, e.g., a bottom oxide layer (e.g., made of silicon oxide) 5702 on or above the substrate 2802, a nitride layer (e.g., made of silicon nitride) 5704 on or above the bottom oxide layer 5702, and an upper oxide layer (e.g., made of silicon oxide or aluminum oxide) 5706 on or above the nitride layer 5704.

FIG. 58 shows a cross sectional view 5800 of a portion of a NAND Flash memory device along the cross section line C-C' of FIG. 42 in accordance with another embodiment of the invention.

As shown in FIG. 58, in an embodiment of the invention, the coupling dielectric region including, e.g., the layer stack of several dielectric layers, e.g., the three dielectric layers, such as, e.g., the bottom oxide layer 2830, the nitride layer 2832 and the upper oxide layer 2834 may be omitted, e.g., also removed (e.g., etched) during the manufacturing process.

FIG. 59 shows a top view of an integrated circuit including a switch structure 5900, e.g., a local switch structure 5900, in accordance with another embodiment of the invention.

The switch structure 5900 includes a plurality of adjacent electrically conductive lines 5902 which are respectively coupled to a plurality of memory cells (not shown in FIG. 59). The memory cells may be of any type, e.g., of a type as described above. The electrically conductive lines 5902 may be bit lines, e.g., buried bit lines.

As shown in FIG. 59, the switch structure 5900 further includes a plurality of select lines to select a respective electrically conductive line 5902. In an embodiment of the invention, three select lines, e.g., a first select line 5904, a second select line 5906 and a third select line 5908, are provided crossing all of the plurality of electrically conductive lines 5902. Furthermore, a plurality of switching elements may be provided, wherein a first switching element is coupled to first memory cells arranged along a first electrically conductive line of the electrically conductive lines 5902, a second switching element may be coupled to second memory cells arranged along a second electrically conductive line which is located adjacent to the first electrically conductive line, and a third switching element may be coupled to third memory cells arranged along a third electrically conductive line which is located adjacent to the second electrically conductive line. The first electrically conductive line, the second electrically conductive line and the third electrically conductive line are all electrically coupled to the same common contact 5910 of a plurality of contacts 5910 which will be described in more detail below. The first switching element includes a control gate region 5912 which has a portion below or above a portion of the first select line 5904, the second select line 5906 and the third select line 5908, wherein the control gate region 5912 extends along the first electrically conductive line. The second switching element also includes a control gate region 5912 which has a portion below or above a portion of the first select line 5904, the second select line 5906 and the third select line 5908, wherein the control gate region 5912 extends along the second electrically conductive line. The third switching element also includes a control gate region 5912 which has a portion below or above a portion of the first select line 5904, the second select line 5906 and the third select line 5908, wherein the control gate region 5912 extends along the third electrically conductive line. Thus, in an embodiment of the invention, the control gate regions 5912 have an increased gate length by at least a factor of three compared to a conventional control gate region in a switch structure.

The switch structure 5900 further may include a plurality of contacts 5910, wherein each contact 5910 is provided to electrically contact three respective electrically conductive lines 5902, e.g. with another electrically conductive structure (e.g., metallically conductive structure) which may be provided in another manufacturing plane (e.g., in metallization plane) above or below the switch structure 5900 in an integrated circuit.

Furthermore, switch contacts 5914 are provided to contact the respective control gate region 5912 of a respective one of the three respective electrically conductive lines 5902.

Thus, a three times three local switching matrix may be provided for each adjacent three electrically conductive lines 5902.

FIG. 60 shows a top view of a portion of a NAND Flash memory device 6000 in accordance with an embodiment of the invention.

As shown in FIG. 60, the portion of the NAND Flash memory device 6000 may include a plurality of NAND memory cell strings 6002, 6004, 6006, 6008 of straight active areas between oxide filled STI isolations 6010, 6012, 6014 as well as word lines (not shown) and select gates that cross these active areas and form respective memory cells and select gates, e.g., in the form of transistors, e.g., in the form of metal-oxide-semiconductor (MOS) transistors, e.g., in the form of field effect transistors. The select gates are coupled with each other via bit line select lines (e.g., a first bit line select line 6016 and a second bit line select line 6018). Except for the arrangement of the bit line contacts 6020, 6022 which will be described in more detail below, the NAND Flash memory device 6000 may include the same components as the NAND Flash memory devices in accordance with the previously described embodiments and will therefore not be described again. In an embodiment of the invention, the arrangement of the bit line contacts 6020, 6022 may be selected such that bit line contacts of respectively two adjacent NAND memory cell strings 6002, 6004, 6006, 6008 are electrically (e.g., ohmically) coupled with each other (e.g., short-circuited), thereby forming a respective (laterally) "double-sized" (e.g., having a width of 3 F) bit line contact 6020, 6022, wherein each bit line contact 6020, 6022 contacts two adjacent NAND memory cell strings 6002, 6004, 6006, 6008. The bit line contacts 6020, 6022 are in turn isolated from each other and they are displaced with respect to each other in the current flow direction through the NAND memory cell strings 6002, 6004, 6006, 6008 (i.e., vertically, seen in FIG. 60). In an embodiment of the invention, the displacement is at least half the width of the bit line contacts 6020, 6022, so there is no lateral overlap of the bit line contacts 6020, 6022, in other words, such that there is no overlap in the current flow direction along the bit line select lines.

Furthermore, the normally-off switching elements 6024 are shown in FIG. 60, which are formed in the same way as, e.g., described above with reference to FIG. 27.

Thus, illustratively, a pair wise checkerboard-like arrangement of the bit line contacts 6020, 6022 is provided in accordance with an embodiment of the invention. Furthermore, illustratively, the bit line contacts 6020, 6022 are arranged in a staggered manner relative to each other.

In accordance with this embodiment of the invention, a relaxation of the bit line contact pitch can be achieved. Furthermore, a reduction of process complexity may also be achieved, since the bit line contacts can be printed directly instead of using pitchfrag processes.

The bit line contact arrangement in accordance with this embodiment of the invention may be applied to any of the above described embodiments.

FIGS. 61A to 61F show top views of a bit line contact portion of a NAND Flash memory device in accordance with an embodiment of the invention at various stages of its manufacture.

In an embodiment of the invention, lines 6102 (e.g., made of a photo resist or of hardmask material such as, e.g., an oxide, a nitride or carbon) are deposited, e.g., printed, e.g., having a first width $W_1$ 6104 (see structure 6100 in FIG. 61A), e.g., on or above an isolating material 6108 (e.g. an oxide (e.g. silicon oxide) or a nitride (e.g., silicon nitride). The first width $W_1$ 6104 may be in the range of about 120 nm to about 170 nm, e.g., in the range of about 130 nm to about 150 nm, e.g., about 144 nm. In an embodiment of the invention, the first width $W_1$ 6104 is 4 F. The shortest distance $D_1$ 6106 between respective two lines 6102 is, e.g., 4 F, i.e., e.g., about 108 nm in an example, in which F of the available process is 36 nm.

Then, the lines 6102 are thinned (e.g., by 1 F respectively) to thinned lines 6112 having a second width $W_2$ 6114 (see structure 6110 in FIG. 61B) using another auxiliary mask (e.g., a hardmask, e.g., made of a nitride, an oxide or carbon), wherein the second width $W_2$ 6114 may be in the range of about 90 nm to about 120 nm, e.g., in the range of about 100 nm to about 110 nm, e.g., about 108 nm. In an embodiment of the invention, the second width $W_2$ 6114 is 3 F. The shortest distance $D_2$ 6116 between respective two thinned lines 6112 is, e.g., 5 F, i.e., e.g., about 190 nm in the example, in which F of the available process is 36 nm.

Figure 61A:
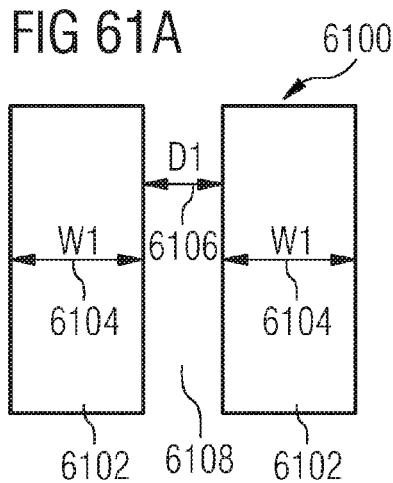
FIGS. 61A to 61F show top views of a bit line contact portion of a NAND Flash memory device in accordance with an embodiment of the invention at various stages of its manufacture.
Figure 61B:
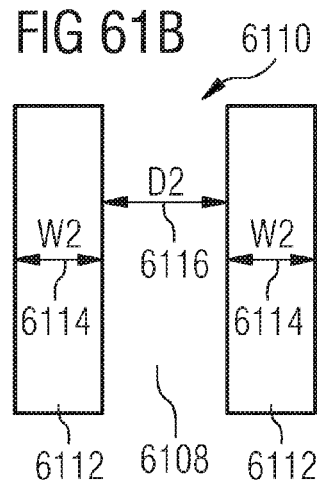
Figure 61C:
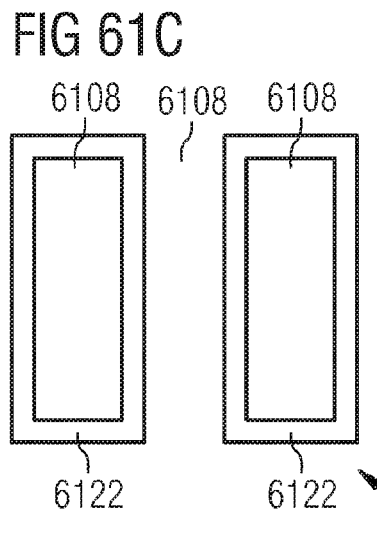

Then, as shown in the structure 6120 in FIG. 61C, spacers 6122 are formed that fully surround the thinned lines 6112. The spacers 6122 may be made of, e.g., an oxide (e.g., silicon oxide) or a nitride (e.g., silicon nitride) and may have a spacer thickness in the range of about 30 nm to about 40 nm, e.g., a spacer thickness of about 36 nm. In an embodiment of the invention, the spacers 6122 may have a thickness of 1 F. Next, the thinned lines 6112 are removed selective to the spacers 6122, thereby exposing the upper surface of the isolating material 6108, e.g., the oxide, within the rectangular freestanding structure formed by the spacers 6122.

Figure 61D:
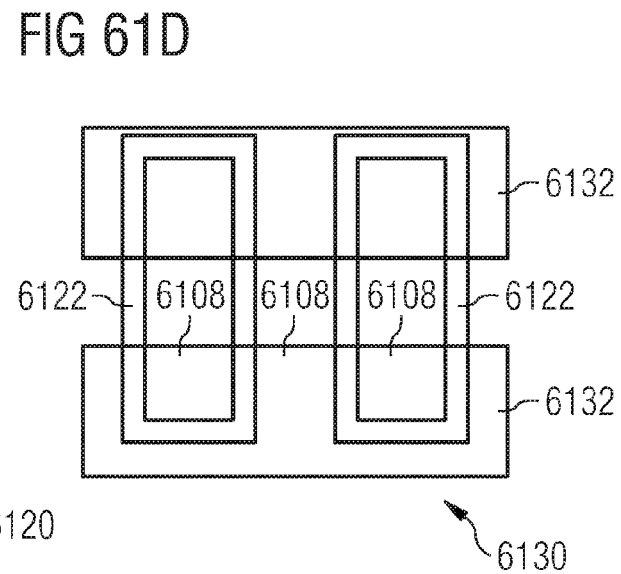
Figure 61E:
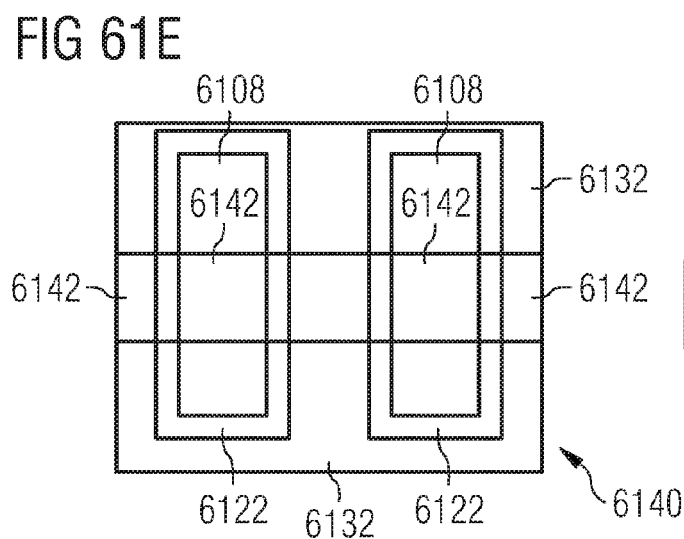

Next, in an embodiment, a lithography process is provided using a mask 6132 exposing those regions 6134 of the integrated circuit, in which the bit line contacts should be formed (see structure 6130 in FIG. 61D). Then, the isolating material 6108, e.g., the oxide, is removed using the mask 6132 and the spacers 6122 as etching masks. As will be described in more detail below, the etching process is stopped on a liner material 6142 (see structure 6140 in FIG. 61E).

Figure 61F:
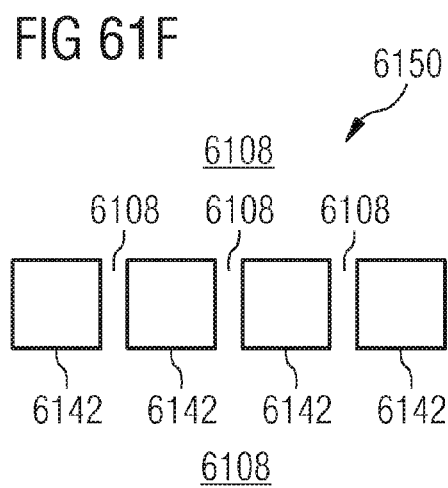

Then, the spacers 6122 are removed, thereby exposing portions of the isolating material 6108 between the exposed liner material 6142 portions (see structure 6150 in FIG. 61F).

FIG. 62 shows a cross sectional view 6200 of the bit line contact portion of a NAND Flash memory device along the cross section line A-A' of FIG. 60 at a first stage of its manufacture in accordance with an embodiment of the invention.

FIG. 62 shows the NAND memory cell strings 6004, 6006, 6008 and the STI isolations 6010, 6012, 6014. Furthermore, a liner layer 6202 is provided on or above the upper surface of the NAND memory cell strings 6004, 6006, 6008 and the STI isolations 6010, 6012, 6014. The liner layer 6202 may be made of any isolating material that is selectively etchable with regard to the isolating material 6108. In the embodiment, in which the isolating material is silicon oxide, the liner layer 6202 may be made of a nitride such as, e.g., silicon nitride. The liner layer 6202 may have a layer thickness in the range of about 5 nm to about 20 nm, e.g., a layer thickness of about 10 nm. The isolating material 6108 is provided on or above the liner layer 6202. As shown in FIG. 62, patterned spacers 6122 are provided on or above the isolating material 6108. Thus, the cross-sectional view 6200 corresponds to the manufacturing stage shown in and described with reference to FIG. 61D.

FIG. 63 shows a cross sectional view 6300 of the bit line contact portion of a NAND Flash memory device along the cross section line A-A' of FIG. 60 at a second stage of its manufacture in accordance with an embodiment of the invention.

Then, as described above with reference with FIG. 61E, the exposed regions of the isolating material 6108 (i.e., those regions of the isolating material 6108 which are not covered by the spacers 6122, are removed, thereby exposing the upper suface of the liner layer 6202 in these regions, thereby forming trenches 6302 having a trench width TW 6304 of about 3 F, for example.

Figure 64:
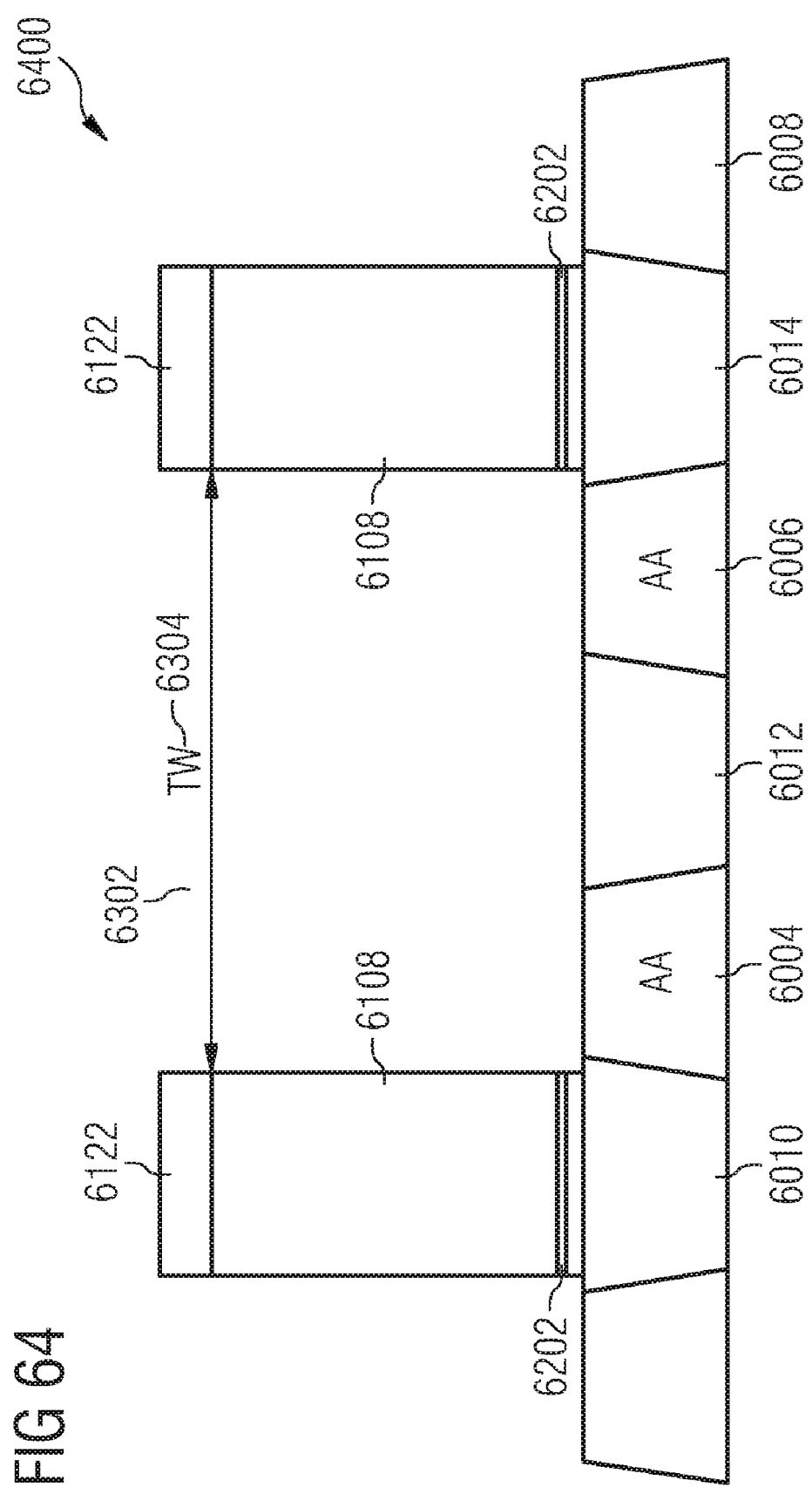
FIG. 64 shows a cross sectional view of the bit line contact portion of a NAND Flash memory device along the cross section line A-A' of FIG. 60 at a third stage of its manufacture in accordance with an embodiment of the invention.

FIG. 64 shows a cross sectional view 6400 of the bit line contact portion of a NAND Flash memory device along the cross section line A-A' of FIG. 60 at a third stage of its manufacture in accordance with an embodiment of the invention.

In a following step, the exposed regions of the liner layer 6202 are removed, thereby exposing the upper surface of portions of the NAND memory cell strings 6004, 6006, 6008 and the STI isolations 6010, 6012, 6014.

FIG. 65 shows a cross sectional view 6500 of the bit line contact portion of a NAND Flash memory device along the cross section line A-A' of FIG. 60 at a fourth stage of its manufacture in accordance with an embodiment of the invention.

Then, in accordance with a damascene process, the metal (e.g., tungsten or copper or aluminum) used for the bit line contacts 6020, 6022 is deposited and the metal that overfills the trenches 6302 may be removed, e.g., using a CMP process.

Figure 66A:
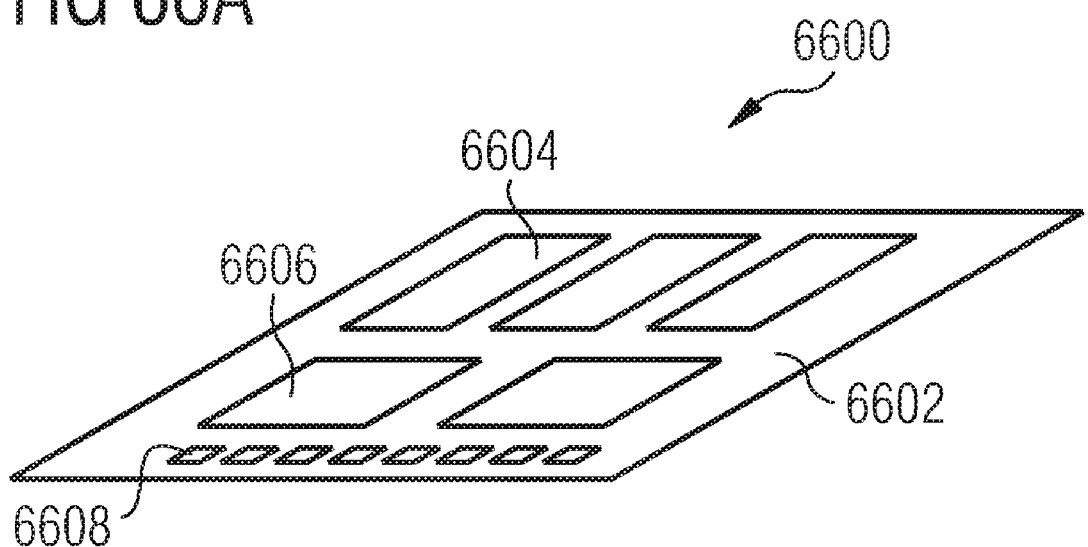
FIGS. 66A and 66B show a memory module (FIG. 66A) and a stackable memory module (FIG. 66B) in accordance with an embodiment of the invention.
Figure 66B:
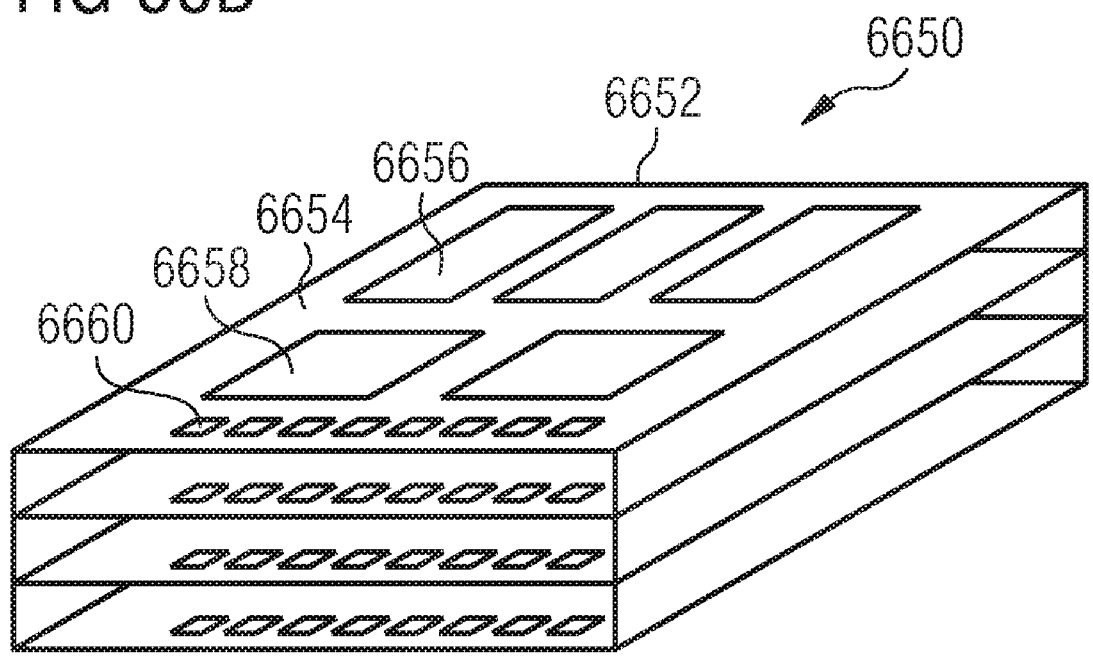

As shown in FIGS. 66A and 66B, in some embodiments, memory devices such as those described herein may be used in modules. In FIG. 66A, a memory module 6600 is shown, on which one or more memory devices 6604 are arranged on a substrate 6602. The memory device 6604 may include numerous memory cells, each of which uses a memory element in accordance with an embodiment of the invention. The memory module 6600 may also include one or more electronic devices 6606, which may include memory, processing circuitry, control circuitry, addressing circuitry, bus interconnection circuitry, or other circuitry or electronic devices that may be combined on a module with a memory device, such as the memory device 6604. Additionally, the memory module 6600 includes multiple electrical connections 6608, which may be used to connect the memory module 6600 to other electronic components, including other modules.

As shown in FIG. 66B, in some embodiments, these modules may be stackable, to form a stack 6650. For example, a stackable memory module 6652 may contain one or more memory devices 6656, arranged on a stackable substrate 6654. The memory device 6656 contains memory cells that employ memory elements in accordance with an embodiment of the invention. The stackable memory module 6652 may also include one or more electronic devices 6658, which may include memory, processing circuitry, control circuitry, addressing circuitry, bus interconnection circuitry, or other circuitry or electronic devices that may be combined on a module with a memory device, such as the memory device 6656. Electrical connections 6660 are used to connect the stackable memory module 6652 with other modules in the stack 6650, or with other electronic devices. Other modules in the stack 6650 may include additional stackable memory modules, similar to the stackable memory module 6652 described above, or other types of stackable modules, such as stackable processing modules, control modules, communication modules, or other modules containing electronic components.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising:
   a plurality of first memory cells arranged along a first line;
   a first contact coupled to the plurality of first memory cells;
   a plurality of second memory cells arranged along a second line;
   a second contact coupled to the plurality of second memory cells;
   a plurality of switching elements, wherein two adjacent switching elements are coupled with each other, wherein a first switching element of the two adjacent switching elements is coupled to the first contact and a second switching element of the two adjacent switching elements is coupled to the second contact, wherein the two adjacent switching elements are of the same type of switching element;
   a first select line to select the plurality of first memory cells, the first select line crossing the first line and the second line, wherein the first select line is coupled to the first switching element and to the second switching element; and
   a second select line to select the plurality of second memory cells, the second select line crossing the first line and the second line;
   wherein the plurality of switching elements further comprise a third switching element that is serially coupled to the first switching element, and a fourth switching element, that is serially coupled to the second switching element, and
   wherein the second select line is coupled to the third switching element and to the fourth switching element.

2. The integrated circuit of claim 1, wherein the first memory cells and the second memory cells comprise non-volatile memory cells.

3. The integrated circuit of claim 1,
   wherein the plurality of first memory cells comprise serially source-to-drain coupled memory cells that form a first memory cell string;
   wherein the first contact is coupled to a portion of the serial coupling of the first memory cell swing;
   wherein the plurality of second memory cells comprise serially source-to-drain coupled memory cells that form a second memory cell swing; and
   wherein the second contact is coupled to a portion of the serial coupling of the second memory cell swing.

4. The integrated circuit of claim 1, wherein the type of switching element is determined by a control characteristic of the switching element.

5. The integrated circuit of claim 1, wherein the plurality of switching elements comprise transistors.

6. The integrated circuit of claim 5, wherein the plurality of switching elements comprise field effect transistors.

7. The integrated circuit of claim 1, wherein at least one switching element of the plurality of switching elements comprises a normally-on switching element.

8. The integrated circuit of claim 1, wherein at least one switching element of the plurality of switching elements comprises a normally-off switching element.

9. The integrated circuit of claim 1,
   wherein the first switching element and the third switching element are different types of switching elements; and
   wherein the second switching element and the fourth switching element are different types of switching elements.

10. The integrated circuit of claim 1, wherein the third switching element and the fourth switching element are the same type of switching element.

11. The integrated circuit of claim 1,
    wherein the first switching element and the second switching element comprise normally-on switching elements; and
    wherein the third switching element and the fourth switching element comprise normally-off switching elements.

12. The integrated circuit of claim 1, further comprising a plurality of control lines to control the first memory cells and the second memory cells.

13. The integrated circuit of claim 12, wherein the plurality of control lines cross the first line and the second line.

14. The integrated circuit of claim 13, wherein the first select line and the second select line are arranged between the plurality of control lines and the first contact and the second contact.

15. The integrated circuit of claim 14, wherein the first select line and the second select line are arranged substantially in parallel to the plurality of control lines.

16. The integrated circuit of claim 1,
    wherein the first line and the second line have a line pitch of a predefined feature size; and wherein the first contact and the second contact have a contact pitch of at least twice the predefined feature size.

17. The integrated circuit of claim 1, wherein the first memory cells and the second memory cells comprise charge storing memory cells.

18. The integrated circuit of claim 17, wherein the first memory cells and the second memory cells comprise floating gate memory cells or charge trapping memory cells.

19. The integrated circuit of claim 1, wherein the first contact and the second contact are arranged relative to one another such that they have substantially no overlap in a direction that is substantially perpendicular to the first line or the second line.

20. An integrated circuit of claim 1, further comprising:
a plurality of third memory cells arranged along a third line;
a third contact coupled to the plurality of third memory cells;
a plurality of fourth memory cells arranged along a fourth line;
a fourth contact coupled to the plurality of fourth memory cells;
a second group of a plurality of switching elements, wherein two adjacent switching elements are coupled with each other, wherein a third switching element of the two adjacent switching elements is coupled to the third contact and a fourth switching element of the two adjacent switching elements is coupled to the fourth contact, wherein the third switching element and the fourth switching element are of a second type of switching element, which is different from the first type of switching element;
a plurality of fifth memory cells arranged along a fifth line;
a fifth contact coupled to the plurality of fifth memory cells;
a plurality of sixth memory cells arranged along a sixth line;
a sixth contact coupled to the plurality of sixth memory cells; and
a third group of a plurality of switching elements, wherein two adjacent switching elements are coupled with each other, wherein a fifth switching element of the two adjacent switching elements is coupled to the fifth contact and a sixth switching element of the two adjacent switching elements is coupled to the sixth contact, wherein the fifth switching element and the sixth switching element are of the first type of switching element.

21. The integrated circuit of claim 1, wherein a type of switching element is determined by a switching characteristic of the switching element.

22. An integrated circuit having a switching field, the switching field comprising:
a first group of a plurality of switching elements, wherein two adjacent switching elements are coupled with each other, wherein a first switching element of the two adjacent switching elements is coupled to a first contact of first memory cells and a second switching element of the two adjacent switching elements is coupled to a second contact of second memory cells, wherein the first switching element and the second switching element are of a first type of switching element;
a third group of a plurality of switching elements next to the first group of a plurality of switching elements, wherein two adjacent switching elements are coupled with each other, wherein a fifth switching element of the two adjacent switching elements is coupled to a fifth contact of fifth memory cells and a sixth switching element of the two adjacent switching elements is coupled to a sixth contact of sixth memory cells, wherein the fifth switching element and the sixth switching element are of the first type of switching element; and
a second group of a plurality of switching elements arranged between the first group of a plurality of switching elements and the third group of a plurality of switching elements, wherein two adjacent switching elements are coupled with each other, wherein a third switching element of the two adjacent switching elements is coupled to a third contact of third memory cells and a fourth switching element of the two adjacent switching elements is coupled to a fourth contact of fourth memory cells, wherein the third switching element and the fourth switching element are of a second type of switching element, which is different from the first type of switching element.

23. A method for manufacturing an integrated circuit, the method comprising:
forming a plurality of first memory cells along a first line;
forming a first contact coupled to the plurality of first memory cells;
forming a plurality of second memory cells along a second line;
forming a second contact coupled to the plurality of second memory cells;
forming a plurality of switching elements, wherein two adjacent switching elements are coupled with each other, wherein a first switching element of the two adjacent switching elements is coupled to the first contact and a second switching element of the two adjacent switching elements is coupled to the second contact, wherein the two adjacent switching elements are of the same type of switching element;
forming a first select line to select the plurality of first memory cells, the first select line crossing the first line and the second line, wherein the first select line is coupled to the first switching element and to the second switching element; and
forming a second select line to select the plurality of second memory cells, the second select line crossing the first line and the second line;
wherein the plurality of switching elements further comprise a third switching element that is serially coupled to the first switching element, and a fourth switching element, that is serially coupled to the second switching element, and
wherein the second select line is coupled to the third switching element and to the fourth switching element.

24. The method of claim 23, wherein the first memory cells and the second memory cells are formed as non-volatile memory cells.

25. The method of claim 23,
wherein the plurality of first memory cells are serially source-to-drain coupled, thereby forming a first memory cell string;
wherein the first contact contacts a portion of the serial coupling of the first memory cell string;
wherein the plurality of second memory cells are serially source-to-drain coupled, thereby forming a second memory cell string; and
wherein the second contact contacts a portion of the serial coupling of the second memory cell string.

26. The method of claim 23, wherein at least one switching element of the plurality of switching elements is formed as a normally-off switching element.

27. The method of claim 23, further comprising forming a plurality of control lines to control the first memory cells and the second memory cells.

28. The method of claim 27, wherein the control lines and the switching elements are formed using the same manufacturing process.

29. The method of claim 27, wherein the control lines and the switching elements are formed simultaneously.

30. A method for manufacturing an integrated circuit, the method comprising:
  forming a first group of a plurality of switching elements, wherein two adjacent switching elements are coupled with each other, wherein a first switching element of the two adjacent switching elements is coupled to a first contact of first memory cells and a second switching element of the two adjacent switching elements is coupled to a second contact of second memory cells, wherein the first switching element and the second switching element are of a first type of switching element;
  forming a third group of a plurality of switching elements next to the first group of a plurality of switching elements, wherein two adjacent switching elements are coupled with each other, wherein a fifth switching element of the two adjacent switching elements is coupled to a fifth contact of fifth memory cells and a sixth switching element of the two adjacent switching elements is coupled to a sixth contact of sixth memory cells, wherein the fifth switching element and the sixth switching element are of the first type of switching element; and
  forming a second group of a plurality of switching elements arranged between the first group of a plurality of switching elements and the third group of a plurality of switching elements, wherein two adjacent switching elements are coupled with each other, wherein a third switching element of the two adjacent switching elements is coupled to a third contact of third memory cells and a fourth switching element of the two adjacent switching elements is coupled to a fourth contact of fourth memory cells, wherein the third switching element and the fourth switching element are of a second type of switching element, which is different from the first type of switching element.

31. A memory module, comprising:
  a plurality of integrated circuits arranged as a module, wherein at least one integrated circuit of the plurality of integrated circuits comprises:
    a plurality of first memory cells arranged along a first line;
    a first contact coupled to a portion of the first line;
    a plurality of second memory cells arranged along a second line;
    a second contact coupled to a portion of the second line;
    a plurality of switching elements, wherein two adjacent switching elements are coupled with each other, wherein a first switching element of the two adjacent switching elements is coupled to the first contact and a second switching element of the two adjacent switching elements is coupled to the second contact, wherein the two adjacent switching elements are of the same type of switching element;
    a first select line to select the plurality of first memory cells, the first select line crossing the first line and the second line, wherein the first select line is coupled to the first switching element and to the second switching element; and
    a second select line to select the plurality of second memory cells, the second select line crossing the first line and the second line;
    wherein the plurality of switching elements further comprise a third switching element that is serially coupled to the first switching element, and a fourth switching element, that is serially coupled to the second switching element, and
    wherein the second select line is coupled to the third switching element and to the fourth switching element.

32. The memory module of claim 31, wherein the memory module is a stackable memory module in which at least some of the integrated circuits are stacked one above the other.

33. A computing system, comprising:
  a processing apparatus;
  an input apparatus coupled to the processing apparatus;
  an output apparatus coupled to the processing apparatus; and
  a memory cell arrangement coupled to the processing apparatus, the memory cell arrangement comprising:
    a plurality of first memory cells arranged along a first line;
    a first contact coupled to the plurality of first memory cells;
    a plurality of second memory cells arranged along a second line;
    a second contact coupled to the plurality of second memory cells;
    a plurality of switching elements, wherein two adjacent switching elements are coupled with each other, wherein a first switching element of the two adjacent switching elements is coupled to the first contact and a second switching element of the two adjacent switching elements is coupled to the second contact, wherein the two adjacent switching elements are of the same type of switching elements;
    a first select line to select the plurality of first memory cells, the first select line crossing the first line and the second line, wherein the first select line is coupled to the first switching element and to the second switching element; and
    a second select line to select the plurality of second memory cells, the second select line crossing the first line and the second line;
    wherein the plurality of switching elements further comprise a third switching element that is serially coupled to the first switching element, and a fourth switching element, that is serially coupled to the second switching element, and
    wherein the second select line is coupled to the third switching element and to the fourth switching element.

34. An integrated circuit, comprising:
  a plurality of first memory cells arranged along a first line;
  a first contact coupled to the plurality of first memory cells;
  a plurality of second memory cells arranged along a second line;
  a second contact coupled to the plurality of second memory cells;
  a plurality of switching elements, wherein two adjacent switching elements are coupled with each other, wherein a first switching element of the two adjacent switching elements is coupled to the first contact and a second switching element of the two adjacent switching elements is coupled to the second contact and wherein the first contact and the second contact are arranged relative to one another such that they have substantially no overlap in a direction that is substantially perpendicular to the first line or the second line, wherein at least one switching element of the plurality of switching elements comprises a normally-off switching element.

35. The integrated circuit of claim 34, wherein the first memory cells and the second memory cells comprise non-volatile memory cells.

36. The integrated circuit of claim 34,
wherein the plurality of first memory cells comprise serially source-to-drain coupled memory cells that form a first memory cell string;
wherein the first contact is coupled to a portion of the serial coupling of the first memory cell string;
wherein the plurality of second memory cells comprise serially source-to-drain coupled memory cells that form a second memory cell string; and
wherein the second contact is coupled to a portion of the serial coupling of the second memory cell string.

37. The integrated circuit of claim 34, wherein a type of switching element is determined by a switching characteristic of the switching element.

38. The integrated circuit of claim 37, wherein a type of switching element is determined by a control characteristic of the switching element.

39. The integrated circuit of claim 34, wherein the plurality of switching elements comprise transistors.

40. The integrated circuit of claim 34, wherein at least one switching element of the plurality of switching elements comprises a normally-on switching element.

41. The integrated circuit of claim 34, further comprising:
a first select line to select the plurality of first memory cells, the first select line crossing the first line and the second line, wherein the first select line is coupled to the first switching element and to the second switching element; and
a second select line to select the plurality of second memory cells, the second select line crossing the first line and the second line;
wherein the plurality of switching elements further comprise a third switching element that is serially coupled to the first switching element, and a fourth switching element, that is serially coupled to the second switching element, and
wherein the second select line is coupled to the third switching element and to the fourth switching element.

42. The integrated circuit of claim 34, further comprising a plurality of control lines to control the first memory cells and the second memory cells.

43. The integrated circuit of claim 42, wherein the plurality of control lines cross the first line and the second line.

44. The integrated circuit of claim 43, wherein the first select line and the second select line are arranged between the plurality of control lines and the first contact and the second contact.

45. The integrated circuit of claim 34, wherein the first memory cells and the second memory cells comprise charge storing memory cells.

46. An integrated circuit comprising:
a plurality of first memory cells arranged along a first line;
a first contact coupled to the plurality of first memory cells;
a plurality of second memory cells arranged along a second line;
a second contact coupled to the plurality of second memory cells; and
a plurality of switching elements, wherein two adjacent switching elements are coupled with each other, wherein a first switching element of the two adjacent switching elements is coupled to the first contact and a second switching element of the two adjacent switching elements is coupled to the second contact, wherein the two adjacent switching elements are of the same type of switching element and wherein at least one switching element of the plurality of switching elements comprises a normally-on switching element, wherein at least one switching element of the plurality of switching elements comprises a normally-off switching element.

47. The integrated circuit of claim 46, wherein the first memory cells and the second memory cells comprise non-volatile memory cells.

48. The integrated circuit of claim 46,
wherein the plurality of first memory cells comprise serially source-to-drain coupled memory cells that form a first memory cell string;
wherein the first contact is coupled to a portion of the serial coupling of the first memory cell string;
wherein the plurality of second memory cells comprise serially source-to-drain coupled memory cells that form a second memory cell string; and
wherein the second contact is coupled to a portion of the serial coupling of the second memory cell string.

49. The integrated circuit of claim 46, wherein a type of switching element is determined by a switching characteristic of the switching element.

50. The integrated circuit of claim 49, wherein a type of switching element is determined by a control characteristic of the switching element.

51. The integrated circuit of claim 46, wherein the plurality of switching elements comprise transistors.

52. The integrated circuit of claim 46, wherein at least one switching element of the plurality of switching elements comprises a normally-on switching element.

53. A method for manufacturing an integrated circuit, the method comprising:
forming a plurality of first memory cells along a first line;
forming a first contact coupled to the plurality of first memory cells;
forming a plurality of second memory cells along a second line;
forming a second contact coupled to the plurality of second memory cells; and
forming a plurality, of switching elements, wherein two adjacent switching elements are coupled with each other, wherein a first switching element of the two adjacent switching elements is coupled to the first contact and a second switching element of the two adjacent switching elements is coupled to the second contact, wherein the two adjacent switching elements are of the same type of switching elements, and wherein the first contact and the second contact are arranged relative to one another such that they have substantially no overlap in a direction that is substantially perpendicular to the first line or the second line, wherein at least one switching element of the plurality of switching elements is formed as a normally-off switching element.

54. The method of claim 53, wherein the first memory cells and the second memory cells are formed as non-volatile memory cells.

55. The method of claim 53,
wherein the plurality of first memory cells are serially source-to-drain coupled, thereby forming a first memory cell string;
wherein the first contact contacts a portion of the serial coupling of the first memory cell string;

wherein the plurality of second memory cells are serially source-to-drain coupled, thereby forming a second memory cell string; and wherein the second contact contacts a portion of the serial coupling of the second memory cell string.

56. The method of claim 53, further comprising forming a plurality of control lines to control the first memory cells and the second memory cells.

57. The method of claim 56, wherein the control lines and the switching elements are formed using the same manufacturing process.

58. The method of claim 53, wherein the control lines and the switching elements are formed simultaneously.

59. A memory module, comprising:
a plurality of integrated circuits arranged as a module, wherein at least one integrated circuit of the plurality of integrated circuits comprises:
a plurality of first memory cells arranged along a first line;
a first contact coupled to a portion of the first line;
a plurality of second memory cells arranged along a second line;
a second contact coupled to a portion of the second line; and
a plurality of switching elements, wherein two adjacent switching elements are coupled with each other, wherein a first switching element of the two adjacent switching elements is coupled to the first contact and a second switching element of the two adjacent switching elements is coupled to the second contact, wherein the two adjacent switching elements are of the same type of switching element and wherein at least one switching element of the plurality of switching elements comprises a normally-on switching element, wherein at least one switching element of the plurality of switching elements comprises a normally-off switching element.

60. The memory module of claim 59, wherein a type of switching element is determined by a control characteristic of the switching element.

61. The memory module of claim 59, wherein the first memory cells and the second memory cells comprise non-volatile memory cells.

62. The memory module of claim 59,
wherein the plurality of first memory cells comprise serially source-to-drain coupled memory cells that form a first memory cell string;
wherein the first contact is coupled to a portion of the serial coupling of the first memory cell string;
wherein the plurality of second memory cells comprise serially source-to-drain coupled memory cells that form a second memory cell string; and
wherein the second contact is coupled to a portion of the serial coupling of the second memory cell string.

63. The memory module of claim 59, wherein the plurality of switching elements comprise transistors.

64. The memory module of claim 59, wherein at least one switching element of the plurality of switching elements comprises a normally-on switching element.

65. The memory module of claim 59, wherein the first contact and the second contact are arranged relative to one another such that they have substantially no overlap, in a direction that is substantially perpendicular to the first line or the second line.

66. A memory module, comprising:
a plurality of integrated circuits arranged as a module, wherein at least one integrated circuit of the plurality of integrated circuits comprises:
a plurality of first memory cells arranged along a first line;
a first contact coupled to a portion of the first line;
a plurality of second memory cells arranged along a second line;
a second contact coupled to a portion of the second line; and
a plurality of switching elements, wherein two adjacent switching elements are coupled with each other, wherein a first switching element of the two adjacent switching elements is coupled to the first contact and a second switching element of the two adjacent switching elements is coupled to the second contact, wherein the two adjacent switching elements are of the same type of switching element and wherein the first contact and the second contact are arranged relative to one another such that they have substantially no overlap in a direction that is substantially perpendicular to the first line or the second line, wherein at least one switching element of the plurality of switching elements comprises a normally-off switching element.

67. The memory module of claim 66, wherein a type of switching element is determined by a control characteristic of the switching element.

68. The memory module of claim 66, wherein the first memory cells and the second memory cells comprise non-volatile memory cells.

69. The memory module of claim 66,
wherein the plurality of first memory cells comprise serially source-to-drain coupled memory cells that form a first memory cell string;
wherein the first contact is coupled to a portion of the serial coupling of the first memory cell string;
wherein the plurality of second memory cells comprise serially source-to-drain coupled memory cells that form a second memory cell string; and
wherein the second contact is coupled to a portion of the serial coupling of the second memory cell string.

70. The memory module of claim 66, wherein the plurality of switching elements comprise transistors.

71. The memory module of claim 66, wherein at least one switching element of the plurality of switching elements comprises a normally-on switching element.

* * * * *